(12) United States Patent
Roman-Leshkov et al.

(10) Patent No.: US 10,022,709 B2
(45) Date of Patent: Jul. 17, 2018

(54) PROCESS FOR THE PRODUCTION OF NON-SINTERED TRANSITION METAL CARBIDE AND NITRIDE NANOPARTICLES

(71) Applicant: MASSACHUSETTS INSTITUTE OF TECHNOLOGY, Cambridge, MA (US)

(72) Inventors: Yuriy Roman-Leshkov, Cambridge, MA (US); Sean Hunt, Cambridge, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 0 days.

(21) Appl. No.: 14/453,454

(22) Filed: Aug. 6, 2014

(65) Prior Publication Data

US 2015/0105241 A1 Apr. 16, 2015

Related U.S. Application Data

(60) Provisional application No. 61/862,514, filed on Aug. 6, 2013.

(51) Int. Cl.

| | |
|---|---|
| B01J 27/22 | (2006.01) |
| B01J 27/24 | (2006.01) |
| H01M 4/36 | (2006.01) |
| H01M 4/583 | (2010.01) |
| H01M 4/86 | (2006.01) |
| H01M 4/90 | (2006.01) |
| B01J 37/16 | (2006.01) |
| B01J 37/20 | (2006.01) |
| B01J 37/28 | (2006.01) |
| B01J 27/04 | (2006.01) |

(Continued)

(52) U.S. Cl.
CPC ............ *B01J 27/24* (2013.01); *H01M 4/362* (2013.01); *H01M 4/583* (2013.01); *H01M 4/8647* (2013.01); *H01M 4/9016* (2013.01); *B01J 27/04* (2013.01); *B01J 27/14* (2013.01); *B01J 27/22* (2013.01); *B01J 35/0013* (2013.01); *B01J 37/16* (2013.01); *B01J 37/20* (2013.01); *B01J 37/28* (2013.01); *H05K 1/097* (2013.01)

(58) Field of Classification Search
CPC ................................. C01B 31/34; B01J 27/22
See application file for complete search history.

(56) References Cited

U.S. PATENT DOCUMENTS

| | | | | |
|---|---|---|---|---|
| 4,922,024 A | * | 5/1990 | Bowman et al. | 564/480 |
| 2011/0305605 A1 | * | 12/2011 | Jaeger | B01J 19/02 422/241 |

OTHER PUBLICATIONS

Hu et al. ("Direct Synthesis and Structural Characteristics of Ordered SBA-15 Mesoporous Silica Containing Tungsten Oxides and Tungsten Carbides," Journal of Physical Chemistry C 111(42), pp. 15173-15184, Oct. 2007).*
Wu et al. ("Silica-Templated Synthesis of Ordered Mesoporous Tungsten Carbide/Graphitic Carbon Composites with Nanocrystalline Walls and High Surface Areas via a Temperature-Programmed Carburization Route," Small 5(23), pp. 2738-2749, Dec. 2009).*
Sobczynski et al. ("Tungsten Disulfide: A Novel Hydrogen Evolution Catalyst for Water Decomposition," Journal of Physical Chemistry 92(8), pp. 2311-2315, Apr. 1988).*

(Continued)

*Primary Examiner* — Jun Li
(74) *Attorney, Agent, or Firm* — Steptoe & Johnson LLP

(57) ABSTRACT

Transition metal carbide, nitride, phosphide, sulfide, or boride nanoparticles can be made by transforming metal oxide materials coated in a ceramic material in a controlled environment. The coating prevents sintering while allowing the diffusion of reactive gases through the inorganic matrix that can then alter the metal nanoparticle oxidation state, remove oxygen, or intercalate into the lattice to form a carbide, nitride, phosphide, sulfide, or boride.

14 Claims, 50 Drawing Sheets

(51) Int. Cl.
    *B01J 27/14* (2006.01)
    *B01J 35/00* (2006.01)
    *H05K 1/09* (2006.01)

(56) References Cited

OTHER PUBLICATIONS

Zhao et al., "Triblock Copolymer Syntheses of Mesoporous Silica with Periodic 50 to 300 Angstrom Pores," Science 279(5350), pp. 548-552, Jan. 1998.*

Wang et al., "Facile synthesis of ultrasmall monodisperse 'raisin-bun'-type MoO3/SiO2 nanocomposites with enhanced catalytic properties," Nanoscale 5(11), pp. 4823-4828, Mar. 2013.*

Clark et al., "Characterization of Silica-Supported Molybdenum and Tungsten Phosphide Hydroprocessing Catalysts by 31 P Nuclear Magnetic Resonance Spectroscopy," Journal of Catalysis 207(2), pp. 256-265, Apr. 2002.*

Brungs et al., "Dry reforming of methane to synthesis gas over supported molybdenum carbide catalysts," Catalysis Letters 70(3), pp. 117-122, Dec. 2000.*

Hanif et al., "Study on the Structure and Formation Mechanism of Molybdenum Carbides," Chemistry of Materials 14(3), pp. 1009-1015, Jan. 2002.*

Liu et al., "Preparation and evaluation of ammonia decomposition catalysts by high-throughput technique," Reaction Kinetics and Catalysis Letters 93(1), pp. 11-17, Jan. 2008.*

Li et al., "Catalytic Activity of Nano-silica Supported Transition-metal Borides on the Thermal Decomposition of Ammonium Perchlorate," Chinese Journal of Explosives & Propellants 2012-6, pp. 41-45, Jun. 2012.*

\* cited by examiner

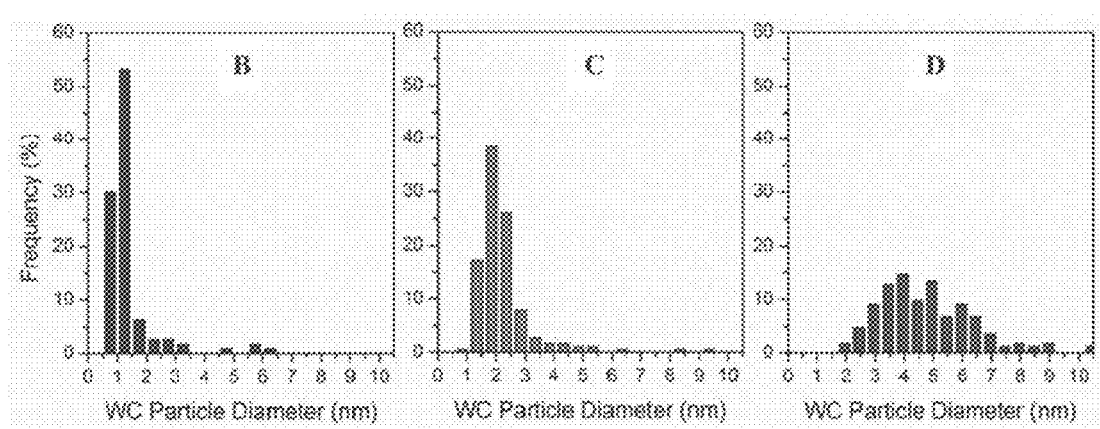
FIG. 4B, C, D

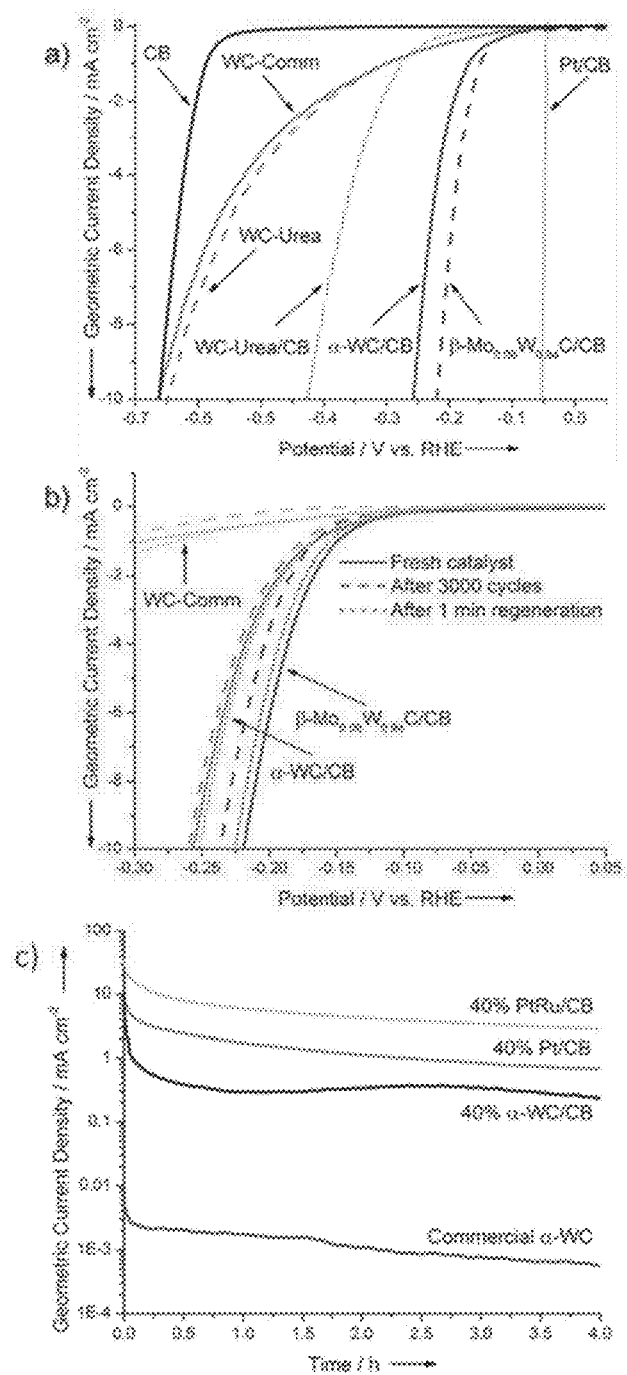
FIG. 5 A, B, C

FIG. 23, A, B

PROCESS FOR THE PRODUCTION OF NON-SINTERED TRANSITION METAL CARBIDE AND NITRIDE NANOPARTICLES

CLAIM OF PRIORITY

This application claims the benefit of prior U.S. Provisional Application No. 61/862,514 filed on Aug. 6, 2013, which is incorporated by reference in its entirety.

STATEMENT OF GOVERNMENT SUPPORT

This invention was made with government support under Grant No. DGE1122374 awarded by the National Science Foundation. The government has certain rights in the invention.

TECHNICAL FIELD

The present invention relates to a method of synthesizing nanoparticles.

BACKGROUND

Isoelectronic compounds can be an excellent substitute for a more expensive and a rare metal. Transition metal carbides (transition metal carbides) exhibit similar catalytic activities to the platinum group metals but are orders of magnitude more abundant and less expensive. However, the high temperatures (greater than ~1000 K) needed to synthesize transition metal carbides inhibit the production of highly active nanoparticles (nanoparticles) due to sintering, support degradation, and excess surface carbon.

SUMMARY

In general, nanoparticles can include a transition metal carbide, transition metal nitride, transition metal phosphide, transition metal borides or transition metal sulfides. The transition metal carbide can be a pure carbide or a mixed carbide, for example, a transition metal oxy carbide. Likewise, the transition metal nitride can be a pure nitride or a mixed nitride, for example, a transition metal oxy nitride. The transition metal phosphide can be a pure phosphide or a mixed phosphide, for example, a transition metal oxy phosphide. The transition metal boride can be a pure boride or a mixed boride, for example, a transition metal oxy boride. The transition metal sulfide can be a pure sulfide or a mixed sulfide, for example, a transition metal oxy sulfide. Oxy carbides, oxy nitrides, oxy phosphides, oxy borides and oxy sulfides can be synthesized with any bulk stoichiometry. The nanoparticle can include a transition metal element from the group consisting of group 3, group 4, group 5, group 6, 3d block, and f block.

The nanoparticles can have a diameter of less than 10 nanometers, less than 5 nanometers or less than 3 nanometers.

The nanoparticles can be in a single phase. For example, tungsten carbide nanoparticles can be in a β (face-centered-cubic) phase, an α (hexagonal) phase or a semicarbide phase.

Transition metal oxide nanoparticles can be transformed into transition metal nanoparticles, transition metal carbide nanoparticles, transition metal nitride nanoparticles, transition metal phosphide nanoparticles, transition metal boride nanoparticles or transition metal sulfide nanoparticles by carrying out the transformation in an immobilizing matrix, such as an inert inorganic matrix, for example, silicon oxide, aluminum oxide, germanium oxide, zirconium oxide, cerium oxide, hafnium oxide, gallium oxide or titanium oxide.

A three-step method that allows for the production of non-sintered, surface impurity-free, ultrasmall transition metal carbide, nitride, sulfide, boride or phosphide nanoparticles is disclosed. This method allows the transition metal nanoparticles to be highly loaded onto a desired support. The support can be carbon black, graphene, carbon nanotubes, high-surface area carbide, a metal oxide including silica, alumina, titania, zirconia, ceria, or zeolites.

For example, transition metal oxide nanoparticles or transition metal particles can be encapsulated at room temperature within an inorganic matrix. The percentage of the transition metal can be greater than 1%, great than 5%, greater than 10%, greater than 20%, greater than 30% or greater than 40% in the inorganic matrix. The encapsulated nanoparticles can be calcined in an oxidizing atmosphere or vacuum, and then heated in the presence of a reducing agent. The encapsulated transition metal oxide nanoparticles can then be converted to transition metal carbide, nitride, sulfide, boride or phosphide nanoparticles, for example, by carburization, nitridization, phosphorization, boridization or sulfidization in an appropriate atmosphere. For example, converting the nanoparticles to carbide nanoparticles includes carburizing the nanoparticles in a methane atmosphere. The carburization can include heating the nanoparticles to less than 850° C. or to over 1000° C. Depending on the ultimate use of the transition metal carbide, nitride, boride, sulfide, or phosphide nanoparticles, the inorganic matrix can be removed, for example, by room-temperature dissolution, to yield either a nanodispersion of nanoparticles or supported nanoparticles.

Using this versatile "removable ceramic coating method," tungsten carbide (WC) as well as heterometallic molybdenum tungsten carbide ($Mo_xW_{1-x}C$) nanoparticles, for example, can be synthesized. Phase-purity control is possible by tuning the synthesis parameters to synthesize semicarbide, hexagonal carbide, as well as cubic carbide nanoparticles. For example, tungsten carbide nanoparticles can be in a β phase, an α phase or a semicarbide phase.

A method of producing a plurality of transition metal nanoparticles can include dissolving metal oxide nanoparticles or metal nanoparticles in an alcohol, mixing an acid with the nanoparticles and the alcohol, adding water to the nanoparticles, the alcohol, and the acid, collecting the nanoparticles, heating the nanoparticles in the presence of a reducing agent, and converting the metal oxide nanoparticles to nanoparticles including C, N, S, B, or P. The alcohol can be isopropanol, methanol, or ethanol. The acid can be citric acid.

In one aspect, converting the nanoparticles can include carburizing the nanoparticles in a methane atmosphere. The nanoparticle can include a tungsten carbide nanoparticle, a molybdenum carbide nanoparticle, or heterometallic carbide nanoparticle. The heterometallic carbide nanoparticle can include a molybdenum tungsten carbide. In another aspect, converting the nanoparticles includes nitridizing the nanoparticles. In another aspect, converting the nanoparticles includes phosphidizing the nanoparticles. In another aspect, converting the nanoparticles includes sulfidizing the nanoparticles. In another aspect, converting the nanoparticles includes boridizing the nanoparticles.

Other aspects, embodiments, and features will be apparent from the following description, the drawings, and the claims.

BRIEF DESCRIPTION OF THE DRAWINGS

FIGS. 4A-4G are graphs depicting characterization data and micrographs of the metal carbide nanoparticles supported on carbon black. FIG. 4A is a XRD spectrum of carburized silica-encapsulated $W_2C$, $\beta$-$Mo_{0.02}W_{0.98}C$, $\beta$-WC, and $\alpha$-WC and their respective XRD spectra of supported on carbon black post-ammonium bifluoride-dissolution. FIG. 4B-4D show PSDs of the WC nanoparticles depending on synthesis conditions employed. FIG. 4E is a series of HR-TEM images depicting WC NPs supported on carbon black showing that they are non-sintered and metal-terminated. FIG. 4F is a STEM image of $\beta$-$Mo_{0.54}W_{0.46}C$/CB and a corresponding EDX spectra showing the presence of Mo and W within single NPs. FIG. 4G is an XPS spectra of $SiO_2/\beta$-WC and the $\beta$-WC nanopowder obtained post-ABF-dissolution showing mostly metallic W, complete removal of Si, as well as a carbidic C 1s shift.

FIGS. 5A-5C depict electrochemical activity, stability, and regeneration data for the supported non-sintered and metal-terminated carbide nanoparticles for both HER and MOR. FIG. 5A depicts initial HER LSVs at 2 mV/s in $H_2$-saturated 0.5M $H_2SO_4$ at room temperature. FIG. 5B depicts LSVs at 2 mV/s in $H_2$-saturated 0.5M $H_2SO_4$ at RT showing initial HER activity, the final activity after 3000 cycles between −0.3 and +0.6 V vs. RHE at a scan rate of 50 mV/s, and the regenerated activity after dipping the spent electrodes in 0.1 M NaOH for one minute. All CB-supported catalysts are loaded at 40 wt %. FIG. 5C depicts chronoamperometric responses in Ar-saturated 0.5 M $H_2SO_4$ and 2.0 M $CH_3OH$ at 40° C. held potentiostatically at +0.75 V vs. RHE over 4 h.

FIG. 6A is a water/brij/heptane RME containing $WO_x$ NPs encapsulated in silica nanospheres. FIG. 6B is a water/brij/heptane RME containing $Mo_{0.06}W_{0.94}O_y$ NPs encapsulated in silica nanospheres. FIG. 6C is a water/brij/heptane RME containing $Mo_{0.54}W_{0.46}O_y$ NPs encapsulated in silica nanospheres. FIG. 6D is side-view of the RME from (A) after 300 mL of methanol has been added; note the distinct phase-separation. FIG. 6E is top-down view of the RME from (A) after 300 mL of methanol has been added; note the $SiO_2/WO_x$ precipitant settling on the bottom of the flask.

FIG. 13A is a STEM image of ultrasmall 0.8-1.5 nm $\beta$-WC NPs encapsulated in a silica nanosphere. FIG. 13B is a STEM image of ultrasmall 2-3 nm $\beta$-WC NPs encapsulated in two silica nanospheres. FIG. 13C is a TEM image of 3-6 nm $\alpha$-WC NPs encapsulated in a quartz matrix. FIG. 13D is a graph depicting corresponding particle size distributions for each of the three syntheses with at least 150 particles analyzed per distribution.

FIG. 16A is a TEM image of calcined $SiO_2/H_2(Mo_{0.2}W_{0.8})O_4$ prepared using $Na_2WO_4/Na_2MoO_4$/HCl/water/Triton/hexanol/heptane. FIG. 16B is a TEM image of the same material after carburization for four hours at 835° C. in a 21% $CH_4/H_2$ atmosphere to form phase-pure hexagonal heterometallic $Mo_{0.2}W_{0.8}C$. FIG. 16C is a STEM image of the same image shown in FIG. 16B. FIG. 16D is a graph depicting the analysis of 1 nm×1 nm region of carbide showing the presence of both W and Mo. FIG. 16E is a graph depicting the analysis of a 1 nm×1 nm region of the silica shell showing only Si and O detectable with neither W or Mo detected.

FIG. 25B is a zoomed-in version of FIG. 25A.

FIG. 40A depicts the N1s reference spectra of urea. FIG. 40B depicts the N 1s reference spectra for bulk titanium nitride (TiN). FIG. 40C depicts the N 1s spectra for the various bimetallic nitride nanopowders synthesized from dissolving the silica shells in ABF solution and not adding any support to make a nanodispersion. The nitride nanodispersions were subsequently centrifuged and dried before analysis with XPS.

DETAILED DESCRIPTION

Figure 1:
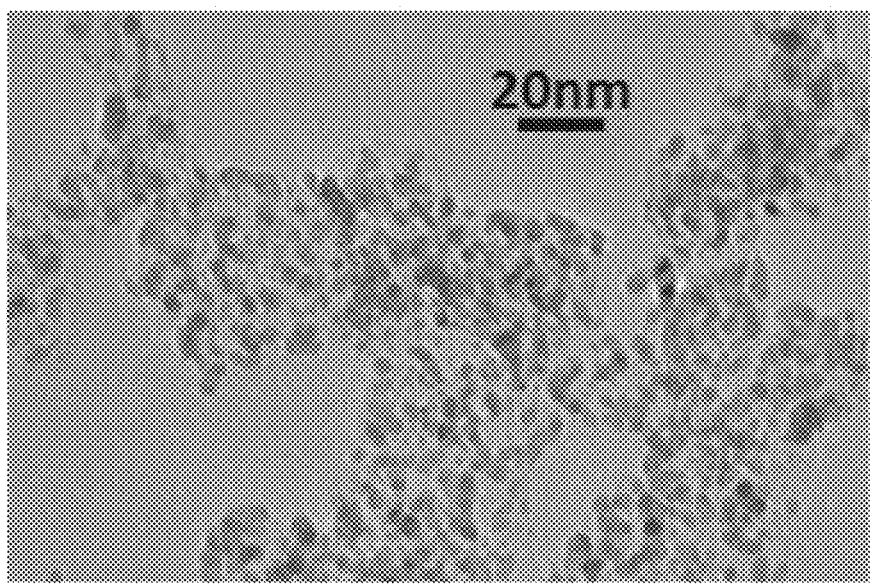
FIG. 1 is a TEM photograph of 20 wt % platinum on a carbon black substrate.

A method has been developed that allows for the production of non-sintered, surface impurity-free, ultrasmall transition metal carbide nanoparticle that can be highly loaded onto a desired support. Metal oxide nanoparticles were encapsulated at room temperature within inorganic spheres, reduced in a reducing atmosphere, and the inorganic spheres were removed via a room-temperature dissolution to yield either a carbide nanodispersion or supported nanoparticles. Using this versatile "removable ceramic coating method," tungsten carbide (WC) as well as heterometallic molybdenum tungsten carbide ($Mo_xW_{1-x}$C) nanoparticles were synthesized. By tuning the synthesis parameters, phase-purity control was demonstrated by synthesizing semicarbide, hexagonal carbide, as well as cubic carbide nanoparticles. As a result, 40 wt % WC/CB and 40 wt % $Mo_{0.06}W_{0.94}$C/CB are inexpensive and highly active "platinum-like" electrocatalysts for the hydrogen evolution reaction (HER) and methanol electrooxidation (MOR).

The platinum-group metals (PGMs) exhibit exceptional catalytic activity for a broad range of thermal and electrochemical reactions. However, PGMs are not sustainable catalysts on a global scale due to scarcity and cost. See Gordon, R. B., Bertram, M. & Graedel, T. E. Metal stocks and sustainability. Proceedings of the National Academy of Sciences of the United States of America 103, 1209-14 (2006), which is incorporated by reference in its entirety. Highly active materials are important for renewable technologies, such as electrocatalysis, fuel cells, electrolyzers, anode and cathode materials, thermal reforming, and biomass upgrading. However, PGMs are among the least abundant elements in the lithosphere. Platinum costs about $60,000 per kilogram, and its demand exceeds supply. A global hydrogen economy would deplete platinum reserves in about 15 years. Therefore, chemically modifying inexpensive and abundant metals to mimic PGMs has been extensively investigated.

Transition metal carbide materials can be made of group 4 transition metals including Ti, Zr and Hf, group 5 transition metals including V, Nb and Ta, and group 6 transition metals including Cr, Mo and W. Among the group 4 to 6 transition metal carbides (transition metal carbides), notably tungsten carbide (WC) and molybdenum carbide ($Mo_2$C) are composed of earth-abundant materials and have been known to exhibit "PGM-like" catalytic properties as well as high thermal and electrochemical stability for several decades. For example, see Böhm, H. New non-noble metal anode catalysts for acid fuel cells. Nature 227, 483-4 (1970), Levy, R. B. & Boudart, M. Platinum-like behavior of tungsten carbide in surface catalysis. Science 181, 547-9 (1973), Oyama, S. T. The Chemistry of Transition Metal Carbides and Nitrides. (Blackie: Glasgow, 1996), and Ganesan, R. & Lee, J. S. Tungsten carbide microspheres as a noble-metal-economic electrocatalyst for methanol oxidation. Angewandte Chemie (International ed. in English) 44, 6557-60 (2005), each of which is incorporated by reference in its entirety. In addition to being orders of magnitude less expensive than platinum (see Esposito, D. V et al. Low-cost hydrogen-evolution catalysts based on monolayer platinum on tungsten monocarbide substrates. Angewandte Chemie (International ed. in English) 49, 9859-62 (2010), which is incorporated by reference in its entirety.), transition metal carbides are more resistant to catalyst poisons such as carbon monoxide and sulfur, making these materials suitable candidates for high temperature reactions such as biomass reforming. See Stottlemyer, A. L., Kelly, T. G., Meng, Q. & Chen, J. G. Reactions of oxygen-containing molecules on transition metal carbides: Surface science insight into potential applications in catalysis and electrocatalysis. 67, 201-232 (2012), which is incorporated by reference in its entirety. Because of their chemical inertness and interesting electronic properties, transition metal carbides have garnered attention in diverse fields outside catalysis, such as supercapacitors (for example, see Simon, P. & Gogotsi, Y. Materials for electrochemical capacitors. Nature materials 7, 845-54 (2008), which is incorporated by reference in its entirety), medical implants (for example, see Balaceanu, M. et al. Characterization of Zr-based hard coatings for medical implant applications. Surface and Coatings Technology 204, 2046-2050 (2010) and Hubler, R. Hardness and corrosion protection enhancement behaviour of surgical implant surfaces treated with ceramic thin films. Surface and Coatings Technology 116-119, 1111-1115 (1999), each of which is incorporated by reference in its entirety), optoelectronics (for example, see Zerr, A., Miehe, G. & Riedel, R. Synthesis of cubic zirconium and hafnium nitride having $Th_3P_4$ structure. Nature materials 2, 185-9 (2003) and Rugge, A., Becker, J. S., Gordon, R. G. & Tolbert, S. H. Tungsten Nitride Inverse Opals by Atomic Layer Deposition. Nano Letters 3, 1293-1297 (2003), each of which is incorporated by reference in its entirety) and coatings (see, for example, Zhu, Y., Yukimura, K., Ding, C. & Zhang, P. Tribological properties of nanostructured and conventional tungsten carbide—Co coatings deposited by plasma spraying. Thin Solid Films 388, 277-282 (2001), which is incorporated by reference in its entirety).

Figure 2:
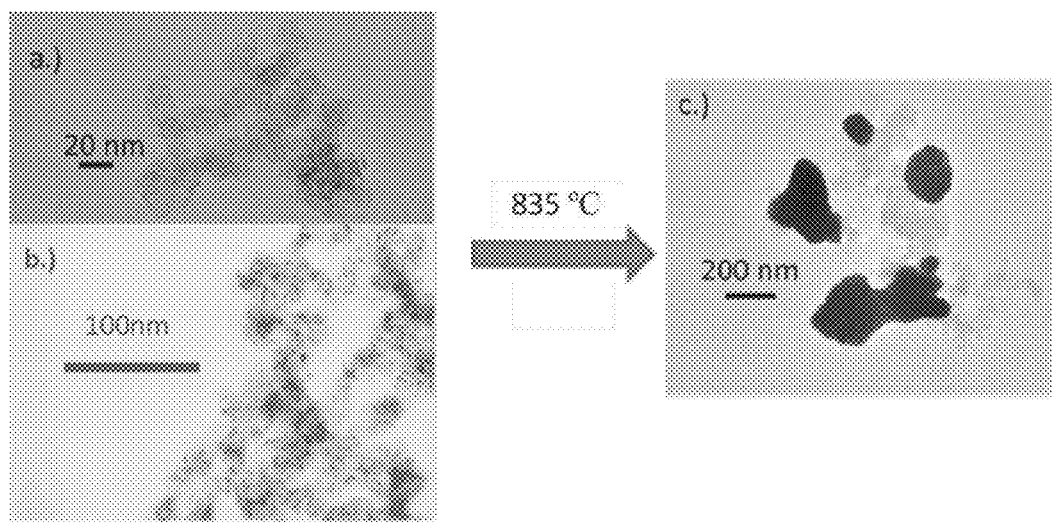
FIG. 2 are TEM and STEM images of direct carburization of tungsten oxide on carbon black at 835° C. for four hours.

Commercial fuel cell catalysts consist of ultrasmall (2-5 nm) platinum (Pt) nanoparticles loaded onto a conducting carbon black (CB) support at high wt % loadings (FIG. 1). While transition metal carbides like tungsten carbide exhibit "Pt-like" activity, there are no scalable methods to synthesize comparable ultrasmall tungsten carbide nanoparticles on carbon black at a high wt % loadings due to the high temperatures involved (typically >1000K). See Stottlemyer, A. L., Kelly, T. G., Meng, Q. & Chen, J. G. Reactions of oxygen-containing molecules on transition metal carbides: Surface science insight into potential applications in catalysis and electrocatalysis. 67, 201-232 (2012), which is incorporated by reference in its entirety. Directly carburizing tungsten oxide ($WO_x$) nanoparticles loaded at 10 wt % onto carbon black results in low surface area 0.2-0.3 µm microparticles (FIG. 2). FIG. 2 shows a TEM image of 10 wt % $WO_x$/CB as synthesized, b) corresponding STEM image of 10 wt % $WO_x$/CB as synthesized, c) TEM image of 10 wt % WC/CB after carburizing under a $CH_4/H_2$ atmosphere for four hours at 835° C. Extensive sintering has occurred along with degradation of the carbon black support.

Current methods to produce transition metal carbide nanoparticles involve mixing a molecular transition metal precursor with a carbon source and then heating in a furnace or using microwaves. See, for example, Giordano, C., Erpen, C., Yao, W. & Antonietti, M. Synthesis of Mo and W carbide and nitride nanoparticles via a simple "urea glass" route. Nano letters 8, 4659-63 (2008), Giordano, C., Erpen, C., Yao, W., Milke, B. & Antonietti, M. Metal Nitride and Metal Carbide Nanoparticles by a Soft Urea Pathway. Chemistry of Materials 21, 5136-5144 (2009), Giordano, C., Yang, W., Lindemann, A., Crombez, R. & Texter, J. Waterborne WC nanodispersions. Colloids and Surfaces A: Physicochemical and Engineering Aspects 374, 84-87 (2011), Patel, M. & Subrahmanyam, J. Synthesis of nanocrystalline molybdenum carbide (Mo2C) by solution route. Materials Research Bulletin 43, 2036-2041 (2008), Shen, P. K., Yin, S., Li, Z. & Chen, C. Preparation and performance of nanosized tungsten carbides for electrocatalysis. Electrochimica Acta 55, 7969-7974 (2010), Vallance, S. R. et al. Probing the microwave interaction mechanisms and reaction pathways in the energy-efficient, ultra-rapid synthesis of tungsten carbide. Green Chemistry 14, 2184 (2012), and Garcia-Esparza, A. T. et al. Tungsten carbide nanoparticles as efficient cocatalysts for photocatalytic overall water splitting. ChemSusChem 6, 168-81 (2013), each is which is incorporated by reference in its entirety. None of these methods mitigate sintering, and the carburization process often results in surfaces that are covered in impurities such as polymeric carbon and/or bulk oxides, which can greatly reduce or eliminate catalytic activity. See Preiss, H., B. Meyer, C. O. Preparation of molybdenum and tungsten carbides from solution derived precursors. Journal of Materials Science 33, 713-722 (1998), Kimmel, Y. C., Esposito, D. V., Birkmire, R. W. & Chen, J. G. Effect of surface carbon on the hydrogen evolution reactivity of tungsten carbide (WC) and Pt-modified WC electrocatalysts. International Journal of Hydrogen Energy 37, 3019-3024 (2012), and Yan, Y. et al. Template-Free Pseudomorphic Synthesis of Tungsten Carbide Nanorods. Small (2012), vol. 8, 21, 3350-3356, each of which is incorporated by reference in its entirety. The production of active, non-sintered transition metal carbide nanoparticles that are free from surface impurities is the underlying technical barrier preventing the widespread replacement of noble metals with inexpensive transition metal carbides in fuel cell devices and thermal reforming. See Esposito, D. V. & Chen, J. G. Monolayer platinum supported on tungsten carbides as low-cost electrocatalysts: opportunities and limitations. Energy & Environmental Science 4, 3900 (2011), which is incorporated by reference in its entirety.

As disclosed herein, transition metal oxide nanoparticles can be transformed into transition metal nanoparticles, transition metal carbide nanoparticles, transition metal nitride nanoparticles or transition metal phosphide nanoparticles by carrying out the transformation in an immobilizing matrix, such as an inert inorganic matrix, for example, silica, alumina, germania, zirconia, or ceria.

A three-step method that allows for the production of non-sintered, surface impurity-free, ultrasmall transition metal carbide, nitride, sulfide, boride or phosphide nanoparticles that can be highly loaded onto a desired support is disclosed. For example, transition metal oxide nanoparticles can be encapsulated at room temperature within an inorganic matrix. The encapsulated transition metal oxide nanoparticles can then be transformed to transition metal carbide, nitride, sulfide, boride or phosphide nanoparticles, for example, by carburization, nitridization, phosphorization, boridization or sulfidization in an appropriate atmosphere. Depending on the ultimate use of the transition metal carbide, nitride, phosphide, boride or sulfide nanoparticles, the inorganic matrix can be removed, for example, by room-temperature dissolution, to yield either a nanodispersion of nanoparticles or supported nanoparticles. Using this versatile "removable ceramic coating method," tungsten carbide (WC) as well as heterometallic molybdenum tungsten carbide ($Mo_xW_{1-x}C$) nanoparticles, for example, can be synthesized. Phase-purity control is possible by tuning the synthesis parameters to synthesize semicarbide, hexagonal carbide, as well as cubic carbide nanoparticles.

Nanoparticles can be composed of a transition metal carbide, transition metal nitride or transition metal phosphide. The transition metal carbide can be a pure carbide or a mixed carbide, for example, a transition metal oxy carbide. Oxycarbides can be synthesized with any bulk carbon: oxygen stoichiometry. At low bulk oxygen concentrations, the tungsten moieties can be oxidized by oxygen without oxidation of the intercalated carbon moieties. These compositions can be prepared by exposing a carbide to an oxidizing atmosphere at elevated temperatures over long time periods. High bulk oxygen concentrations are typical for incompletely oxidized carbide materials in which local domains of tungsten moieties are oxidized with complete oxidation and removal of carbon via carbon dioxide release. Other localized moieties are incompletely oxidized and still contain intercalated carbons, giving an overall bulk carbon content that is low. Such materials are typically not isotropic and can be prepared by rapid heating and cooling in an oxidizing atmosphere via a furnace, a microwave, or using localized electric arc-based methods in a liquid environment.

The transition metal nitride can be a pure nitride or a mixed nitride, for example, a transition metal oxy nitride. The transition metal phosphide can be a pure phosphide or a mixed phosphide, for example, a transition metal oxy phosphide. For example, the transition metal carbide can be titanium carbide, zirconium carbide, hafnium carbide, vanadium carbide, niobium carbide, tantalum carbide, chromium carbide, molybdenum carbide, tungsten carbide, titanium oxy carbide, zirconium oxy carbide, hafnium oxy carbide, vanadium oxy carbide, niobium oxy carbide, tantalum oxy carbide, chromium oxy carbide, molybdenum oxy carbide, or tungsten oxy carbide. In another example, the transition metal nitride can be titanium nitride, zirconium nitride, hafnium nitride, vanadium nitride, niobium nitride, tantalum nitride, chromium nitride, molybdenum nitride, tungsten nitride, titanium oxy nitride, zirconium oxy nitride, hafnium oxy nitride, vanadium oxy nitride, niobium oxy nitride, tantalum oxy nitride, chromium oxy nitride, molybdenum oxy nitride or tungsten oxy nitride. In another example, the transition metal phosphide can be titanium phosphide, zirconium phosphide, hafnium phosphide, vanadium phosphide, niobium phosphide, tantalum phosphide, chromium phosphide, molybdenum phosphide, tungsten phosphide, titanium oxy phosphide, zirconium oxy phosphide, hafnium oxy phosphide, vanadium oxy phosphide, niobium oxy phosphide, tantalum oxy phosphide, chromium oxy phosphide, molybdenum oxy phosphide or tungsten oxy phosphide.

In addition, because a carburizing, nitridizing, sulfidizing, phosphidizing or boridizing atmosphere can be used to make the materials described herein, it is theoretically possible to synthesize any interstitial carbide provided an element has a naturally occurring carbide, nitride, or phosphide, and the formation of this material occurs below the onset of densification and crystallization of the inorganic matrix. For example, the inorganic matrix can be alumina, silica, germania, zirconia, or ceria. The synthesized materials can include carbides, nitrides, or phosphides of Group III (scandium, yttrium, or lutetium, but not including lawrencium), and all 3d transition metals including scandium, yttrium, vanadium, chromium, manganese, iron, cobalt, nickel, copper, or zinc. While the platinum group metals, rhenium and technetium can form carbides and nitrides, the synthesis would require conversion at high pressures and temperatures (e.g., ~2000K), conditions in which any known inorganic matrices would have near zero porosity, meaning the method as described herein would not work unless other matrix materials were developed that could support pores at the conversion temperatures.

F-block metals can also be used to make the materials described wherein, but these can be rare and have limited application. The notable exceptions are carbides, nitrides, and phosphides of lanthanum, cerium, neodymium or samarium. However, all of the lanthanides form stable carbides, nitrides, and phosphides at low temperatures, making them amenable to the removable ceramic coating method described herein. Neodymium is as abundant as nickel and iron in the earth's crust and its carbides, nitrides, and phosphides form at low temperature and have interesting optical and magnetic properties. Samarium phosphide is a unique small-band gap n-type semiconductor. The method could theoretically allow for the synthesis of ultrasmall samarium phosphide nanoparticles as this can be done below 1000 centigrade. Samarium isopropoxide is a commercially available and inexpensive.

For example, the nanoparticle can have a composition of formula (I)

$$M1_x M2_y M3_z X1_{w1} X2_{w2} \tag{I}$$

in which each of M1, M2 and M3, independently, is an transition metal element from the group consisting of group 3, group 4, group 5, group 6, 3d block, or f block, and each of X1 and X2, independently, is selected from the group consisting of O, C, N and P, at least one of X1 and X2 being C, N or P. Each of x, y, w1, w2, and z is a number between 0 and 1, where at least one of x, y, z, w1 and w2 is not zero and the combination of x, y, z, w1 and w2 complete the valence requirements of the formula. The transition metal element can include Ti, Zr, Hf, V, Nb, Ta, Cr, Mo and W.

The size of such nanoparticle can be less than 20 nm, less than 10 nm, less than 5 nm, less than 3 nm or less than 1 nm.

A majority of the plurality of nanoparticles can be in a single phase. In the case of tungsten carbide, a plurality of nanoparticles can be in a β phase. The synthesis conditions can be tuned such that a plurality of nanoparticles are in an α phase or are the semicarbide, $W_2C$.

Initial nanoparticle formation can fall into three categories:

1.) Initial nanoparticles can be formed in a separate step before incorporation in an inorganic matrix
2.) Initial nanoparticles can be formed simultaneously with the formation of the inorganic matrix
3.) Initial nanoparticles can be formed after formation of the inorganic matrix.

In the first category, there are no restrictions on the methodology used to form the initial nanoparticles. Any known and desired method could be used in principle to make either metal oxide or metallic nanoparticles, including colloidal methods, reverse microemulsions, microemulsions, and solvothermal. See, for example, Altavilla, C., et al. Inorganic Nanoparticles: Synthesis, Applications, and Perspectives. ISBN-10: 1439817616.
R. Nagarajan and T. A. Hatton. Nanoparticles: Synthesis, Stabilization, Passivation and Functionalization. ISBN-10: 0841269696, which is incorporated by reference in its entirety. Specifically, for the descriptions and references for forming the initial nanoparticles performed in this disclosure, see Materials and Methods. Precursors used include sodium tungstate, hydrochloric acid, sodium molybdate, tungsten isopropoxide, and molybdenum isopropoxide.

In the second category, nanoparticles can be formed simultaneously with the formation of the inorganic matrix. In terms of reverse microemulsions, this can be performed by injecting TEOS (or some other silica precursor) and ammonium hydroxide or HCl or some other catalyst at the start of synthesis of the metal oxide nanoparticles. For sol-gels, this can include the addition of all components at the beginning of the synthesis procedure.

In the third category, nanoparticles can be formed by post-synthesis of the inorganic matrix. A method can include the synthesis of a silica sol-gel in an aqueous environment during which a tungsten precursor (ammonium metatungstate (AMT) or ammonium paratungstate (APT)) is added during the silica sol-gel synthesis. The resulting $SiO_2$/AMT or $SiO_2$/APT is calcined in air to set the silica pore structure and decompose the ammonium moieties from the AMT or APT keggin structures. The keggin anions then serve as the precursors to metal oxide nanoparticles. Post-calcination, the resulting material can be reduced and carburized, nitridized, or phosphidized in a similar manner to those materials prepared by the reverse microemulsion method.

Transition metal oxide nanoparticles can be encapsulated in the inorganic matrix, reduced to a metal in a reducing atmosphere, and then carburized, nitridized, sulfidized, or phosphidized. For example, metal oxide nanoparticles can be reduced to metal in a carburizing atmosphere, such as a methane/hydrogen atmosphere, a carbon monoxide-based atmosphere, an ethane-based atmosphere, etc. and further carburized to metal carbides. In another example, metal oxide can be nitridized in a nitridizing atmosphere, such as an ammonia-based atmosphere. In another example, metal oxide can be phosphidized in a phosphidizing atmosphere, such as a phosphine-based atmosphere. In another example, metal oxide can be phophidized by mixing one reverse microemulsion with ammonium metatungstate (AMT) and a second reverse microemulsion with ammonium phosphate to make ammonium phosphotungstate, coating directly with an inorganic matrix in-situ, calcining at to make/transition metal oxide nanoparticles in the inorganic matrix, and reducing to make transition metal phosphide nanoparticles in the inorganic matrix. In another example, transition metal sulfides can have a variety of industrially relevant applications. Transition metal borides can also be prepared similarly by flowing diborane gas. Transition metal borides also exist for most of the d-block metals, including W and Ni. Nickel boride is a hydrogenation catalyst and is also ferromagnetic. The inorganic matrix can be removed, as necessary. Transition metal carbonitrides, carbophosphides, or nitrophosphides can also be synthesized in appropriate conditions.

The inorganic matrix can include ceramics, silicates, glasses, aluminum silicates, alkali aluminum silicates, potassium silicates, sodium silicates, silicon carbides, silicon nitrides, cementitious materials, titanium oxides, aluminum oxides, magnesium oxides, boron oxides, phosphorus oxides, germanium oxides, indium oxides, tin oxides, zirconium oxides, cerium oxides or other matrix materials. The percentage of the transition metal can be greater than 1%, greater than 10%, greater than 20%, greater than 30%, or great than 40% in the inorganic matrix.

The inorganic coating matrix can be made by, for example, one of the following methods. The inorganic matrix can be made by wet chemical methods using a matrix precursor, or by atomic layer deposition. For example, an alumina layer can be created with Atomic Layer Deposition using trimethyl aluminum and water. When 60 cycles were performed, a uniform 8 nm coating of alumina was obtained on a $WO_3/Al_2O_3$ sample. The material can then be reduced and carburized to form $Al_2O_3/\alpha\text{-}WC/Al_2O_3$. The $WO_3$ can initially be supported on other catalysts as well such as titania, ceria, silica, zirconia, or zeolites such as ZSM-5. In addition to alumina layers using trimethyl aluminum, other inorganic oxide overlayers can be prepared from other standard ALD precursors, such as tris(cyclopentadienyl) cerium, tetrakis(dimenthylamino)hafnium, silicon(IV) chloride, tetrakis(dimethylamino)titanium(IV), or tetrakis(dimethylamino)zirconium(IV).

Matrix precursors can be selected from a metal oxide precursors, such as a metal halide or alkoxide, titanium alkoxide, an aluminum alkoxide, a silicon alkoxide, a magnesium alkoxide, a boron alkoxide, a phosphorus alkoxide, a germanium alkoxide, an indium alkoxide, a tin alkoxide, a zirconium alkoxide, or mixtures thereof. The metal oxide precursor can be obtained commercially or prepared by contacting a metal halide with an alcohol. The precursor can then be formed into an inorganic matrix through controlled hydrolysis. The inorganic matrix is itself a metal oxide, and therefore all of the techniques described for making the nanoparticles also apply to the inorganic matrix. The matrix can be made colloidally, within a reverse microemulsion, within a microemulsion, using a sol-gel technique, or solvothermally. This disclosure describes the Brij/heptane/water reverse microemulsion system to coat TMO NPs with silica. Unlike other systems (such as Igepal), this method makes it possible to encapsulate a plethora of ultrasmall TMO NPs within discreet silica nanospheres, in a highly efficient manner. In general, any silicon precursor can be used. Tetraethyl orthosilicate (TEOS), a metal alkoxide, is chosen in this disclosure, because it is inexpensive and highly pure. It slowly hydrolyze in water to form a silica polymer network (the inorganic matrix). The speed at which this polymer network forms can be controlled by adding a catalyst (either an acid or a base). A "slow" reaction is typically preferred to ensure uniform encapsulation of the metal oxide nanoparticles or uniform incorporation of a metal precursor.

Examples are also included using an Igepal CO-520/heptane/water RME system using both metal alkoxide precusors and transition metal oxide salt precursors. Examples are included using a Triton X-100/hexanol/heptane/water RME system. Further examples are provided using a Sol-Gel method using metal alkoxides hydrolysis in a water/isopropanol/citric acid system.

In another example, an alumina coating can be formed using atomic layer deposition (ALD), which can allow reactive gases such as ethylene and oxygen to pass through to react at the nanoparticle surface and then diffuse back out, preventing coke formation and stopping sintering. Reactive gases such as hydrogen and methane can diffuse through microporous ceramic coatings, reach the nanoparticle surfaces, and subsequently intercalate into the nanoparticle lattice. For example, in alumina-supported tungsten oxide nanoparticles covered with 8 nm of alumina using ALD, methane can diffuse through the alumina to form a carbide.

Synthetic examples showcasing the method include carbides, nitrides, and phosphides of monometallic and heterometallic nanoparticles of W, Mo, Ti, Nb, Ta, V, or Fe.

The inorganic matrix can be removed via a hot alkaline treatment or a room temperature dissolution, and the resulting nanoparticles can be stored as a suspension or can be deposited on a support. The matrix can be removed to give metal-terminated, phase-pure transition metal carbide nanoparticles that can be dispersed on a support. For example, the silica coating can be removed using a hot alkaline treatment or at room temperature in 20 wt % ammonium bifluoride (ABF) while the tungsten carbide nanoparticles are simultaneously deposited onto a carbon black support. In another example, the inorganic matrix can be removed using hydrofluoric acid, ammonium bifluoride (ABF), some other fluoride ion source (such as just ammonium fluoride, although the removal will be slower), or using an alkaline treatment. Fluoride-mediated routes were performed at room temperature typically using 50 mL of solution per gram of encapsulated carbide. This large excess of solution is not necessary for the removal but was preferred to obtain good dispersion of the nanoparticles onto a desired support in-situ. ABF-mediated routes explored included 10 wt %, 15 wt %, 20 wt %, or 30 wt % ABF in water. All methods worked both at room temperature and elevated to 35° C. Both quartz and amorphous silica can be fully removed after only a few hours. Typically, the solution is left stirring overnight.

Alkaline-mediated routes can also be employed to fully remove the silica coatings. Typically, 300 mL/g of 0.1 to 0.5 M NaOH in water is used overnight. Temperatures can vary from room temperature to 80° C. Increasing the temperature accelerated the removal of the silica coating. This method is more suitable to carbides, nitrides, and phosphides that are stable in strongly alkaline conditions, such as titanium and tantalum-based carbides, nitrides, and phosphides.

A plurality of the nanoparticles can be dispersed on a support. For example, the support can be carbon black, graphene, carbon nanotubes, or high-surface area carbide. For electrocatalysis, battery, capacitor, electrolyzer, and fuel cell applications, electrically conducting supports are preferred. Such supports serve the role of conducting electrons to or from the catalytically active carbide, nitride, or phosphide nanoparticles, while also serving to disperse the nanoparticles in a high surface area microstructure for maximum contact with the electrolyte or fuel, which can be a gas, liquid, or solid. Such materials that fulfill this role are usually carbon-based, such as carbon black (i.e. Vulcan® XC-72r or Ketjen® black), single and multiwalled carbon nanotubes, and graphene. A support can also be metal-based such as high surface area carbides, nitrides, phosphides, sulfides, borides, or monometallic and heterometallic mixtures of high surface area metal particles. As another example, a support can be conducting metal oxides such as some perovskites. For thermal catalysis applications, it is desired to disperse the nanoparticles in a thermally-stable high surface area environment. Such materials that can fulfill this role include silica, alumina, zirconia, titania, ceria, etc. In addition, the many classes of zeolites such as NaY, ZSM-5, beta, or MCM can fulfill this role.

For supports that are stable in ABF, HF, or other fluoride-based environments (such as the carbon-based supports), the support can be added to the silica-encapsulated carbide and water mixture directly before addition of the ABF or other fluoride-containing species. After stirring overnight, the nanoparticles electrostatically adhere to the new support once released from the dissolving inorganic matrix template. Once complete, ammonium hydroxide can be used to neutralize the solution for safer handling and separation. For supports that are unstable in ABF, HF, or other fluoride-based environments, the silica-encapsulated carbide was first dissolved to obtain a carbide nanodispersion, and then ammonium hydroxide was used to neutralize the solution to a pH of ~7. Once neutralized, the support (such as alumina, titania, etc.) can be added to the mixture and stirred for a few hours, allowing the nanoparticles to adhere electrostatically to the support.

Similar methods can be employed for alkaline-based methods. However, the solution cannot be neutralized before adding a support because the aqueous silicon hydroxide will precipitate out. The supernatant must first be removed and the nanoparticles redispersed in fresh solvent before support addition. If the support is stable in alkaline conditions (such as a carbon-based support), then the support can also be added at the start of the dissolution.

Synthesis and Characterization

A method of producing a plurality of transition metal nanoparticles can include encapsulating metal oxide nanoparticles within an inorganic matrix, calcining the encapsulated nanoparticles in an oxidizing atmosphere or vacuum, heating the nanoparticles in the presence of a reducing agent, and converting the metal oxide nanoparticles to nanoparticles including interstitial C, N or P. The method can also include removing the inorganic matrix.

The nanoparticles can be carburized in a methane atmosphere, where the nanoparticle can include a tungsten carbide nanoparticle, a molybdenum carbide nanoparticle, or heterometallic carbide nanoparticle.

In catalysis, bimetallic and trimetallic nanoparticles can impart new catalytic activity not native to the monometallic counterparts, impart added stability, alter binding energies of adsorbed species, have bifunctional catalytic properties, and enable "One-pot" reactors. The heterometallic carbide nanoparticle can include a molybdenum tungsten carbide.

Transition metal nitrides (TMN) can be produced by nitridizing the nanoparticles using ammonia gas at 800° C. TMNs can be used as a cathode similar to transition metal carbide in $Li-O_2$ batteries. Transition metal phosphides (TMP) can be used as a thermal catalysis. In the case of TMPs, using phosphine gas is dangerous, so the following steps can be used. First, mix one reverse microemulsion (RME) with ammonium metatungstate (AMT) and a second reverse microemulsion with ammonium phosphate to make ammonium phosphotungstate. Then, coat directly with silica in-situ, calcine at 450° C. to make $SiO_2/WPO_x$, reduce at 650° C. to make $SiO_2/WP$, and remove silica using ABF, and add the support.

Figure 3:
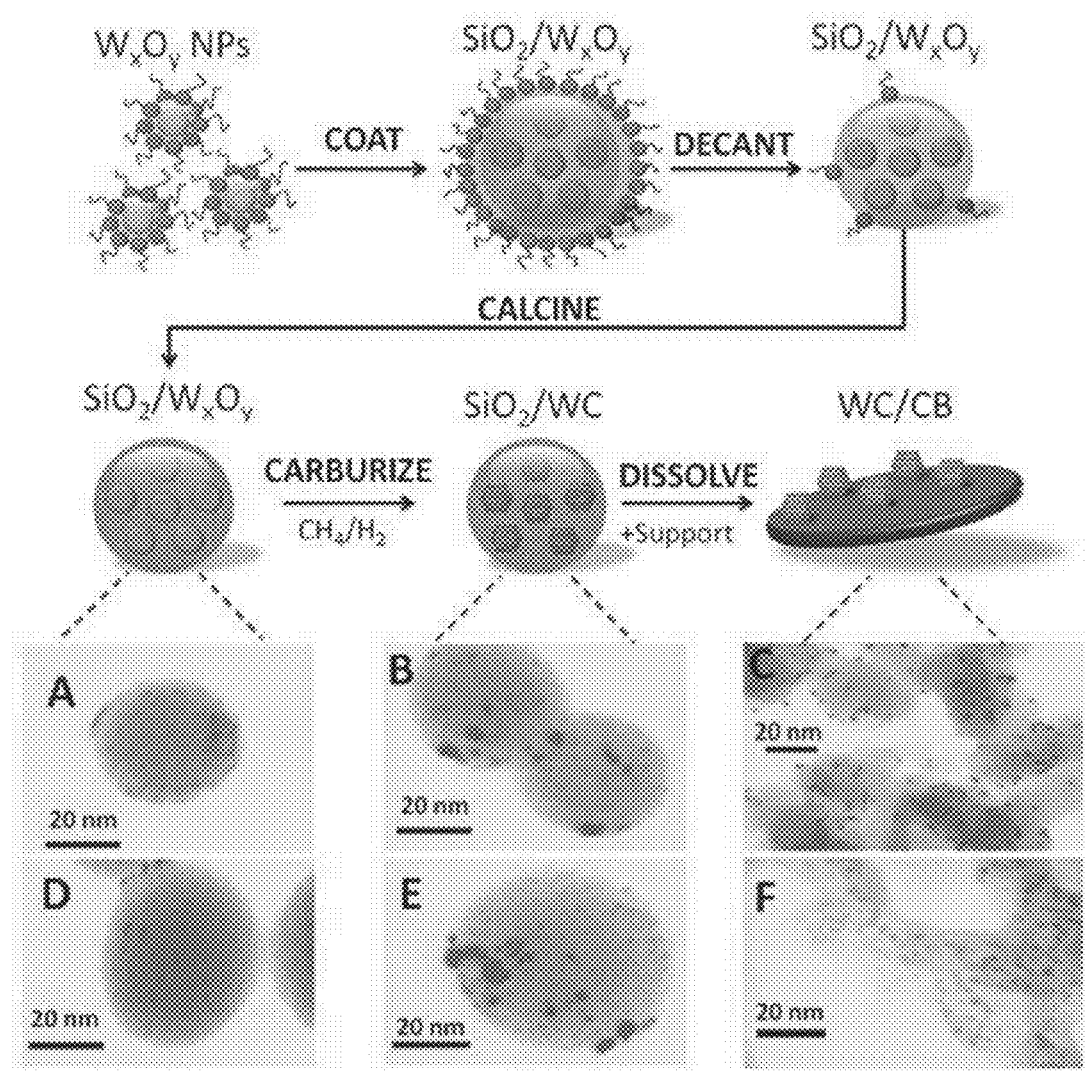
FIG. 3A-3F is a schematic diagram of the removable ceramic coating method for the synthesis of ultrasmall, non-sintered, metal-terminated, phase-pure tungsten carbide nanoparticles supported on a carbon black support. FIG. A-C depict the process results for making 2-3 nm WC NPs supported on carbon black while FIG. D-F depict the process results for making 1-2 nm WC NPs supported on carbon black.

A three-step process for the production of non-sintered, surface impurity-free, ultrasmall transition metal carbide nanoparticles that can be highly loaded onto a desired support is described as follows. This synthesis method is versatile and scalable, allowing for the deposition of well-dispersed, impurity-free TMC NPs in the range of 1-4 nm on any support with loadings exceeding 40%. Ultrasmall transition metal oxide nanoparticles can be efficiently encapsulated within silica ($SiO_2$) nanospheres at high weight percent loadings using a reverse microemulsion (RME). The silica coating serves as a microporous hard template, which prevents sintering of adjacent nanoparticles while allowing reducing and carburizing gases (i.e. hydrogen and methane, respectively) to diffuse to the transition metal oxide nanoparticle surfaces and subsequently reduce the oxides or intercalate into the nanoparticle lattice to form a carbide. Control of nanoparticle size, the carbide phase-purity, and the silica shell stability and structure are demonstrated to be a function of synthesis parameters such as surfactant choice, pH, precipitating solvent, and carburizing conditions. The silica coating was fully removed using either a room temperature aqueous ammonium bifluoride (ABF) treatment or a hot alkaline treatment. The resulting transition metal carbide nanoparticles were either stored as a nanodispersion in water or ethanol or loaded in-situ during the dissolution onto a carbon black support at a desired loading (FIG. 3). Tungsten carbide (WC) and molybdenum tungsten carbide (Mo$_x$W$_{1-x}$C) nanoparticles supported on Vulcan® XC-72r carbon black (CB) were investigated as commercially-relevant probe candidates for the "removable ceramic coating method," and their activities towards the hydrogen evolution reaction (HER) and methanol electrooxidation (MOR) in an acidic medium are compared to commercial platinum (Pt) nanoparticles supported on carbon black.

In FIG. 3, step 1 shows the reverse-microemulsion mediated synthesis of silica-coated tungsten oxide nanoparticles, step 2 shows temperature programmed reaction (TPR) using reactive gases to form the carbide using a mixture of methane and hydrogen, and step 3 represents that in a single pot, the silica coating can be removed at room temperature in 20 wt % ammonium bifluoride (ABF) while the tungsten carbide nanoparticles are simultaneously deposited on a carbon black support.

In the first step of the method, amorphous tungsten oxide (WO$_x$) nanoparticles were synthesized using a water-in-oil (w/o) reverse microemulsion (RME) consisting of nano-sized water domains dispersed in heptane via a nonionic surfactant at room temperature. See Xiong, L. & He, T. Synthesis and Characterization of Ultrafine Tungsten and Tungsten Oxide Nanoparticles by a Reverse Microemulsion-Mediated Method. Chemistry of Materials 18, 2211-2218 (2006) and Panda, a. K., Moulik, S. P., Bhowmik, B. B. & Das, a. R. Dispersed Molecular Aggregates. Journal of colloid and interface science 235, 218-226 (2001), each of which is incorporated by reference in its entirety. To reduce processing steps via a "one-pot" unit operation, the WO$_x$ nanoparticles were subsequently coated in-situ with silica before precipitating with a suitable solvent and decanting. A RME-mediated synthetic process was chosen because it is a versatile and scalable solution-based method that allows for nanoparticle size-tuneability as well as the facile synthesis of heterometallic nanoparticles. See, Zarur, A. J., Hwu, H. H. & Ying, J. Y. Reverse Microemulsion-Mediated Synthesis and Structural Evolution of Barium Hexaaluminate Nanoparticles. 3042-3049 (2000), which is incorporated by reference in its entirety. RMEs have also been used to coat gold, silver, and iron oxide nanoparticles in silica nanospheres. See, for example, Han, Y., Jiang, J., Lee, S. S. & Ying, J. Y. Reverse microemulsion-mediated synthesis of silica-coated gold and silver nanoparticles. Langmuir: the ACS journal of surfaces and colloids 24, 5842-8 (2008) and Yi, D. K., Lee, S. S., Papaefthymiou, G. C. & Ying, J. Y. Nanoparticle Architectures Templated by SiO$_2$/Fe$_2$O$_3$ Nanocomposites. Chemistry of Materials 18, 614-619, each is which is incorporated by reference in its entirety. Typically, these SiO$_2$/nanoparticle "core-shell" architectures contain large, low-surface area ~10 nm nanoparticles that are singly coated in an excess of silica such that it would be wasteful as a removable synthetic templating method. Moreover, the nanoparticle synthesis and coating is not performed in-situ within the same RME. Instead, by using a nonionic Brij-L4®/n-heptane/water reverse microemulsion system, it was possible to synthesize and then coat in-situ on the order of 100 ultrasmall (1-2 nm) WO$_x$ nanoparticles within ~40 nm silica nanospheres (FIG. 3A). On a reagent basis, the optimal method reported here consists of ~20 wt % W (in the form of WO$_x$ nanoparticles) encased in ~80 wt % SiO$_2$. Various nanoparticle sizes and coating nanostructures could be obtained by using different precursors (tungsten (VI) isopropoxide (WIPO) or sodium tungstate) or different nonionic surfactant systems such as Brij-L4®, Igepal CO-520®, and Triton X-100®/hexanol.

In the second step of the method, the silica-encapsulated WO$_x$ nanoparticles were calcined in air at 450° C. to remove any residual surfactant and form an amorphous silica phase (FIG. 4D). Next, the material was reduced at 600° C. and then carburized for four hours in 21% CH$_4$/H$_2$ at 835° C. to form silica-encapsulated carbide nanoparticles (FIG. 3B). Finally, the material was held at 835° C. for one hour in pure H$_2$ to scavenge any residual surface carbon and then passivated at room temperature in 1% O$_2$/N$_2$ for three hours to form a controlled oxide layer on the surface of the carbide nanoparticles. See Esposito, D. V, Hunt, S. T., Kimmel, Y. C. & Chen, J. G. A new class of electrocatalysts for hydrogen production from water electrolysis: metal monolayers supported on low-cost transition metal carbides. Journal of the American Chemical Society 134, 3025-33 (2012), which is incorporated by reference in its entirety. While ceramic coatings such as microporous alumina and mesoporous silica on noble metal catalysts can reduce coking (surface carbon buildup) and sintering during high temperature catalytic reactions while maintaining high activity (see, for example, Lu, J. et al. Coking- and Sintering-Resistant Palladium Catalysts Achieved Through Atomic Layer Deposition. Science 335, 1205-1208 (2012), Dai, Y. et al. A sinter-resistant catalytic system based on platinum nanoparticles supported on TiO2 nanofibers and covered by porous silica. Angewandte Chemie (International ed. in English) 49, 8165-8 (2010), and Joo, S. H. et al. Thermally stable Pt/mesoporous silica core-shell nanocatalysts for high-temperature reactions. Nature materials 8, 126-31 (2009), each of which is incorporated by reference in its entirety), the nanoparticle wt % loadings are low (typically 1-3 wt %), and the coatings only prevent sintering up until ~750° C., which is too low to form single phase hexagonal tungsten carbide. The scanning transmission electron microscopy (STEM) images of FIG. 3B indicate that even after prolonged exposure to carburizing conditions at 835° C., sintering has been largely mitigated within these highly loaded silica nanospheres. Some sintering of the nanoparticles occurred, due to the nanoparticles that diffused to the surface of the silica nanospheres and then sintered by lateral diffusion, as determined by STEM (FIG. 3B) and XPS of the silica-encapsulated carbide nanoparticles where the W 4f signal was detectable, indicative of surface nanoparticles. The highly loaded silica nanospheres also did not sinter or lose their spherical shape, which can be attributed to the high dispersion of nanoparticles throughout the nanosphere matrix, reinforcing its structure. See Silva, J. B., Diniz, C. F., Viana, A. P. P. & Mohallem, N. D. S. Characterization of Porous Nanocomposites Formed by Cobalt Ferrites Dispersed in Sol-Gel Silica Matrix. Journal of Sol-Gel Science and Technology 35, 115-122 (2005), which is incorporated by reference in its entirety. For nanoparticles singly-coated in the center of a silica nanosphere, extensive silica sintering and re-structuring was observed after carburization.

The control over the resulting nanostructure and crystal phases of both silica and tungsten carbide is strongly dependent on various synthesis parameters. The optimal synthesis reported in FIG. 3 uses tungsten (VI) isopropoxide (WIPO) as the metal precursor, Brij-L4® (polyoxyethylene (4) lauryl ether) as the surfactant, a pH exceeding 11, and precipitating the material from the reverse microemulsion using methanol at a volumetric methanol:heptane ratio of 0.7. Analysis of the optimal SiO$_2$/WC material after carburization by XRD in FIG. 4A revealed that the silica remained amorphous while the nanoparticles are phase-pure and in the face-centered cubic (fcc), beta tungsten carbide phase (β-WC or WC$_{1-x}$). By lowering the carburization temperature to 775° C. and decreasing the CH$_4$/H$_2$ ratio to 18%, it was possible to synthesize tungsten semicarbide, W$_2$C nanoparticles (FIG.

4A). While the semicarbide is considered a low temperature metastable phase and the β carbide a high temperature metastable phase (Tulhoff, H., Berlin, H. C. S. & Goslar, W. Carbides. Ullman's Encyclopedia of Industrial Chemistry 565-582 (2012), which is incorporated by reference in its entirety), the β phase at a low temperature of 835° C. can be synthesized. Traditionally, the stable phase of tungsten carbide is a stoichiometric hexagonal close-pack lattice (α-WC, or simply tungsten carbide). Recent density functional theory (DFT) studies have predicted that both the fcc β-WC lattice and the hexagonal α-WC lattice are stable phases for ultrasmall nanoparticles. See Zavodinsky, V. G. Small tungsten carbide nanoparticles: Simulation of structure, energetics, and tensile strength. International Journal of Refractory Metals and Hard Materials 28, 446-450 (2010), which is incorporated by reference in its entirety. β WC nanoparticles can be synthesized at high temperatures using an electric arc discharge method described by Abdullaeva, Z. et al. "High temperature stable WC1-x@C and TiC@C core-shell nanoparticles by pulsed plasma in liquid." RSC Advances, 2013, 3, 513-519, which is incorporated by reference in its entirety. The methods described here permit synthesis of β WC nanoparticles in a methane/hydrogen atmosphere at a low temperature without sintering or excess surface carbon.

Figure 4A:
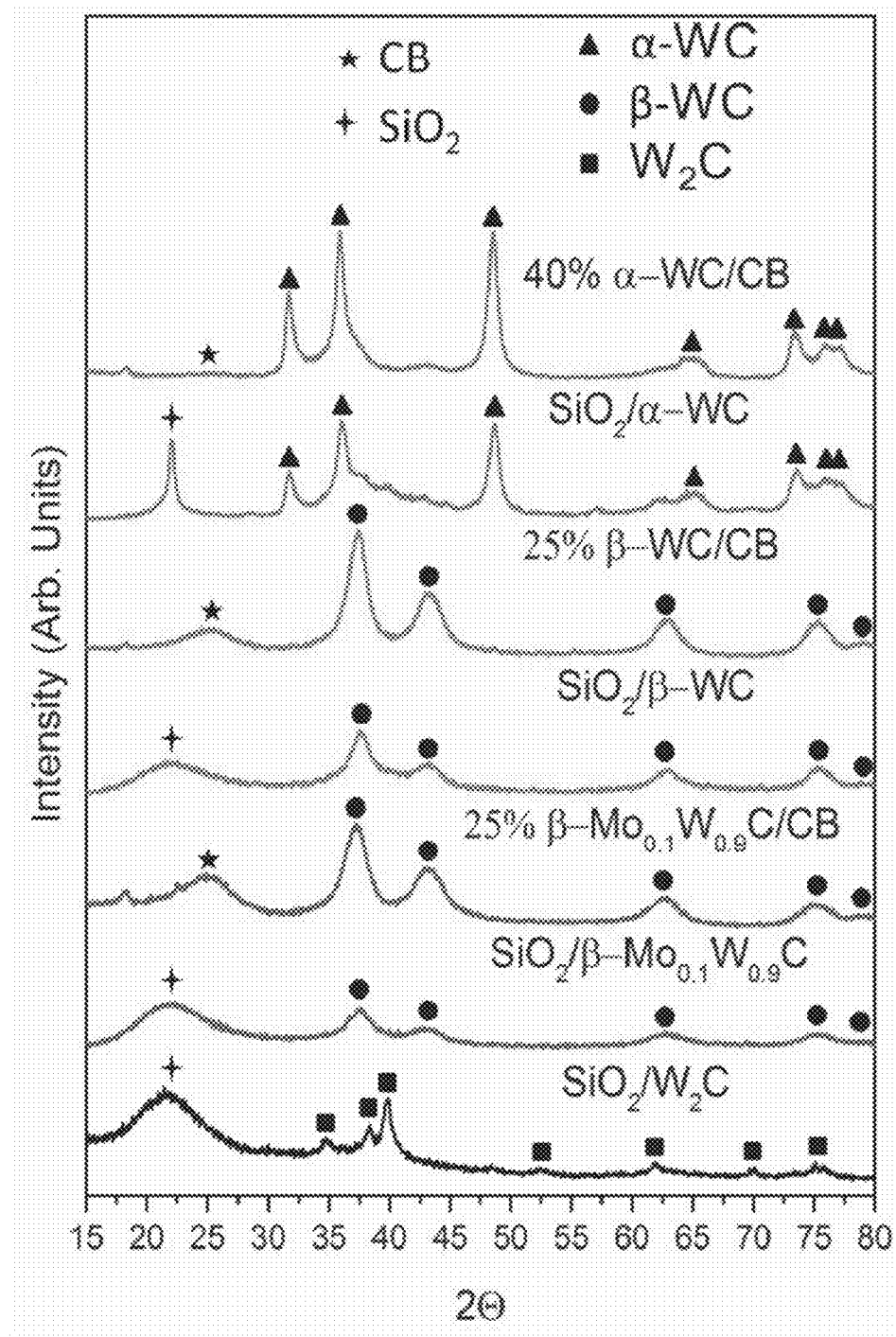
Figure 9:
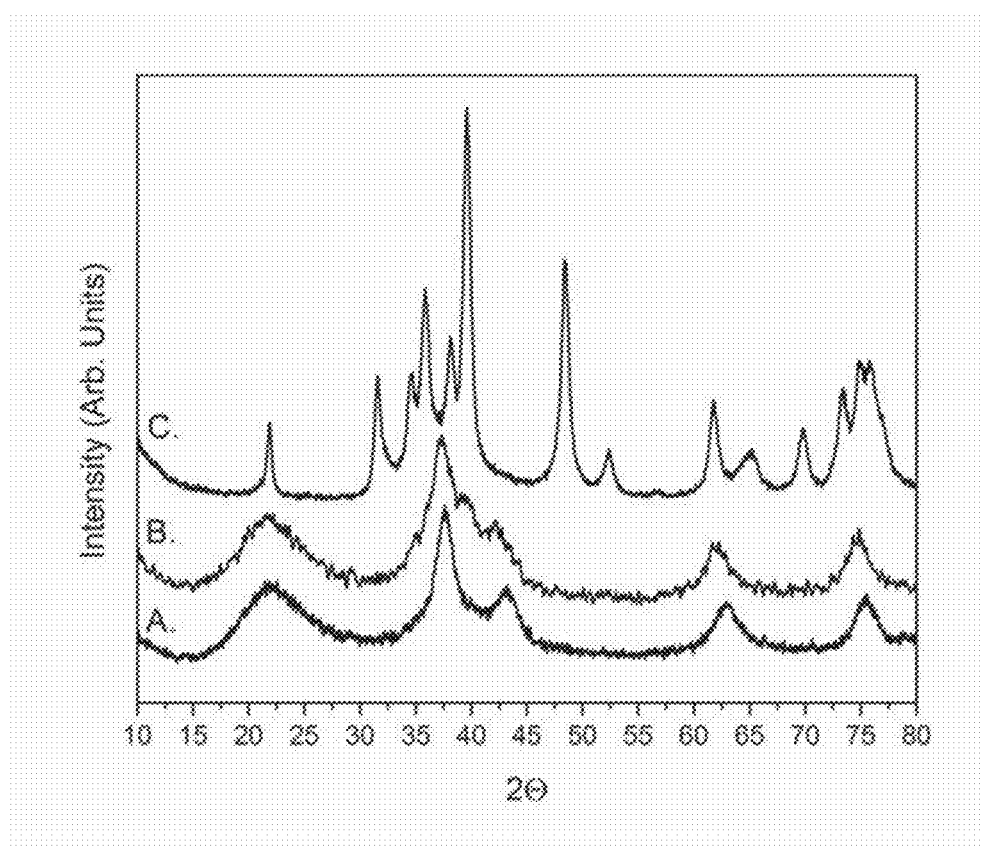
FIG. 9 is a XRD spectra for the material synthesized using the aforementioned conditions after high temperature carburizations at (A) 835° C. (B) 950° C. and (C) 1000° C.
Figure 10:
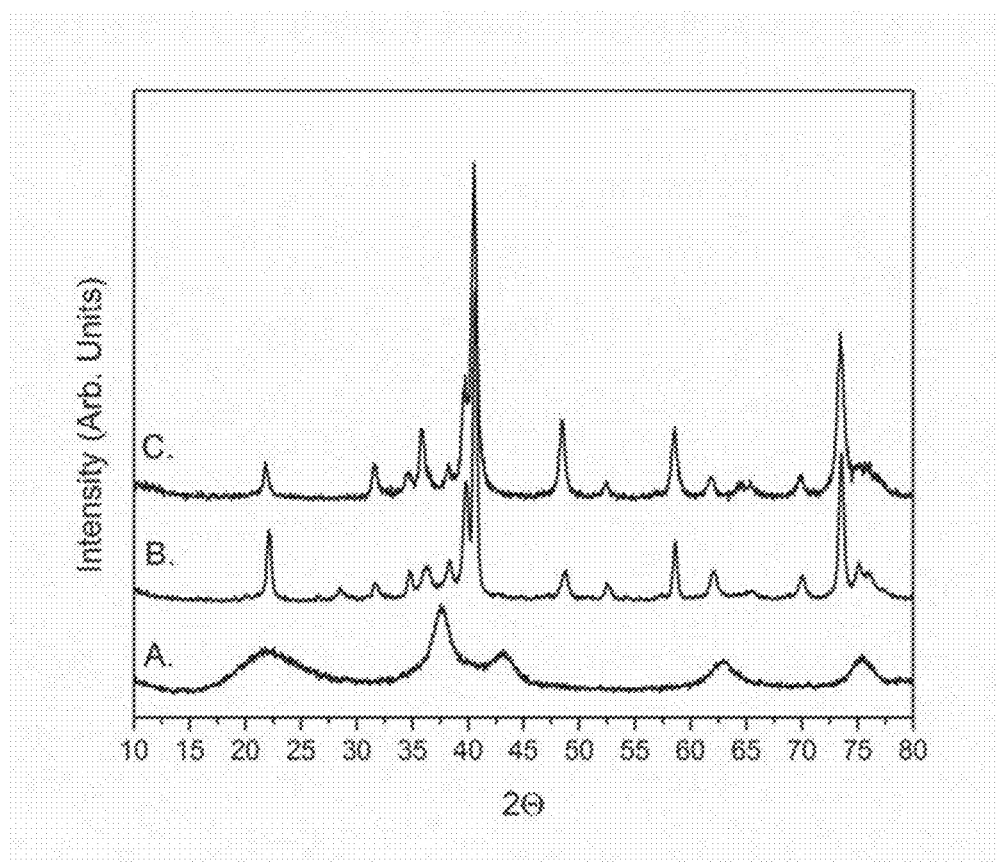
FIG. 10 depicts the XRD spectra if the material is precipitated in methanol (A), acetone (B), or isopropanol (C).

By simply lowering the ratio of methanol:heptane used during the precipitation of the reverse microemulsion to ~0.29 and carburizing the material at identical conditions used to make the β-WC nanoparticles, hexagonal α-WC nanoparticles were synthesized (FIG. 4A). For the optimal synthesis at high pH and using methanol as the precipitating agent, the nanoparticles were carburized at 835° C. for four hours. Amorphous silica was maintained at temperatures up to 950° C. transitioned to quartz if a carburization was performed at 1000° C. for five hours (FIG. 9). Precipitating in acetone or isopropanol, the presence of sodium cations (a known structure-directing agent), coating the nanoparticles with silica at a pH below ~10.8, or precipitating the reverse microemulsion with a low ratio of methanol:heptane results in quartz formation post-carburization at 835° C. (FIG. 10).

FIGS. 4 B,C, and D depicts particle size distributions of 0.8-1.5 nm β-WC NPs (B), 1-3 nm β-WC NPs (C), and 3-6 nm α-WC NPs (D). The particle-size distributions indicate that sintering is largely mitigated within these highly loaded silica nanospheres even after prolonged exposure to carburizing conditions at 835° C. A slight increase in particle size distribution (PSD) after carburization is attributed to the lateral diffusion of surface-bound NPs on the silica nanospheres. Indeed, such surface-bound NPs were detected with both STEM (FIG. 3) and x-ray photoelectron spectroscopy (XPS) (FIG. 4G).

Figure 20:
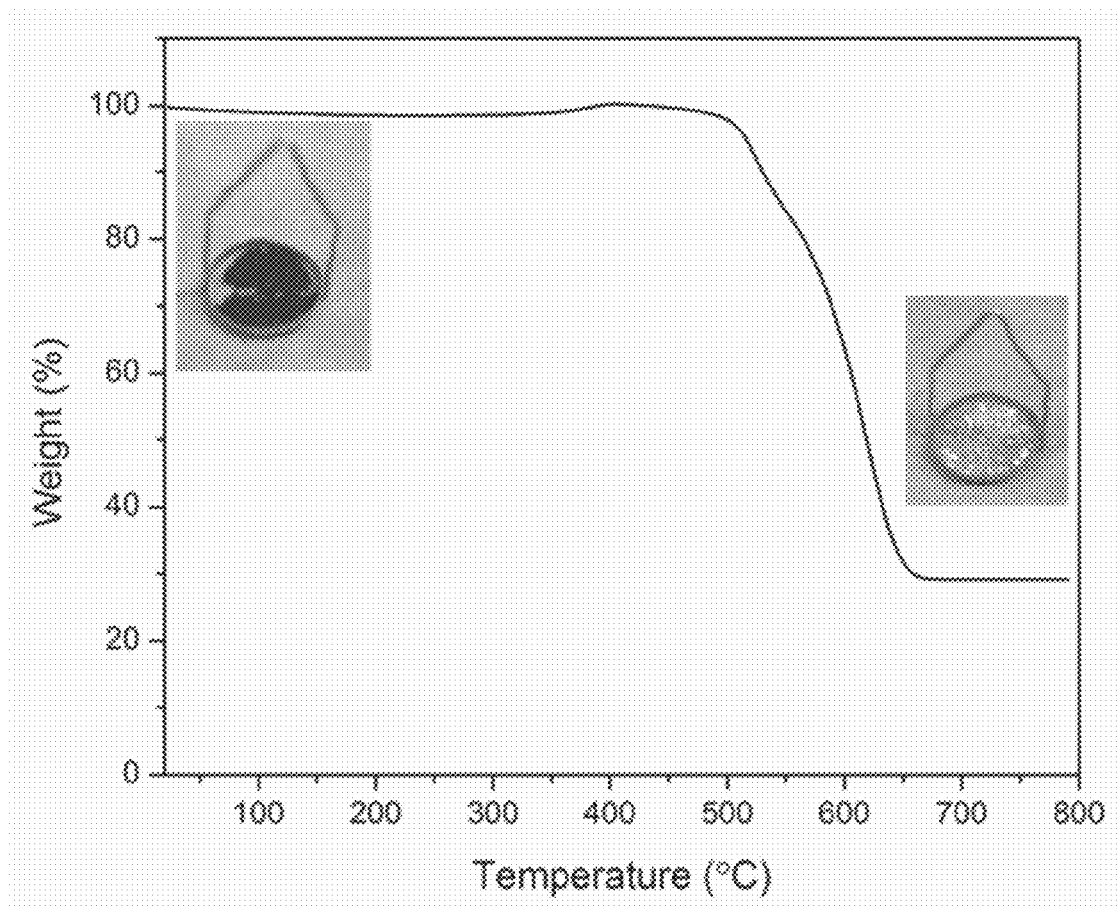
FIG. 20 is a graph depicting TGA of 25 wt % $\beta$-WC/CB in air with photographs showing the powder before and after TGA.
Figure 21:
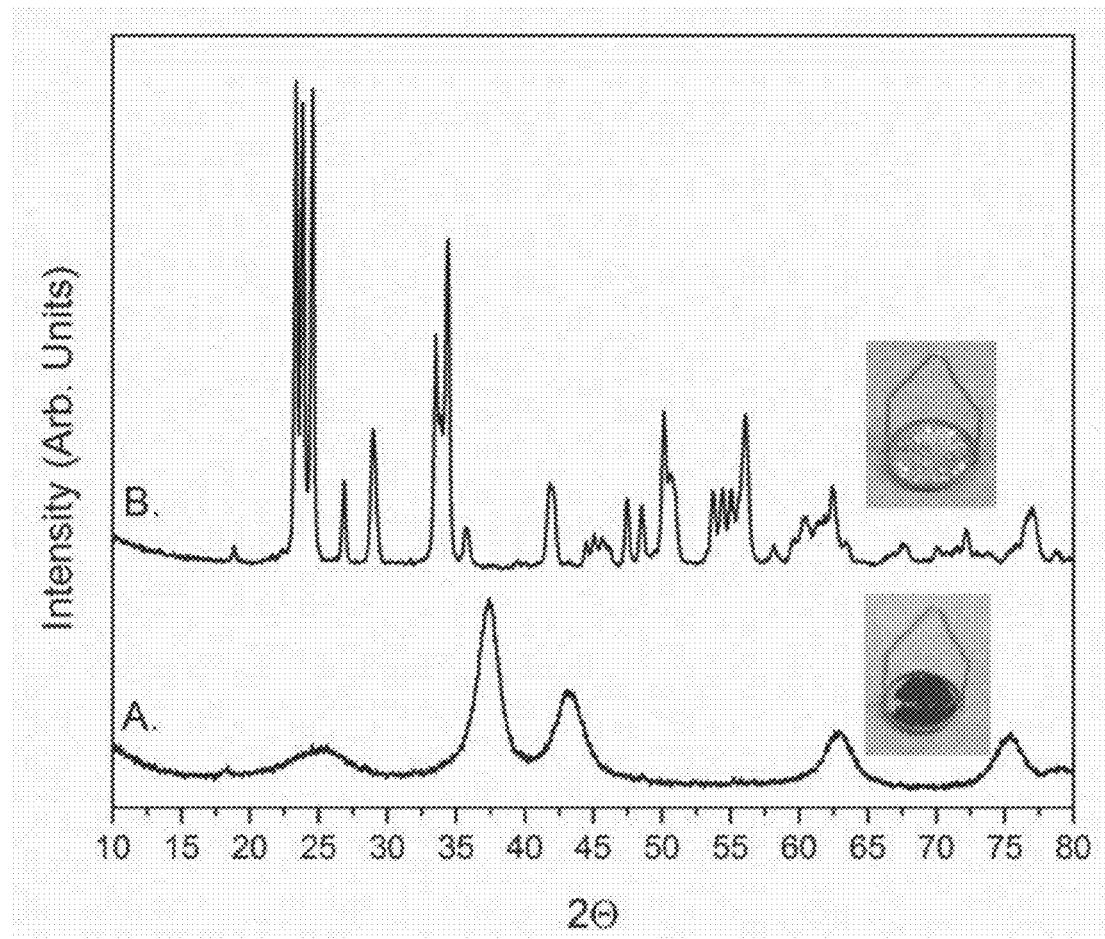
FIG. 21 is a series of XRD spectra before (A) and after TGA (B) of WC/CB.

The inorganic matrix can be removed using simple chemical etching methods tailored to remove the matrix without affecting the nanomaterial. For example, a facile, room temperature dissolution using 20 wt % ammonium bifluoride in water can be used to remove the insulating surface silica shell (FIG. 3C), and the free nanoparticles can be placed on the support of choice. For example, in electrocatalytic applications, such as fuel cells, it is desirable to support the tungsten carbide nanoparticles on an electrically conductive, high surface area support such as Vulcan® XC-72r carbon black (CB). This could be done by adding the carbon black directly to the mixture of SiO$_2$/WC and ammonium bifluoride at the beginning of the dissolution to electrostatically adhere tungsten carbide to the carbon black support with good dispersion, as seen in the STEM image in FIG. 3C and FIG. 4E. High surface area metal oxide supports such as alumina and silica are not stable in ammonium bifluoride, so the carbide-ammonium bifluoride solutions were neutralized with NH$_4$OH post-dissolution, and then the metal oxide support was added. The wt % of the loadings could be controlled by adjusting the amount of support added to the carbide-ammonium bifluoride solution, and the final loading on carbon black was determined using a combination of thermogravimetric analysis (TGA) and XRD (FIGS. 20 and 21).

Figure 18:
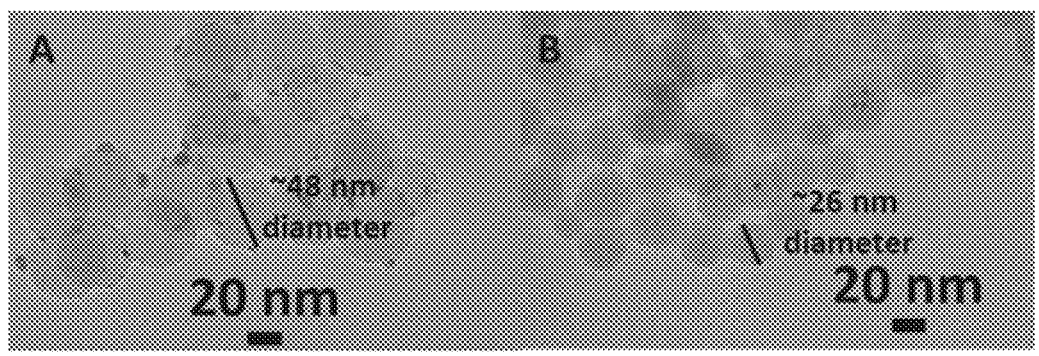
FIGS. 18A-18B are TEM images of $SiO_2/\beta$-WC (FIG. 18A) and $SiO_2/\beta$-WC (FIG. 18B) after stirring in 0.3M NaOH at 40° C. for 10 hours.
Figure 19:
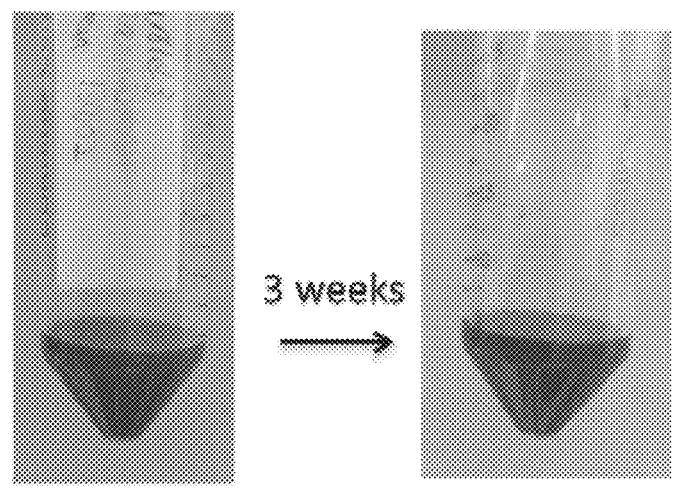
FIG. 19 is a series of images of a tungsten carbide nanodispersion dispersed in water showing that it does not settle after 3 weeks of sitting in stagnant ambient conditions.

If no support was added, it was possible to obtain a tungsten carbide nanodispersion that could then be dispersed in a suitable solvent, such as water or ethanol. The resulting black nanodispersion showed no signs of sedimentation even after weeks (FIG. 19). Because the nanoparticles are non-sintered, neither sonication, a nanolatex dispersing agent, or a stabilizing surfactant was required to disperse the tungsten carbide nanoparticles. See, Giordano, C., Yang, W., Lindemann, A., Crombez, R. & Texter, J. Waterborne WC nanodispersions. *Colloids and Surfaces A: Physicochemical and Engineering Aspects* 374, 84-87 (2011), which is incorporated by reference in its entirety. While both α-WC and β-WC are stable in ammonium bifluoride (FIG. 4A), they dissolve in strong alkaline media. See Weidman, M. C., Esposito, D. V., Hsu, I. J. & Chen, J. G. Electrochemical Stability of Tungsten and Tungsten Monocarbide (WC) Over Wide pH and Potential Ranges. Journal of The Electrochemical Society 157, F179 (2010), which is incorporated by reference in its entirety. For materials where the reverse is true, the silica nanospheres can be removed in aqueous pH 13 sodium hydroxide solutions at elevated temperatures (FIG. 18).

The resulting WC/CB and tungsten carbide nanodispersion materials were characterized by STEM and XRD in FIG. 4 as well as HR-TEM, EDX, and XPS. FIG. 4A shows that after ABF-dissolution and carbon black support addition, the resulting WC/CB remains as either phase-pure β-WC or α-WC with no silica peaks. Analysis of a β-WC nanopowder (obtained by drying a nanodispersion) post-dissolution by XPS (FIG. 4G) revealed that the carbide nanoparticle surface has undetectable quantities of silica, minimal adventitious surface carbon, and that bulk oxidation was mitigated. Surface oxides are largely unavoidable in ambient conditions but can be removed before catalytic testing by in-situ treatment in hydrogen or by quick alkaline rinses to dissolve surface oxides. Analysis of the β-WC nanopowder by XPS also revealed a carbidic C1s peak, further indication that the nanoparticle surfaces are carbide-terminated.

Figure 4E:
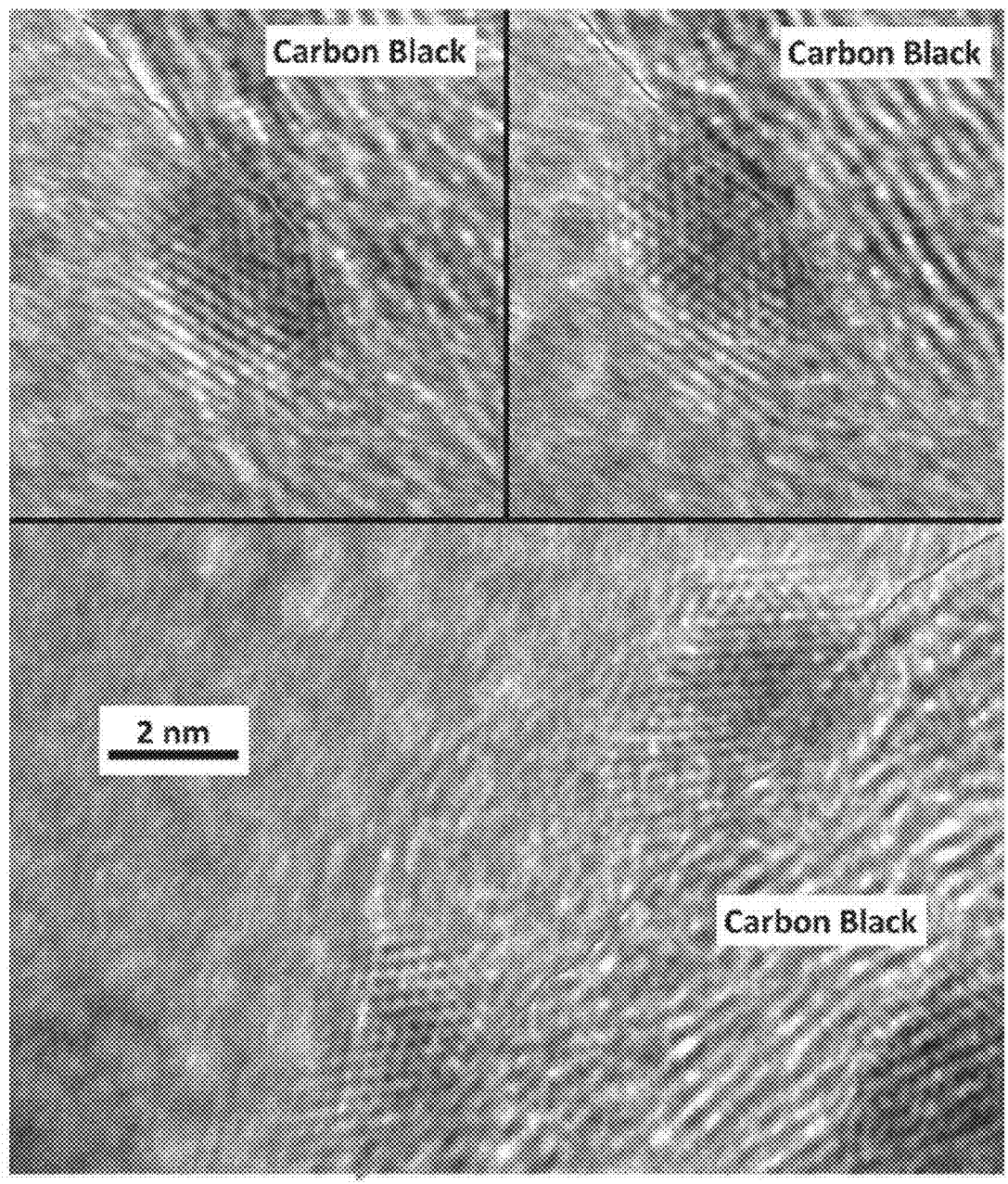
Figure 4F:
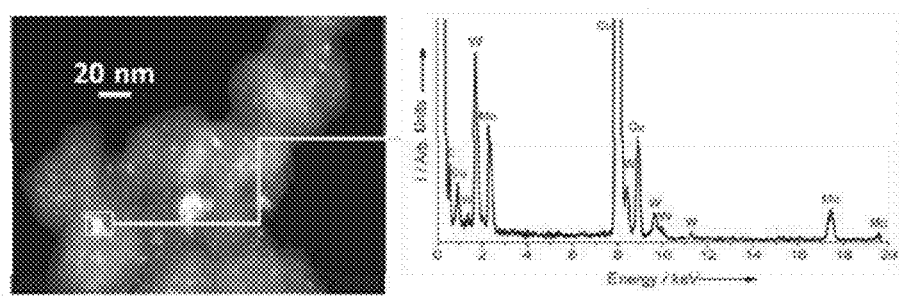
Figure 4G:
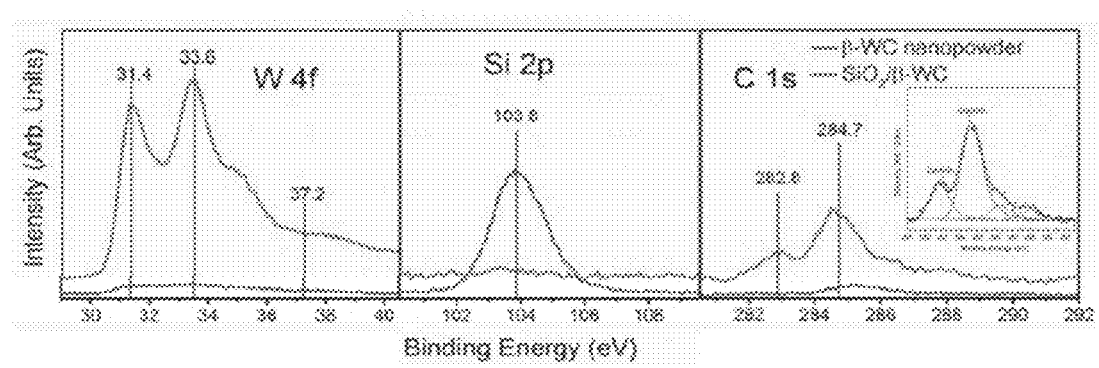
Figure 24:
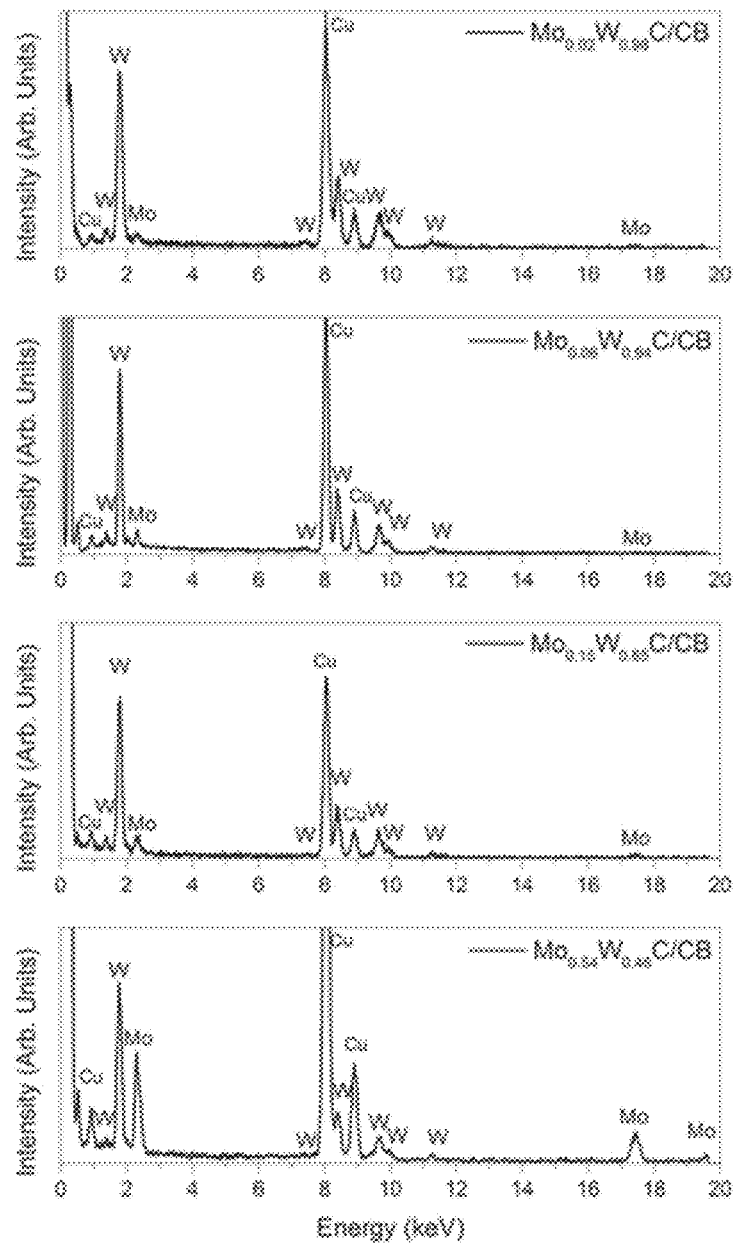
FIG. 24 depicts EDX spectra of various $Mo_xW_{1-x}$C/CB syntheses. The actual ratios of Mo:W within the bimetallic carbide NPs was determined using ICP-AES.

Because the removable ceramic coating method utilizes colloidal RME-based synthetic methods to make transition metal oxide precursor nanoparticles, the method allows for the facile synthesis of heterometallic "double" carbide nanoparticles. Molybdenum tungsten carbide (Mo$_x$W$_{1-x}$C) was used as a probe candidate for the synthesis of double carbides. Mo$_{0.02}$W$_{0.98}$O$_y$ and Mo$_{0.06}$W$_{0.94}$O$_y$ were synthesized by either mixing the appropriate molar ratio of WIPO with molybdenum (V) isopropoxide (MoIPO) before adding to the w/o RME, or sodium tungstate was mixed with sodium molybdate in one w/o reverse microemulsion and subsequently mixed with a second w/o reverse microemulsion containing HCl. The resulting heterometallic transition metal oxides could then be coated directly with silica, carburized, dissolved in ammonium bifluoride, and supported on carbon black in accordance with FIG. 3 to obtain Mo$_x$W$_{1-x}$C/CB (FIGS. 4A and 4E,F). The double carbide formed a β-WC phase. A separate molybdenum carbide (Mo$_2$C) phase was not observed, consistent with the literature for double carbide microparticles with low molybdenum loadings. See Kawamura, G. Tungsten Molybdenum Carbide for Electrocatalytic Oxidation of Methanol. Journal of The Electrochemical Society 134, 1653 (1987), which is incorporated by reference in its entirety. EDX analysis of various $Mo_xW_{1-x}C/CB$ syntheses is shown in FIG. 24.

The electro catalytic activities of the supported and unsupported carbide nanoparticles towards the hydrogen evolution reaction (HER) and methanol electrooxidation (MOR) were compared for bare Vulcan® XC-72r, tungsten carbide prepared using the traditional urea-route, 40 wt % WC/CB, 40 wt % $Mo_{0.06}W_{0.94}C/CB$, and commercial 40 wt % PtRu/CB. The linear sweep voltammograms for HER activity are reported in FIG. 5A.

Previous studies of tungsten carbides for HER and MOR have given mixed results. For MOR, $W_2C$ microparticles and α-WC nanowires were inactive, likely due to surface carbon, while planar, metal-terminated polycrystalline α-WC foils were more active than comparable planar Pt foils. See Weigert, E. C., Stottlemyer, a. L., Zellner, M. B. & Chen, J. G. Tungsten Monocarbide as Potential Replacement of Platinum for Methanol Electrooxidation. Journal of Physical Chemistry C 111, 14617-14620 (2007), which is incorporated by reference in its entirety. For HER, planar tungsten carbide foils are typically over two orders of magnitude less active than Pt foils and exhibit an onset potential of ~−0.11V vs. RHE. In FIG. 5, The HER and MOR electrocatalytic activities of WC/CB and $Mo_{0.06}W_{0.94}C/CB$ materials are compared to commercial WC microparticles, α-WC NPs synthesized using the "urea glass" method, bare Vulcan® XC-72r, and a commercial 40 wt % Pt/CB catalyst (fuelcellstore.com). The HER activities were measured in 0.5M $H_2SO_4$ at room temperature, while the MOR activities were measured in 0.5M $H_2SO_4$ and 2.0M $CH_3OH$ at 40° C. Briefly, catalysts were prepared from an ink consisting of water, Nafion®, and catalyst such that all working electrodes contained 50 μg of catalyst by total weight uniformly dispersed on a 0.071 $cm^2$ glassy carbon disk. This was done to allow for power density comparison across all electrocatalysts. All working electrodes were loaded with the same mass of catalyst on the same geometric surface area because mass activity is a more important parameter to consider for commercial applications than electrochemical active surface area. As shown in the linear sweep voltammograms (LSVs) for each material under HER conditions in FIG. 5A, TMC NPs synthesized with the reverse-microemulsion method achieve substantially higher currents at lower overpotentials when compared to the commercial carbide or the NPs synthesized using the "urea glass" route. Specifically, at an overpotential of 290 mV, α-WC/CB and β-$Mo_{0.06}W_{0.94}C/CB$ exhibit current densities over an order of magnitude in excess of either of the carbide controls, while the current densities were within 1 order of magnitude of the Pt/CB control. The α-WC/CB and β-$Mo_{0.06}W_{0.94}C/CB$ required an overpotential of over 100 mV lower than either of the carbide controls to drive 1 $mA/cm^2$ of current. Higher activity can be attributed to the larger density of active surface sites as a consequence of the dual mitigation of both sintering and surface carbon impurities. The activities and onset potentials with respect to Pt are in agreement with low power density surface science studies for pristine WC thin films compared to Pt films. This can be attributed to the lower onset potential of HER on the WC surface due to its strong hydrogen binding energy. While this is a thermodynamic limitation that is iRHErent to the WC surface, it is largely offset by the substantially lower cost and high global abundance of WC, making it a commercially relevant material for a global hydrogen economy.

FIG. 5B depicts the stability of the WC-based materials after 3000 cycles between −0.3 and +0.6 V vs. RHE in $H_2$-saturated 0.5M $H_2SO_4$ at room temperature. The small loss in activity is attributed to surface oxide formation. However, quick treatments of the materials in 0.1 M NaOH solutions can remove these surface passivation layers, restoring the material's HER activity.

Chronoamperometric responses for each material under MOR conditions at 0.75V vs. RHE are depicted in FIG. 5C. It is observed that after four hours at 0.75 V vs. RHE in 0.5M $H_2SO_4$ and 2 M $CH_3OH$ at 40° C., a 40 wt % α-WC/CB catalyst is over 2.5 orders of magnitude more active than a commercial α-WC catalyst. Specifically, over the last 15 min of the 4 h experiments, the commercial WC micropowder drove an average current of 0.58±0.01 $\mu A/cm^2$, while α-WC/CB drove 235±8 $\mu A/cm^2$ of current. Note that WC NPs synthesized using the "urea route" were inactive, likely due to excessive surface carbon deposition. Remarkably, the activity of the WC/CB material was ca. 33% of that measured for a commercial 40 wt % Pt/CB catalyst (696±6 $\mu A/cm^2$), and approximately one order of magnitude less active than a bifunctional 40 wt % PtRu/CB catalyst (2,850±15). A potential of 0.75 V was chosen to highlight the long-term stability of the carbide nanoparticles even in these strongly oxidizing conditions. Integration of the charge under the chronoamperometric response for the 40 wt % α-WC/CB catalyst indicates that the current is catalytic and cannot be attributed to capacitive discharging or bulk oxidation of WC to $WO_3$. After four hours at 0.75V in 0.5M $H_2SO_4$ at 40° C. without methanol, the average final current for α-WC/CB was 6.0±1.7 $\mu A/cm^2$, which is 2.5% of the current density achieved when methanol is present in the electrolyte. Therefore, these 3-6 nm WC NPs supported on carbon black are both remarkably active and stable electrocatalysts, even in highly acidic media under strongly oxidizing potentials and at elevated temperatures.

The "removable ceramic coating method" presented here offers the ability to synthesize ultrasmall, metal-terminated, non-sintered monometallic and heterometallic transition metal carbides that can be stored as a nanodispersion or dispersed at any desired loading on a support of interest. The method can be extended to manufacture other monometallic and heterometallic carbides, nitrides, phosphides, borides, and sulfides by using the corresponding gaseous reactive precursor.

Materials and Methods

Synthesis of $SiO_2$/WC and $SiO_2/Mo_xW_{1-x}C$ Using Metal Alkoxides/Brij-L4®/Heptane/Water A reverse microemulsion (RME) was prepared by room-temperature mixing of 240 mL of n-heptane with 54 mL of Brij-L4® surfactant followed by 7.8 mL of ultrapure water to obtain a clear and colorless solution. For the synthesis of $WO_x$ nanoparticles (nanoparticles), 12 mL of a 5% w/v tungsten(VI) isopropoxide (WIPO) solution in isopropanol (IPA) was added to 120 mL of n-heptane in a separate flask and mixed at room temperature to form an alkoxide precursor solution. See Xiong, L. & He, T. Synthesis and Characterization of Ultrafine Tungsten and Tungsten Oxide Nanoparticles by a Reverse Microemulsion-Mediated Method. Chemistry of Materials 18, 2211-2218 (2006), which is incorporated by reference in its entirety.

For the synthesis of $Mo_xW_{1-x}O_y$, the appropriate molar ratio of a 5% w/v molybdenum (V) isopropoxide (MoIPO) solution in isopropanol was added to 120 mL of n-heptane already containing an appropriate amount of WIPO necessary to form the alkoxide precursor solution. The MoIPO/WIPO alkoxide solution was then mixed thoroughly.

By means of a cannula, the desired alkoxide precursor solution was transferred to the reverse microemulsion and allowed to hydrolyze by room temperature mixing, over which time the solution remained clear and colorless in the case of $WO_x$ or clear and purple in the case of $Mo_{0.02}W_{0.98}O_y$ or $Mo_{0.06}W_{0.94}O_y$. WIPO-based RMEs were allowed to hydrolyze for four hours while MoIPO/WIPO-based RMEs were allowed to hydrolyze for eight hours. Once an appropriate reaction time had passed, 2.7 mL of reagent-grade ammonium hydroxide (NH$_4$OH, Sigma-Aldrich®, 28-30% NH$_3$ basis) (2 mL of NH$_4$OH for $Mo_xW_yO_z$ syntheses) was added drop-wise to the reverse microemulsion to raise the pH followed by 1.2 mL of reagent-grade tetraethylorthosilicate. Stirring continued over 16.5 hours, during which time the reverse microemulsion would slowly lose transparency, growing cloudy but remaining colorless for $WO_x$ syntheses or slightly purple for $WO_xW_{1-x}O_z$ syntheses.

Figure 6:
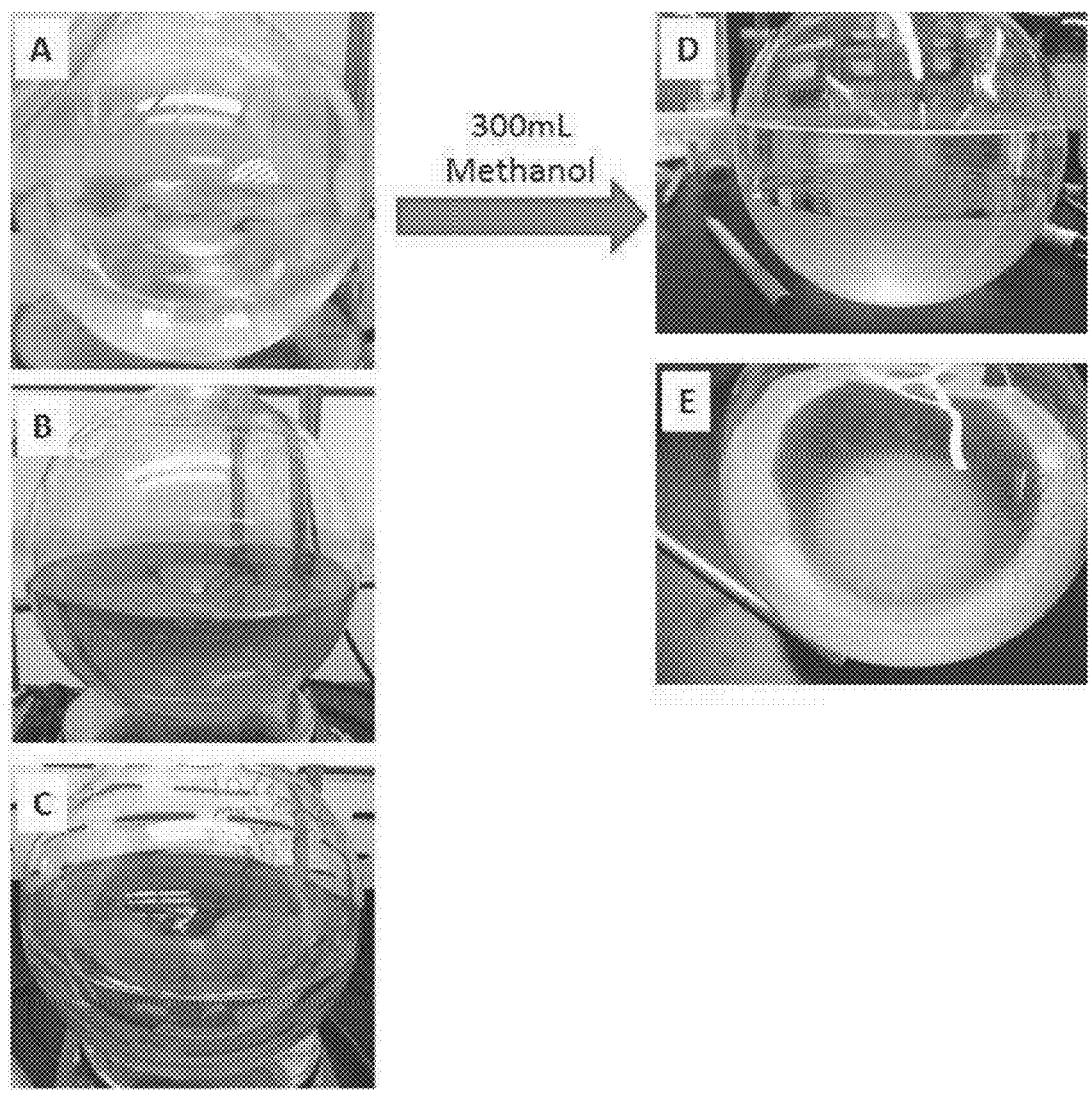
FIGS. 6A-6E are a series of photographs depicting RMEs containing silica-encapsulated transition metal oxide NPs before and after precipitation with methanol.

The silica-encapsulated nanoparticles were then recovered by adding 300 mL of methanol, stirring for 15 minutes, and then allowing the encapsulated nanoparticles to settle over an hour. Addition of methanol would form two distinct liquid phases, an upper heptane-rich phase, and a lower methanol-rich phase that would contain the settling coated nanoparticles. The coated nanoparticles were then rinsed once by fully dispersing in 30 mL of acetone and centrifuging at 6000 rpm for ten minutes. FIG. 6 depicts RMEs containing silica-encapsulated transition metal oxide NPs before and after precipitation with methanol. FIG. 6A is a water/brij/heptane RME containing $WO_x$ NPs encapsulated in silica nanospheres. FIG. 6B is a water/brij/heptane RME containing $Mo_{0.06}W_{0.94}O_y$ NPs encapsulated in silica nanospheres. FIG. 6C is a water/brij/heptane RME containing $Mo_{0.54}W_{0.46}O_y$ NPs encapsulated in silica nanospheres. FIG. 6D is a side-view of the RME from (A) after 300 mL of methanol has been added; note the distinct phase-separation. FIG. 6E is a top-down view of the RME from FIG. 6A after 300 mL of methanol has been added; note the $SiO_2/WO_x$ precipitant settling on the bottom of the flask.

The as-synthesized powders were then allowed to dry overnight before being micronized with a glass rod and calcined at 450° C. for 1 hour under 100 sccm of air using a 2° C./min heating rate. After calcination, XRD analysis indicated the presence of a broad amorphous silica peak, but no tungsten oxide peaks were detected (spectra not shown). FIG. 11D shows a TEM image of the $SiO_2/WO_x$ material synthesized under these conditions. The material could be stored for several weeks after calcination and before carburization with no noticeable changes in the results. However, the as-synthesized $SiO_2/WO_x$ had to be calcined within the first 1-2 days after synthesis or it would later form quartz and mixed-phase carbides (spectra not shown).

Figure 7:
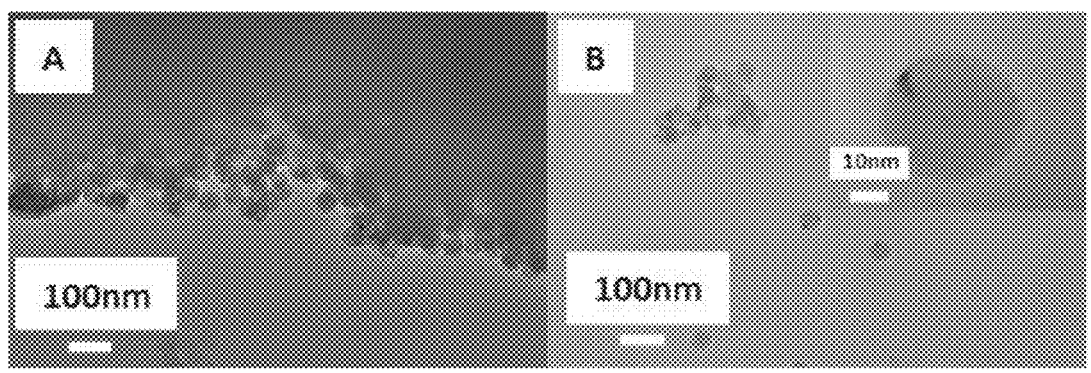
FIGS. 7A-7B are TEM images of the $SiO_2/\beta$-WC material post-carburization.

The material was then reduced at 590° C. for one hour and carburized at 835° C. for four hours under 33 sccm CH$_4$ and 120 sccm H$_2$ using 2° C./min heating rates in a tube furnace. The material was then held under pure H$_2$ at 120 sccm for one hour at 835° C. to scavenge residual surface carbon before being passivated at room temperature under 1% O$_2$/N$_2$ for three hours. After carburization, the materials would be stored in ambient condition anywhere from days to weeks before dissolution in ABF with no noticeable changes in activity. The centerline temperature of the gases in the tube furnace was monitored using an exposed N-type thermocouple (Omega® Corp.) held at the center of the furnace within the quartz tube. The steady-state centerline gas temperatures are reported here. FIG. 7 depicts TEM images of the $SiO_2/\beta$-WC material post-carburization, clearly showing that the ~40 nm silica nanospheres are non-sintered and contain ultrasmall β-WC NPs encapsulated within them with a minority of particles existing as larger NPs on the surface of the silica nanospheres. The $SiO_2/\beta$-WC were synthesized at a pH of 11.1 using a methanol:heptane volumetric precipitation ratio of 0.83. Carburization was performed at 835° C. for four hours in a 21% CH$_4$/H$_2$ atmosphere. FIG. 7A depicts a low-magnification image of the edge of a macroscopic $SiO_2/\beta$-WC powder grain, showing that the primary particle size of the powder are discrete ~40 nm particles. FIG. 7B depicts another low-magnification image of a cluster of ~40 nm particles (the inset shows a high-magnification image that clearly shows the ultrasmall β-WC NPs encapsulated within the ~40 nm silica nanosphere).

Figure 8:
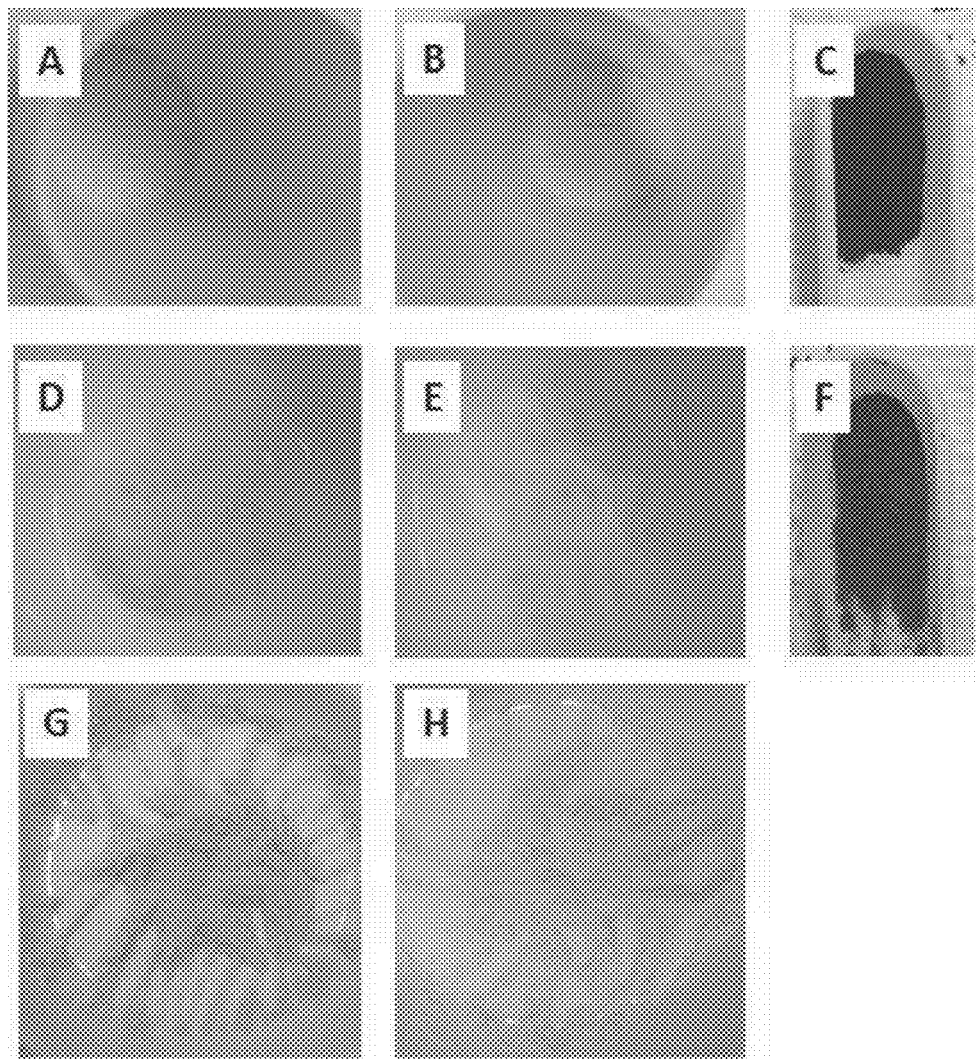
FIGS. 8A-8H are a series of photographs of the powders at various stages in the removable ceramic coating method.

FIG. 8 depicts photographs of the powders at various stages in the "removable ceramic coating method." Post-carburization, the powders were typically dark grey. This color is due the reduced nature of carbide nanoparticles rather than the deposition of graphitic carbon. Directly a carburizing bluish-white $WO_x$ nanopowder also results in a black powder while directly carburizing a white silica powder also results in a white powder post-carburization (images not shown). FIG. 8A depicts as-synthesized $SiO_2/WO_x$ is a fine white powder. FIG. 8B depicts calcined $SiO_2/WO_x$ is a fine light-tan powder. When less NH$_4$OH and TEOS is used in the synthesis to obtain larger PSDs, the $SiO_2/WO_x$ calcined powder becomes a darker tan-brown. FIG. 8C depicts carburized $SiO_2/\beta$-WC is a fine dark-grey powder. FIG. 8D depicts as-synthesized $SiO_2/Mo_{0.06}W_{0.94}O_y$ is a fine light purple powder. FIG. 8E depicts calcined $SiO_2/Mo_{0.06}W_{0.94}O_y$ is a fine white powder. FIG. 8F depicts carburized $SiO_2/\beta$-$Mo_{0.06}W_{0.94}C$ is a medium-grey powder. FIG. 8G shows that as-synthesized $SiO_2/Mo_{0.54}W_{0.46}O_y$ is a fine orange powder while after calcination, it is white. After carburization, it is also dark grey (not shown).

The Effect of Temperature on Carbide Phase-Purity and Silica Stability

FIG. 9 shows the XRD spectra for the material synthesized using the aforementioned conditions after high temperature carburizations at 950° C. and 1000° C. Even at 950° C., the β-WC phase is preferred. Some W$_2$C is also present, which could be due to either the lower porosity of silica at this temperature preventing complete carburization or due to the lower CH$_4$/H$_2$ ratio used for this specific study. Notably, the silica maintains a broad amorphous peak centered at 2θ=22. Carbide NP sintering was largely mitigated at 950° C. while the silica nanospheres were evidently sintered (images not shown). The powder was also much more difficult to disperse than the powder obtained after carburization at 835° C. At 1000° C., the amorphous silica transitions to quartz. The silica nanospheres were no longer discrete but part of a continuous silica matrix. The carbide NPs were also more sintered and consisted of an α-WC+ W$_2$C mixture. The W$_2$C can be the result of incomplete carburization of interior tungsten NPs due to the lack of porosity in crystalline quartz. The macroscopic powder can also be cracked and difficult to disperse post-carburization.

The Effect of Precipitating Solvent on the Carbide Phase-Purity and Silica Stability Studies were done to examine the effects of precipitating $SiO_2/WO_x$ or $SiO_2/Mo_xW_{1-x}O_y$ in different solvents and the pH of the water nanodomains during the coating process. FIG. 10 depicts the XRD spectra if the material is precipitated in 300 mL of methanol (A), acetone (B), or isopropanol (C). All materials were rinsed with acetone. Phase separation of the RME is not observed with acetone or isopropanol, and the silica-encapsulated NPs settle more rapidly. All materials in these studies were calcined at 450° C., reduced for one hour at 590° C., and carburized for four hours at 835° C. in a 21% $CH_4/H_2$ atmosphere. One can clearly see that the silica has formed quartz and the tungsten is incompletely carburized and in a three-phase mixture of α-WC, $W_2C$, and α-W for syntheses in which either acetone or isopropanol have been used to precipitate the RME. For these syntheses, the silica shells were sintered together with extensive sintering observed for the nanoparticles (images not shown). Notably, the $SiO_2/WO_x$ ~40 nm nanospheres were also much more compact post-synthesis whereas the nanospheres from syntheses precipitated in methanol are discrete and separated (images not shown).

Figure 11:
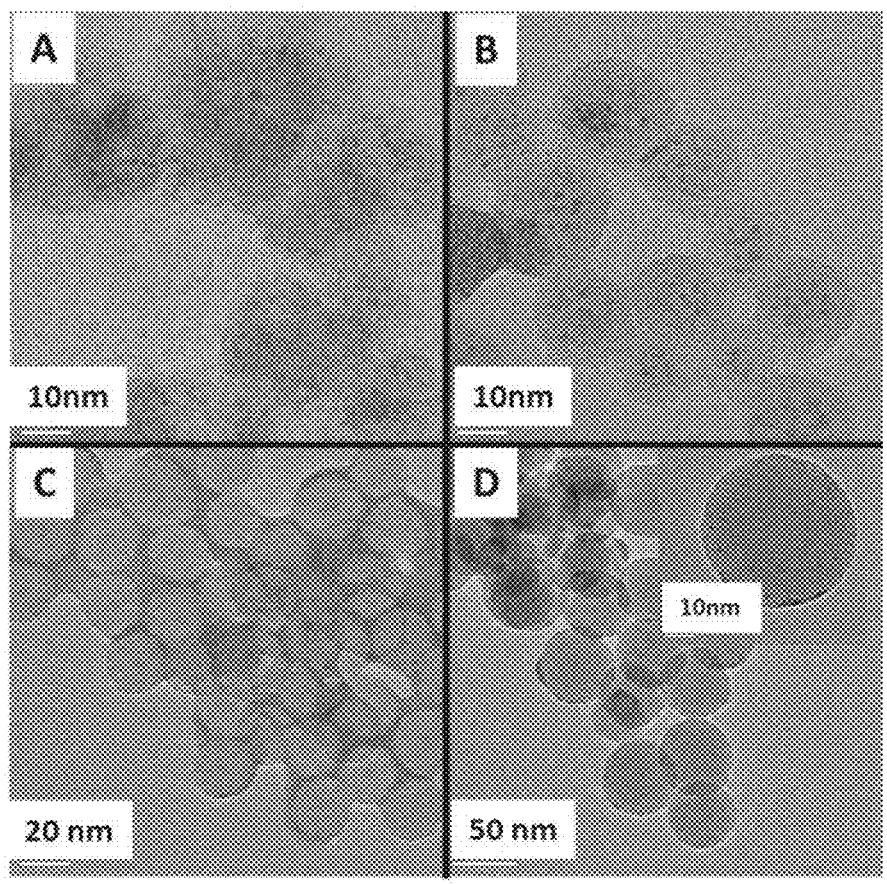
FIGS. 11A-11D are a series of TEM images of $SiO_2/WO_x$ obtained at pH values (calculated) of 10.0 (FIG. 11A), 10.5 (FIG. 11B), 10.9 (FIG. 11C), and 11.1 (FIG. 11D).

The Effect of Coating pH on the $SiO_2/WO_x$ Nanostructure, Carbide Phase-Purity, and Silica Stability The pH of the water nanodomains was adjusted by adding ammonium hydroxide after formation of the transition metal oxide nanoparticles. Hydrolysis of tetraethylorthosilicate to form the $SiO_2$ nanospheres is base-catalyzed. The pH was not measured but rather calculated based on the moisture loading in the reverse microemulsion system and the amount of $NH_4OH$ added. FIG. 11 shows a series of TEM images of $SiO_2/WO_x$ obtained at pH values (calculated) of (A) 10.0, (B) 10.5, (C) 10.9, and (D) 11.1 (inset shows a close-up of a $SiO_2/WO_x$ particle).

A pH of 11.1 was obtained by slow injection of 2.7 mL of $NH_4OH$ solution while pH values of 10.9, 10.5, and 10 were obtained by slow injection of 1.4 mL $NH_4OH$, 0.6 mL $NH_4OH$, and 0.16 mL $NH_4OH$, respectively. All syntheses were injected with 0.6 mL TEOS with the exception of the syntheses at pH 11.1, which were injected with 1.2 mL TEOS. All syntheses were also allowed to stir for 16.5 hours before being precipitated with 300 mL of methanol. It was determined that coating at pH 10 did not produce silica nanospheres but rather large aggregates of $WO_x$ NPs dispersed throughout a continuous silica matrix, as shown in FIG. 11A. At a pH of 10.5, discrete ~15 nm silica nanospheres can be seen with $WO_x$ NPs encased inside. The coating process occurs more slowly at lower pH values and thus these powders contained a much higher ratio of W:Si and were more prone to sintering. At a pH of 10.9 and 11.1, the silica nanospheres are larger (~25 nm and ~40 nm, respectively), and the $WO_x$ NPs are much more disperse within the nanospheres. If $WO_x$ NPs are calcined directly, a black powder is obtained, indicative of $WO_2$. If the NPs are coated at a pH exceeding 11 within silica nanospheres, a light tan powder is obtained. If the NPs are coated at a lower pH, the W:Si ratio is much higher and a darker tan-brown powder is obtained after calcination (images not shown).

Figure 12:
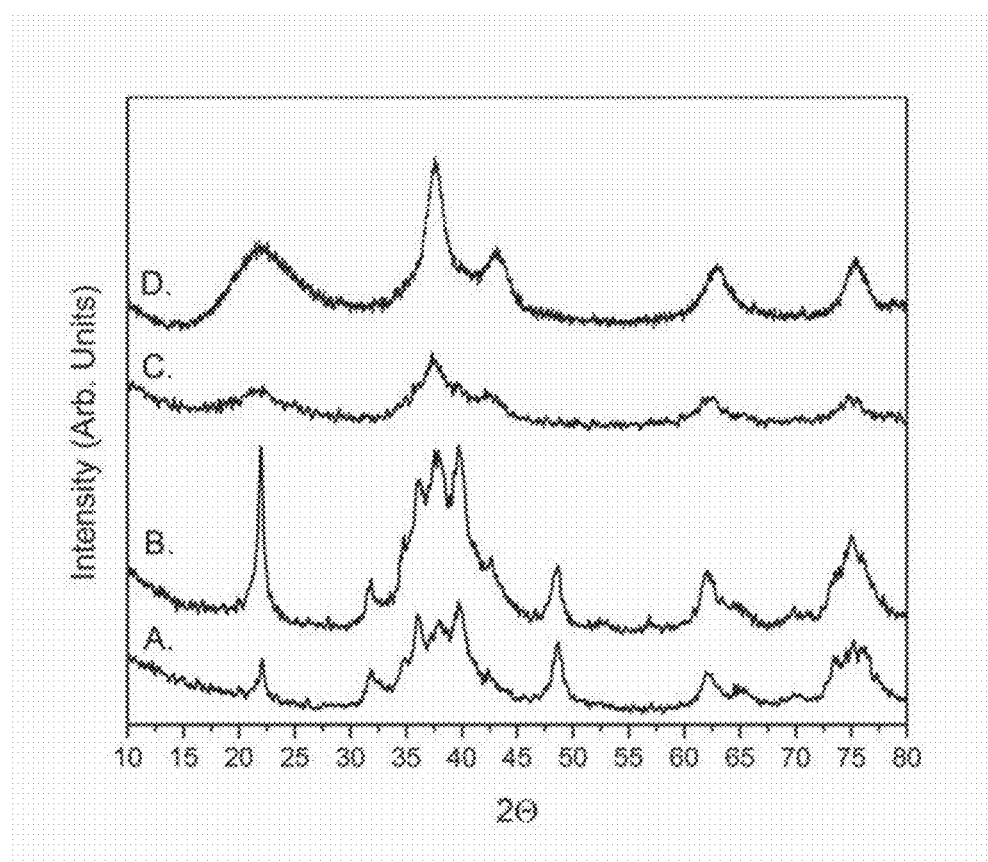
FIG. 12 is a series of post-carburization PXRD spectra of the various $SiO_2$/WC materials coated at different pH values during synthesis. Carburizations were conducted at 835° C. for 4 h under 21% $CH_4/H_2$ and are shown for materials coated using a pH of (A) 10, (B) 10.5, (C) 10.9, and (D) 11.1.

The materials from FIG. 11 were calcined at 450° C. for one hour, reduced at 590° C. for one hour, and carburized at 835° C. for four hours under a 21% $CH_4/H_2$ atmosphere. The resulting XRD spectra of the various $SiO_2/WO_x$ materials are shown in FIG. 12 where it can be seen that at low pH values, quartz forms in addition to a α-WC+$W_2C$ NP mixture. These materials were prone to more sintering (images not shown). At higher pH values, β-WC forms, and the NPs were non-sintered.

Control of Carbide Phase-Purity and Carbide NP Particle Size Distribution

Figure 13:
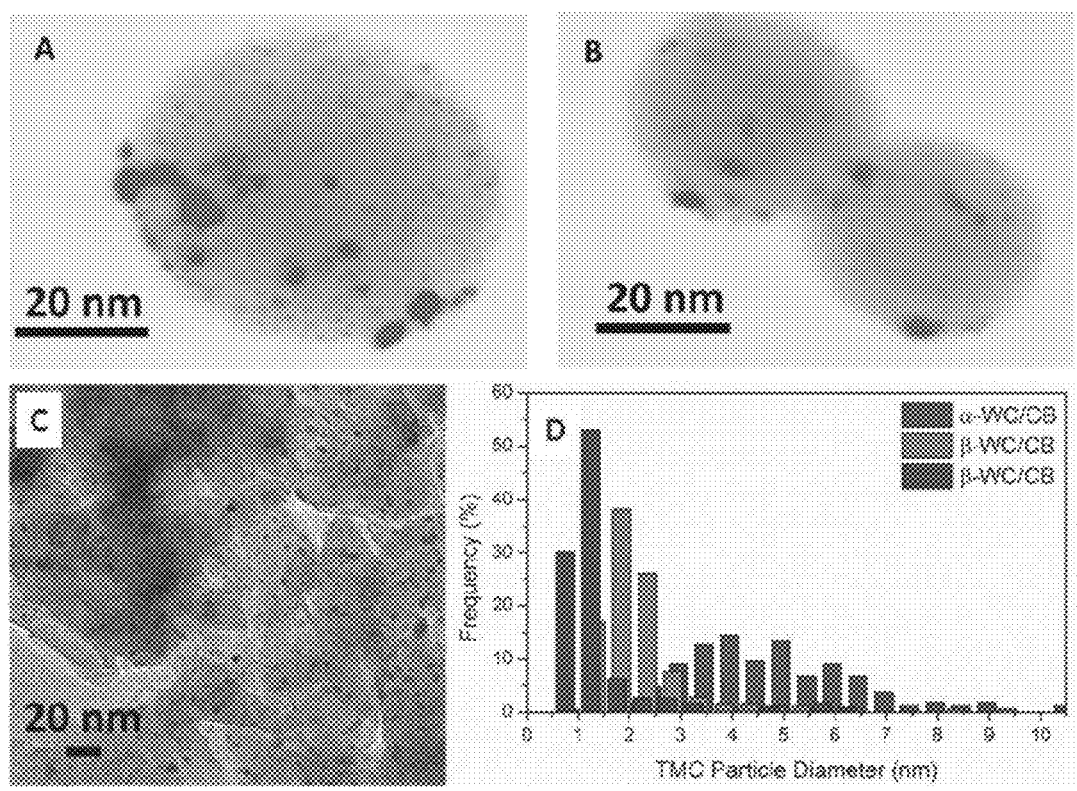
FIGS. 13A-13D depict carbide NPs of various phases and particle size distributions encapsulated in silica matrices.

Different carbide phases and particle sizes could be obtained by adjusting various synthesis parameters. To obtain 0.8-1.5 nm cubic β-carbide NPs, a pH of 11.1 (11 for $Mo_xW_{1-x}C$ syntheses), and the emulsion was precipitated with 300 mL of methanol (a volumetric methanol:heptane ratio of 0.83). If instead, a volumetric ratio of 0.31 was used (i.e. 112 mL of methanol), sintering of both the silica and the carbide NPs would occur, and 3-6 nm hexagonal α-carbide NPs would be obtained. To obtain larger 2-3 nm β-carbide NPs, a pH of 11 was used (10.9 for $Mo_xW_{1-x}C$ syntheses), and the emulsion was precipitated with 300 mL of methanol (a volumetric methanol:heptane ratio of 0.83). The resulting carbides and their corresponding particle size distributions are shown below in FIG. 13.

Figure 14:
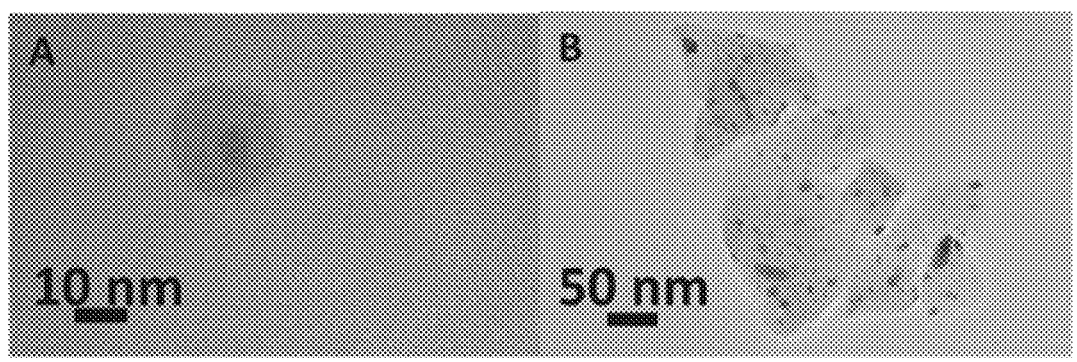
FIGS. 14A-14B are TEM Images of $SiO_2/WO_x$ prepared using WIPO/water/Igepal/heptane (FIG. 14A) and the same material post-carburization (FIG. 14B).
Figure 15:
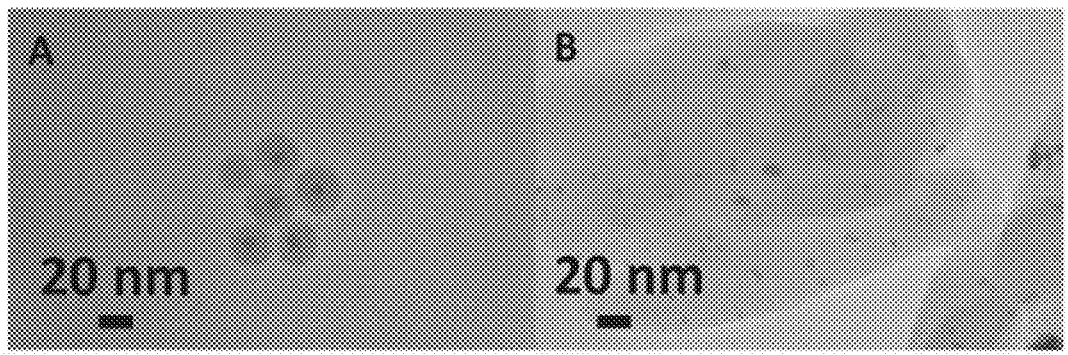
FIGS. 15A-15B are TEM Images of $SiO_2/H_2(Mo_{0.2}W_{0.8})O_4$ synthesized using $Na_2WO_4/Na_2MoO_4$/HCl/water/Igepal/heptane (FIG. 15A) and the same material post-carburization (FIG. 15B)
Figure 16:
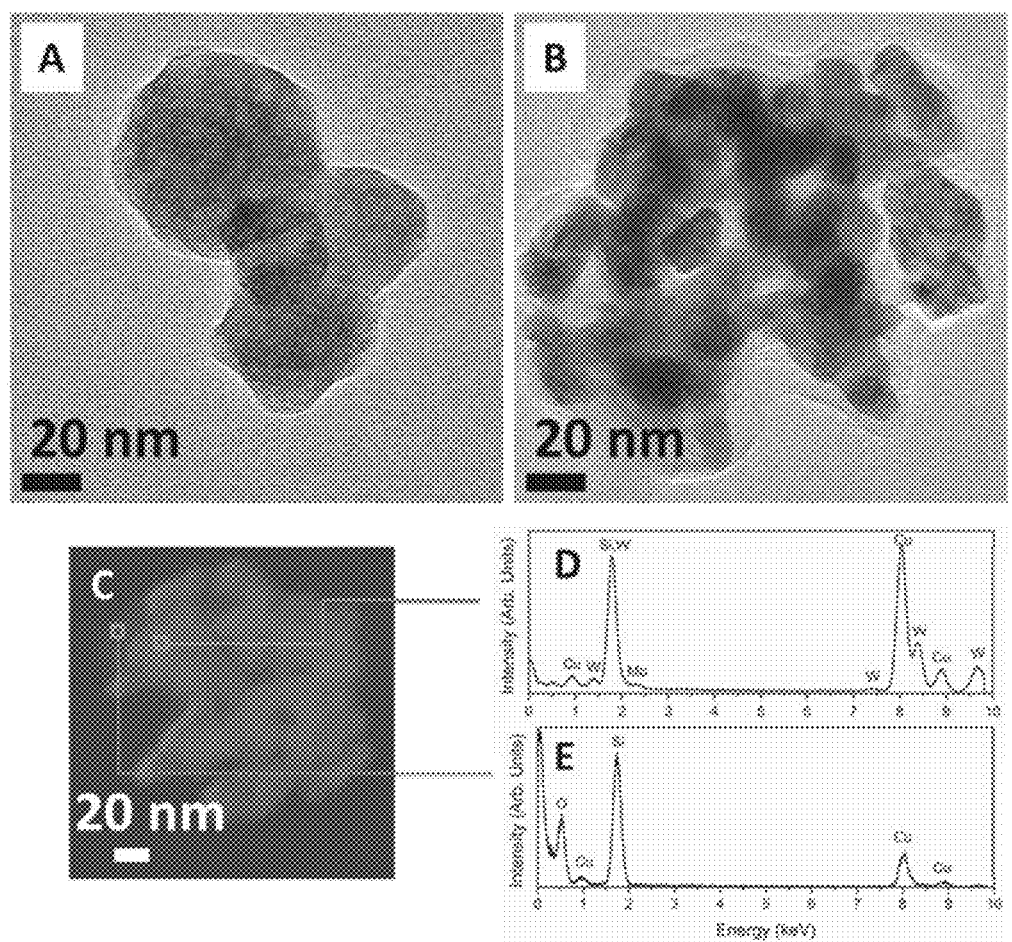
FIGS. 16A-16E depict TEM, STEM, and EDX of calcined and carburized $SiO_2/\alpha$-$Mo_{0.06}W_{0.94}C$.

Synthesis of $SiO_2$/WC and $SiO_2/Mo_xW_{1-x}C$ Using Metal Alkoxides/Igepal CO-520®/Heptane/Water Alternatively to using the nonionic Brij-L4® surfactant, the nonionic Igepal CO-520® surfactant can be used. These syntheses were identical to those using Brij-L4® with the exception that 60 mL of Igepal CO-520® was used instead of 54 mL of Brij-L4® and a pH of 11 was used during the coating. Precipitation with methanol again would form two liquid phases. FIG. 16 shows a typical synthesis after calcination and after carburization for $SiO_2/Mo_{0.2}W_{0.8}C$. Using Igepal, the oxide nanoparticles are larger and singly-coated at the center of each silica nanosphere (FIG. 14). However, after carburization, the nanospheres lose their structure and sinter together. The resulting carbide was a mixed phase α-WC+$W_2C$ (xrd spectra not shown).

Figure 17:
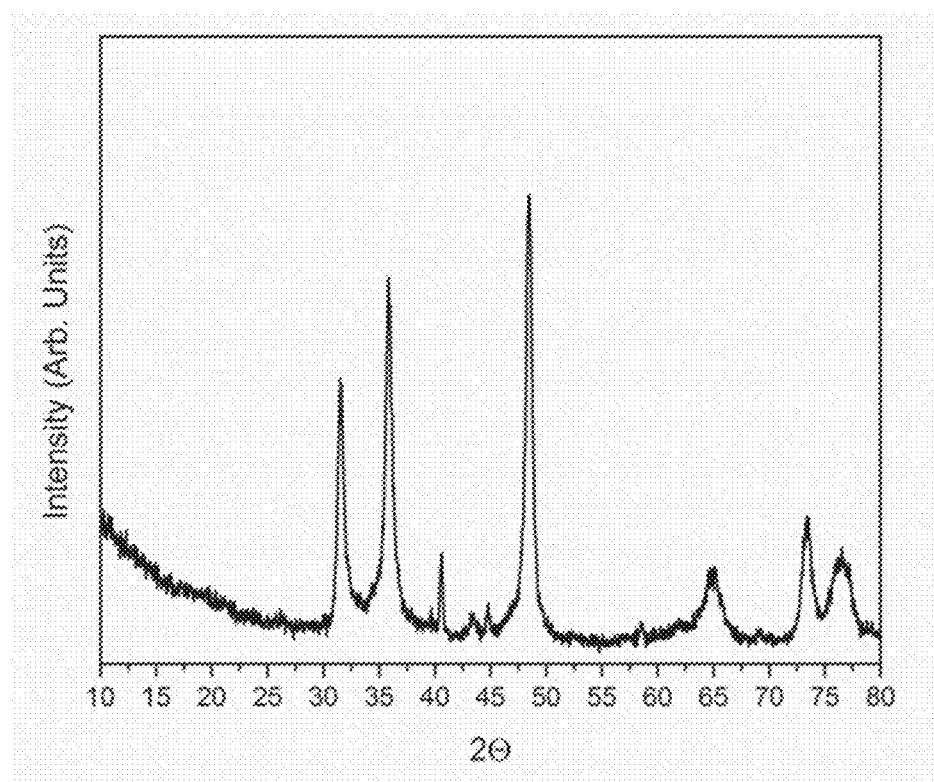
FIG. 17 is a XRD of $SiO_2/\alpha$-$Mo_{0.2}W_{0.8}C$ prepared using $Na_2WO_4/Na_2MoO_4$/HCl/water/Triton/hexanol/heptane.

Synthesis of $SiO_2/H_2WO_4$ and $SiO_2/H_2(Mo_x,W_{1-x})O_4$ Using $Na_2WO_4/Na_2MoO_4$/HCl/Igepal CO-520®/heptane/water and their Subsequent Carburization Alternatively to metal alkoxide autocatalysis in water, the metal oxide nanoparticles could be synthesized using the stoichiometric reaction of metal salts with an acid. See Panda, a. K., Moulik, S. P., Bhowmik, B. B. & Das, a. R. Dispersed Molecular Aggregates. *Journal of colloid and interface science* 235, 218-226 (2001), which is incorporated by reference in its entirety. In a typical synthesis, 6.5 mL of a stock solution of 0.2M HCl in water was added to a flask containing 53 mL of Igepal CO-520® and 300 mL of heptane to form the acid-RME. In a separate flask, 6.5 mL of a stock solution of 0.1M $Na_2WO_4$ in water was added to 53 mL of Igepal CO-520® and 300 mL of heptane to form the transition metal oxide-RME. The transition metal oxide-reverse microemulsion was then added to the acid-reverse microemulsion under continuous stirring over the span of 30 minutes. It was allowed to react for 6-8 hours to form tungstic acid nanoparticles before 1.75 mL of $NH_4OH$ was added followed by 1.2 mL of tetraethylorthosilicate. 16.5 hours later, it was precipitated with methanol. To make the heterometallic molybdenum tungstic acid nanoparticles, a stock solution containing 0.8M $Na_2WO_4$ and 0.2M $Na_2MoO_4$ mixed together was used to form the transition metal oxide-RME. FIG. 17 shows a typical result for $SiO_2/H_2(Mo_{0.2}W_{0.8})O_4$ calcined and carburized to $SiO_2/Mo_{0.2}W_{0.8}C$. Again, extensive sintering of the silica nanospheres was observed after carburization. Silica is undetectable by XRD because it is in such small quantities but was detectable by EDX and TEM in FIG. 16.

Synthesis of $SiO_2/H_2WO_4$ and $SiO_2/H_2(Mo_x,W_{1-x})O_4$ Using $Na_2WO_4/Na_2MoO_4$/HCl/Triton X-100®/1-Heptane/Water and their Subsequent Carburization Triton X-100® is a more hydrophilic surfactant that requires a co-surfactant to solubilize it in the oil phase. The co-surfactant used in these studies was 1-hexanol. The double reverse microemulsion method was again used, with RMEs prepared by adding 70 mL of 1-hexanol to 200 mL of heptane followed by 55 mL of Triton X-100®. 3 mL of the aforementioned stock solutions were mixed with 3 mL of water and injected into the RMEs rapidly to form the transition metal oxide-reverse microemulsion and the acid-RME. The transition metal oxide-reverse microemulsion was then added continuously to the acid-reverse microemulsion over a span of 30 minutes and allowed to react for 6-8 hours. The transition metal oxide-reverse microemulsion would slowly grow cloudy for these syntheses. Next, 0.34 mL of NH$_4$OH and 0.34 mL of tetraethylorthosilicate was added and allowed to react for 16.5 hours. These samples were notable for containing a high wt % of W or Mo relative to Si. They were dark brown after calcination and had extreme structural rearrangement on carburization as shown in FIG. 16. While the synthesis resulted in large ~50 nm spheres of hybrid Si and W/Mo, the resulting carburized material resulted in ~20 nm carbide nanoparticles coated in ~8 nm of silica. The segregation of the silica from the carbide was confirmed using EDX (FIG. 16). EDX was also used to confirm the presence of both W and Mo. The XRD is shown in FIG. 17 confirming that the material is carbidic and predominantly in an α hexagonal lattice. Neither an amorphous silica nor quartz peak is apparent, possibly due to the low loading of silica.

Synthesis of SiO$_2$/WO$_x$ Using WIPO/Citric Acid/Alcohol/Water in a Sol-Gel Method Sol-Gel methods are more scalable than RME methods at the expense of less precise control over the resulting nanostructures. In the Sol-Gel method, there is no continuous phase of heptane and no surfactant such as Brij-L4®. Instead of the hydrolysis being controlled using discrete nano-sized water domains, citric acid is used as a chelating agent/hydrolysis modifier. The continuous phase used is an alcohol, and much lower relative amounts of water are used in the synthesis. This also means that the total volume of liquid needed for the synthesis is reduced since heptane is no longer needed.

Figure 32:
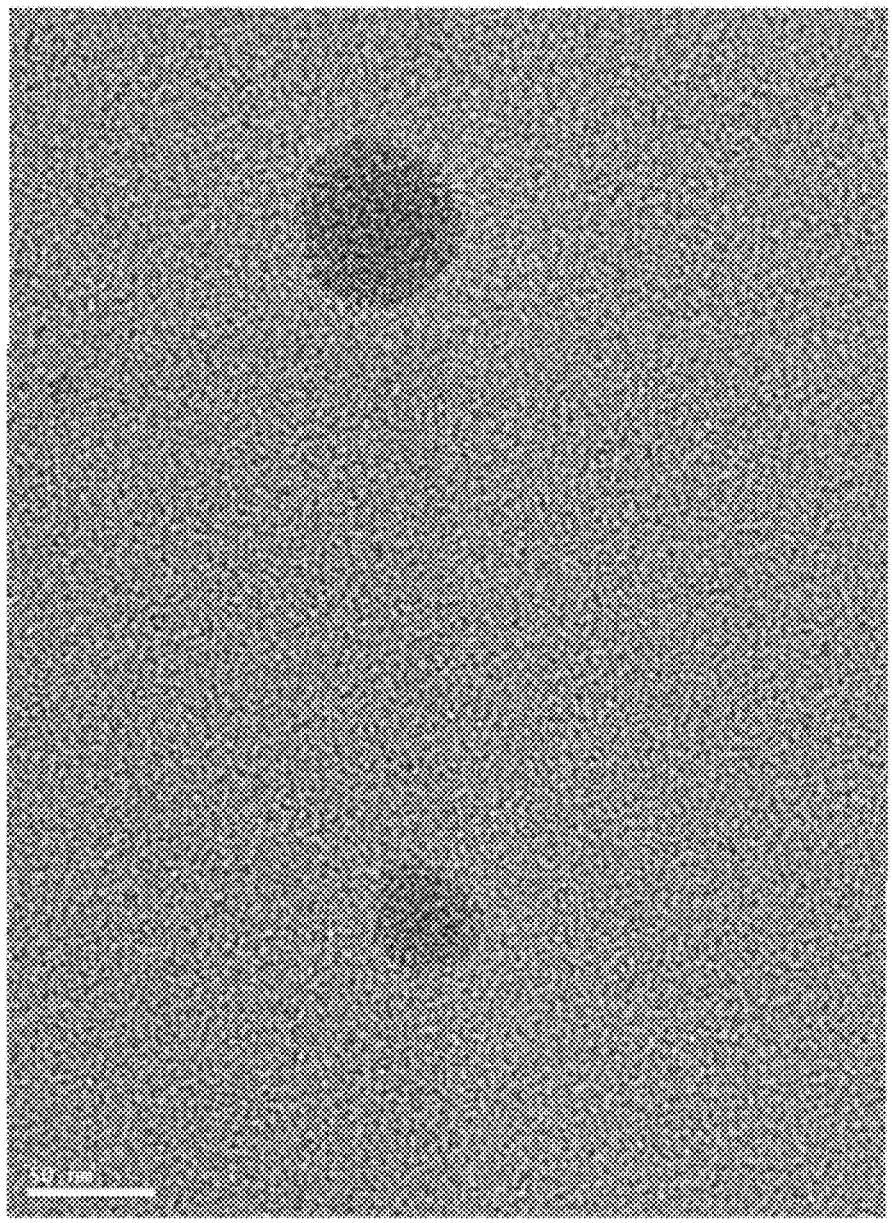
FIG. 32 depicts TEM images of $SiO_2$/$WO_x$ prepared using a citric acid/alcohol/water/WIPO Sol-Gel method

In a typical synthesis, 6 mL of 5% w/v WIPO is diluted with 14 mL of isopropanol, methanol, or ethanol. If water were added to this system, bulk hydrolysis occurs and WO$_x$ gels out of solution as a precipitant, rather than stays suspended as nanoparticles in a "sol." To prevent this, citric acid is first added to the WIPO/alcohol mixture in a molar ratio of at least 1:1 [citric acid]:[WIPO]. Ratios of 2:1 were used in this example. The citric acid is then dissolved via sonication or mechanical stirring. To the WIPO/alcohol/citric acid mixture, a second mixture of alcohol/water is added dropwise, slowly. The molar ratio of water to WIPO (or some other metal alkoxide) must be above the stoichiometric ratio. Typically a 3 fold stoichiometric excess of water is added. NH$_4$OH can also be added as a catalyst to accelerate hydrolysis or higher temperatures above room temperature can be used. In this example, 120 μL of DI water and 60 μL of reagent grade NH$_4$OH solution were diluted in 30 mL of alcohol and the resulting mixture was slowly added dropwise to the WIPO/citric acid/alcohol mixture. After 6 hours of reaction time, TEOS was then added and the mixture was allowed to hydrolyze overnight, during which time it slowly lost clarity. The final SiO$_2$/WO$_x$ NPs could be collected by centrifugation or by salting out, which promotes flocculation and subsequent sedimentation. FIG. 32 depicts TEM images of the composite SiO$_2$/WO$_x$ materials prepared using this method. The resulting composite material can then be carburized and the silica shells removed using ABF or hot alkaline treatments.

Dissolution of SiO$_2$/WC Using a Hot Alkaline Treatment

While tungsten carbide and Mo$_x$W$_{1-x}$C are both soluble in alkaline conditions, this dissolution procedure is facile, inexpensive, solution-processable, and applicable to other systems where the nanoparticles that are encased in silica are stable in caustic conditions but not in ABF. When dispersed in 0.5M NaOH for 12 hours at 80° C., the initially black suspension becomes optically clear and pale yellow. Addition of methanol to an aliquot of the clear solution would induce precipitation of white flocs while the supernatant remained yellow. This was interpreted to be silica flocs while the yellow supernatant was caused by the presence of WO$_4^{2-}$. A study was performed by doing a controlled dissolution in 0.1M NaOH at 40° C. TEM images were taken at various time intervals, which show uniform dissolution of the nanospheres from the surface to the center as being the primary mode of dissolution, further indication that the silica nanospheres are non-sintered post-carburization. This is shown in FIG. 18. For larger nanoparticles, such as those prepared using Triton X-100®/hexanol or using less silica were stable in 0.3M NaOH at 50° C. for at least 24 hours. If the sample developed a quartz-like character, it was not possible to remove the silica using the alkaline treatments attempted at present. Such alkaline dissolutions could be amenable to TMCs that are stable in alkaline conditions, such as TiC and TaC.

Dissolution of SiO$_2$/WC and SiO$_2$/Mo$_x$W$_{1-x}$C in Aqueous Ammonium Bifluoride It was found that both tungsten carbide and Mo$_x$W$_{1-x}$C in either hexagonal or cubic phases were stable in aqueous ammonium bifluoride solutions for extended times. Ammonium bifluoride was chosen because it is an inexpensive industrial glass etchant and can readily remove both amorphous silica and quartz readily in a solution-processable manner at room temperature. In a typical dissolution, 0.2 g of SiO$_2$/WC or SiO$_2$/Mo$_x$W$_{1-x}$C was added to 21 mL of DI water in a polypropylene container with a Teflon magnetic stirbar. If it was desired to support on carbon black, an appropriate mass of acidified-carbon black (acidified to ~pH 5 using 6M HCl and rinsing with DI water) was added to the solution. Carbon black was not added if it was desired to obtain a nanodispersion or if it was desired to support on a material that is not stable in ammonium bifluoride such as alumina. Finally, ~5.25 grams of ammonium bifluoride was added to make a 20 wt % ammonium bifluoride solution. Such a large excess of ABF solution was used to obtain good dispersion of the NPs on the CB support. Without sonication, the material would naturally disperse to form a black suspension. The silica was fully removed with overnight stirring at room temperature, although STEM and EDX analysis of an aliquot showed the silica to be fully removed after just 2 hours (images not shown). On the opposite extreme, a black suspension was maintained even after 20 hours in 30 wt % ammonium bifluoride at 40° C. (images not shown).

After a sufficient time had passed, the nanodispersion was neutralized with ~5.5 mL of NH$_4$OH to a pH of 7 (caution: moderately exothermic reaction). At this point, the nanodispersion, WC/CB, or Mo$_x$W$_{1-x}$C/CB was obtained by centrifugation at 6000 rpm for 10 minutes. Alternatively, an appropriate amount of alumina could be added to the neutralized nanodispersion and stirred for 12 hours to obtain WC/Al$_2$O$_3$ (images not shown) before centrifuging. Once recovered, the material was rinsed twice with water. With each successive rinse, the nanodispersion became more difficult to recover by centrifugation possibly due to the decreasing solution ionic strength driving flocculation, eventually requiring 10,000 rpm or more for 30 minutes. A tungsten carbide nanodispersion dispersed in water at ~7.5 mg/mL is shown in FIG. 19 after initially dispersing it and after three weeks of sitting in stagnant conditions. No settling was observed. While all carbide nanodispersions prepared were dark grey and nearly black, dispersing commercial WC or WC NPs prepared using the "urea route" (see Giordano, C., Erpen, C., Yao, W. & Antonietti, M. Synthesis of Mo and W carbide and nitride nanoparticles via a simple "urea glass" route. *Nano letters* 8, 4659-63 (2008), which is incorporated by reference in its entirety) were always light-medium grey (images not shown).

Catalyst Ink Preparation and Electrochemistry

All catalyst inks were prepared by dispersing 7.5 mg of catalyst in 1 mL of degassed ethanol using sonication. While sonicating, 20 μL of 5% Nafion® 117 solution (Sigma-Aldrich®) was added dropwise as a binding agent. Next, 7 μL of ink was dropped onto a 3 mm diameter glassy carbon disk electrode (CH Instruments) using a 3 mm diameter Teflon template to ensure a working electrode geometric surface area of 0.071 cm². The electrode was then dried for 1 hour in an argon atmosphere under vacuum before transferring to an electrochemical cell (CH Instruments) containing a Pt wire counterelectrode (CH Instruments) and a 1M Ag/AgCl reference electrode (CH Instruments). 10 mL of aqueous 0.5M $H_2SO_4$ was used for hydrogen evolution reaction (HER) studies while 10 mL of aqueous 0.5M $H_2SO_4$ and 2M methanol was used for methanol electrooxidation (MOR) studies. For all studies, these 10 mL aliquots were taken from the same stock solution and degassed for 30 minutes with argon (for MOR) or hydrogen (for HER).

Catalyst Loading Determination or WC/CB and $Mo_xW_{1-x}C$/CB Using TGA-XRD Method and ICP-AES Two techniques were used to determine the catalysts loadings: Inductively Coupled Plasma-Atomic Emission Spectroscopy (ICP-AES) and thermogravimetric analysis (TGA) coupled with powder X-ray Diffraction (XRD). ICP-AES was used to determine the loading of elemental W within the silica nanospheres, whereas TGA-XRD was used to determine the wt % loadings of WC/CB and indirectly the loading of WC within the silica nanospheres through calculation. ICP-AES was also used to compute the exact compositions of the $Mo_xW_{1-x}C$ bimetallic carbides.

To determine the loading of W within the silica-encapsulated carbides, calcined $SiO_2/WO_x$ was instead used because it is easier to dissolve. Ostensibly, there is no loss of W on transforming $WO_x$ to WC during the carburization process. The calcined $SiO_2/WO_x$ powder was dissolved by dripping 48% HF solution onto the powder and letting the $SiF_4$ evaporate over 4 h. The $WO_x$ also dissolved and was redispersed in 3 wt % nitric acid solution and diluted to various ppm concentrations for ICP-AES analysis. A 5 point calibration curve was performed using a W ICP standard. It was determined that the wt % loading of elemental W within the $SiO_2/WO_x$ material is 20.5 wt % (W basis) for the optimal method presented used to make 1-3 nm β-WC NPs.

To determine the loadings of the $Mo_xW_{1-x}C$ bimetallic carbides, the carbides were dissolved in a 1:1 mixture of 48% HF and reagent grade nitric acid. The carbides do not readily dissolve in 48% HF even after several days. The addition of reagent grade nitric acid dissolves the carbides within a half hour, obtaining a clear and pale yellow solution. The solvent was then evaporated over 4 h and the solution was redispersed in 3 wt % nitric acid and diluted to various ppm concentrations for ICP-AES analysis. Five point calibration curves for a W ICP standard and an Mo ICP standard were used. The standards were used to first ensure that the selected elemental lines for each element did not have a large background signal from the presence of the other element.

To determine the approximate loading of the carbide NPs on the carbon black support and within the silica nanospheres, a combination of thermogravimetric analysis (TGA) and XRD was used. XRD spectra were taken before and after TGA. TGA was performed using 5° C./min heating until 800° C. under 90 sccm of air and 10 sccm of $N_2$. As the catalyst is heated, the carbon black support combusts to $CO_2$, and WC is oxidized to $WO_3$. After TGA, a greenish-yellow powder remains, indicative of $WO_3$, that was then analyzed by XRD to confirm phase-pure $WO_3$. The mass loss during the TGA was then corrected for the mass gain of all the WC being oxidized to $WO_3$. For instance, in Fig. S21 the final mass was 29.15% of the original mass, and the resulting powder was phase-pure green $WO_3$. The molar mass of β-WC is 195.85 g/mol while the molar mass of $WO_3$ is 231.84 g/mol. Thus, the actual wt % loading of β-WC on the original CB support is (195.85/231.84)*29.15% or roughly 25 wt % β-WC on CB. By then back-calculating the mass of CB and mass of $SiO_2$/β-WC added at the start of the ABF dissolution, the wt % loading of WC within the silica nanospheres was found to be ~13 wt % (W basis). This is 7.5 wt % lower than the weight percent determined using ICP-AES and represents a 66% yield throughout the dissolution process for adhering β-WC onto the carbon black support.

X-Ray Photoelectron Spectroscopy (XPS) Analysis of Catalyst Powders

XPS was performed by drying the carbide nanodispersions under vacuum in an argon atmosphere. They were then mounted on copper tape in an argon glovebox and transferred to the XPS side-chamber with less than 30 s of ambient exposure. XPS spectra were collected using a PHI Versaprobe II equipped with a multichannel hemispherical analyzer and a monochromatic aluminum anode X-ray source operating at 100 W with a 100 μm beam scanned over a 1.4 mm line across the sample surface. A dual-beam charge neutralization system was used with an electron neutralizer bias of 1.2 eV and an argon ion beam energy of 10 eV. A standard charge correction was applied to the adventitious C 1s signal to 284.7 eV.

Catalyst Surface Area Determination Using BET

Figure 22:
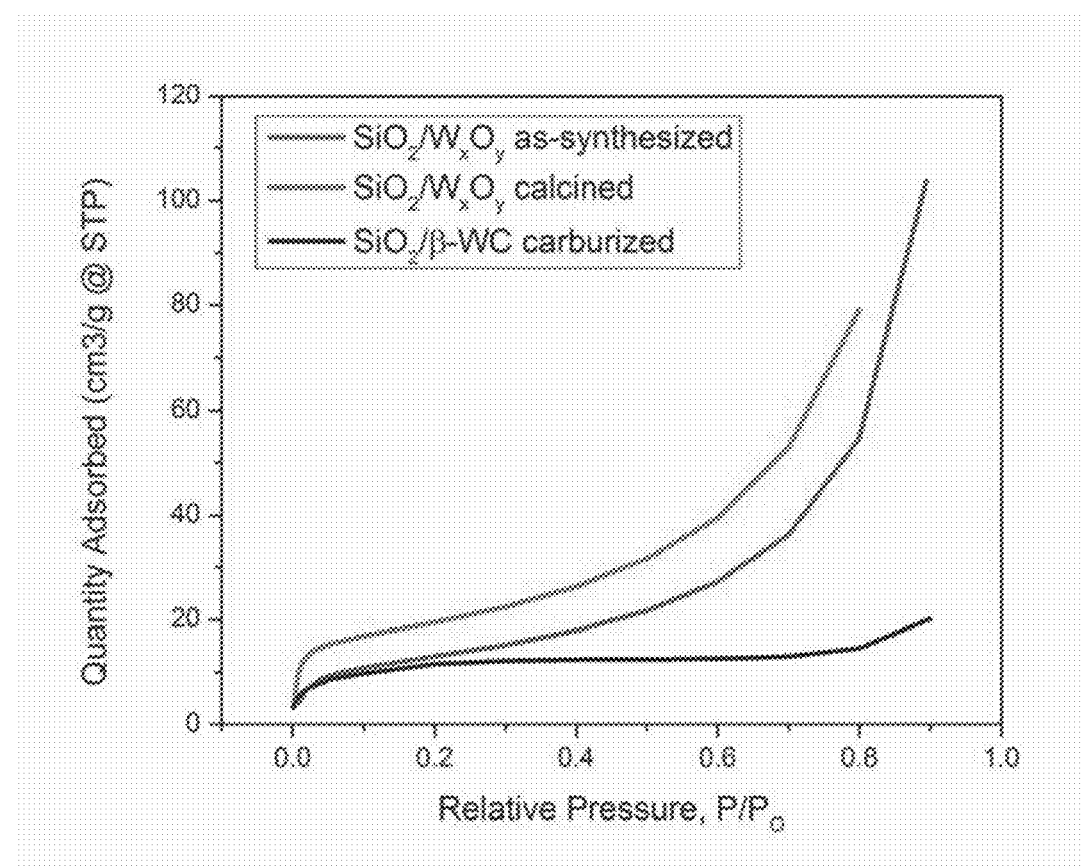
FIG. 22 shows BET nitrogen adsorption isotherms during various stages of the "removable ceramic coating" method.
Figure 23:
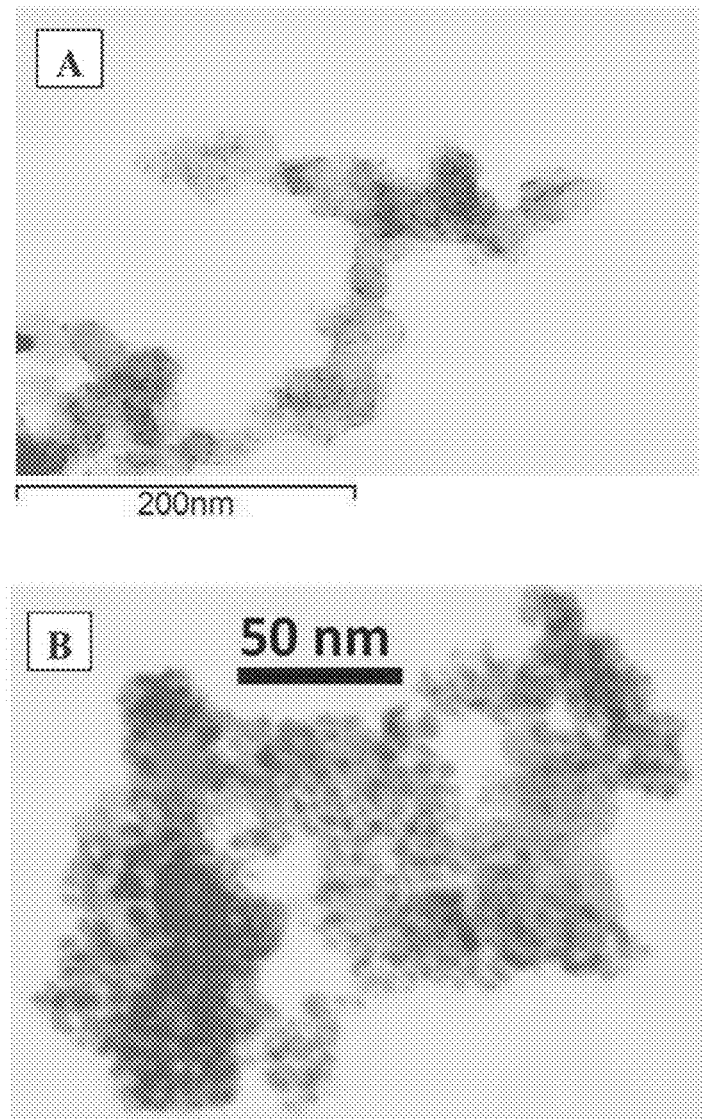
FIGS. 23A-23B depict a wide-view STEM image of (A) 25 wt % 1-2 nm $\beta$-WC/CB and (B) STEM image of a $\beta$-WC nanopowder.

Catalyst surface areas were analyzed using a Quantachrome® BET evaluated under liquid nitrogen conditions and using $N_2$ as the adsorbing species. BET was used to probe micropore generation and collapse during the removable ceramic coating process as shown in FIG. 22, which depicts the BET adsorption isotherms of as-synthesized $SiO_2/W_xO_y$, calcined (450° C.) $SiO_2/W_xO_y$, and carburized (835° C.) $SiO_2$/β-WC. It is seen that the calcined material has the highest micropore volume, likely due to the calcination of the pore-blocking surfactants in the as-synthesized material. The carburized material has the lowest microporosity, which is expected due to the high temperatures required to carburize the material, which results in densification of the amorphous silica matrix. Likely, carburization occurs before and during collapse of the calcined micropores. This is especially the case for the synthesis of α-carbides, which results in the eventual formation of low-microporosity quartz domains. Once supported on carbon black, the surface areas were also determined using BET and are reported below in Table 1.

TABLE 1

BET Surface Areas

| Catalyst | BET Surface Area (m²/g) |
|---|---|
| 40 wt % Pt/C, commercial | 126 |
| 40 wt % α-WC/CB, "rcc" method | 90 |
| 40 wt % β-$Mo_{0.06}W_{0.94}C$/CB, "rcc" method | 160 |
| Acidified Vulcan ® XC-72r | 250 |

Catalyst Ink and Working Electrode Preparation

All catalyst inks were prepared by dispersing 7.5 mg of catalyst in 1 mL of degassed ultrapure water using sonication. While sonicating, 20 μL of 5% Nafion® 117 solution (Sigma-Aldrich®) was added dropwise as a binding agent. Next, 7 μL of ink was dropped onto a 3 mm diameter glassy carbon disk electrode (CH Instruments) to obtain a working electrode geometric surface area of 0.071 cm$^2$. Using this protocol, the catalyst loadings were also controlled by mass such that all working electrodes contained ~50 μg of catalyst by total weight. The electrode was then dried for 1 hour in an argon atmosphere under vacuum. Before mounting the catalyst ink onto the glassy carbon electrode, the glassy carbon was polished to a mirror finish with 0.05 μm alumina powder (BASi, Inc.), wiped with lens paper, and rinsed thoroughly with ultrapure water. To prevent any possibility of cross-contamination, a separate glassy carbon working electrode was used for the 40 wt % Pt/CB catalyst. Carbide-containing catalysts were never mounted on this working electrode.

Electrochemical Setup and Protocols

A standard ~12 mL glass electrochemical cell (CH Instruments) containing a Pt wire counter electrode (CH Instruments) and a 1M KCl Ag/AgCl reference electrode (CH Instruments) with a Teflon cap was used for all experiments. The glass electrochemical cell was etched with reagent-grade sulfuric acid before experiments and rinsed thoroughly with ultrapure DI water. 10 mL of aqueous 0.5M H$_2$SO$_4$ was used for the hydrogen evolution reaction (HER) studies while 10 mL of aqueous 0.5M H$_2$SO$_4$ and 2M methanol was used for methanol electrooxidation (MOR) studies. For all studies, these 10 mL aliquots were taken from the same stock solution and degassed for 30 minutes with ultra-high purity (Grade 5) argon (for MOR studies) or Grade 5 hydrogen (for HER studies) using a Teflon bubbler prior to loading the cell with the electrodes. A continuous Ar or H$_2$ purge at 75 mL/min was used throughout the course of all experiments. A freshly-etched and thoroughly rinsed electrochemical cell and fresh electrolyte was used for the Pt/CB control to prevent any cross-contamination.

Capacitances of the Catalysts

Figure 25A:
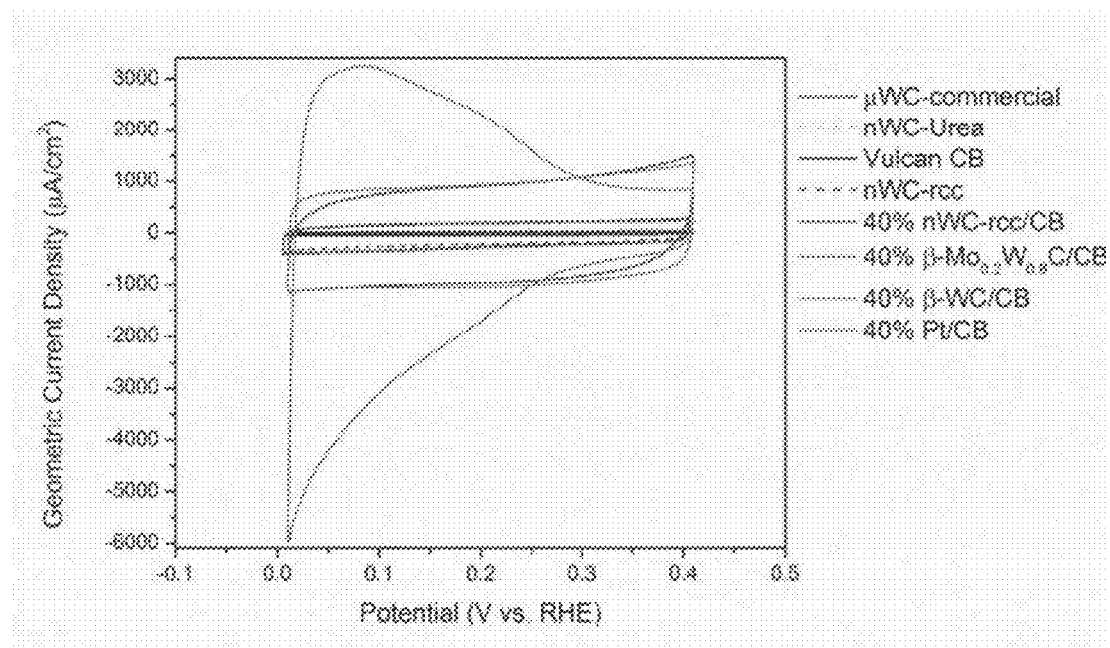
FIGS. 25A-25B are graphs depicting capacitances of the various catalysts in room-temperature, argon-saturated 0.5M $H_2SO_4$.
Figure 25B:
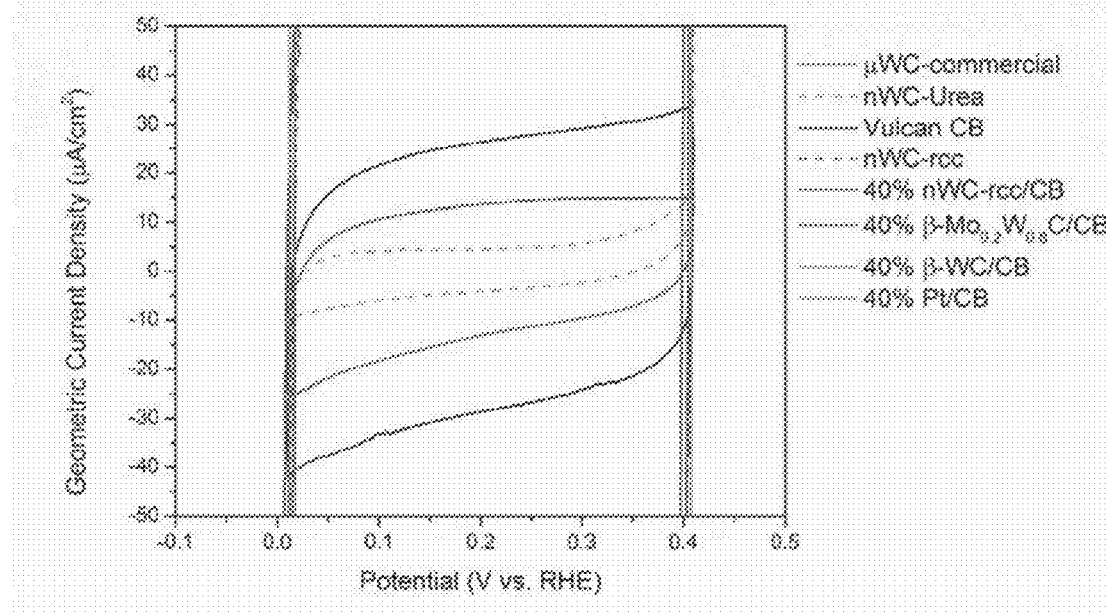

Once the working electrode was loaded, it underwent twenty cycles using cyclic voltammetry (CV) between 0 and 0.4 V vs. RHE at 50 mV/s to condition the electrode and remove any surface contaminants. Conditioning scans can provide insights into the capacitance of the electrodes and the relative electrochemical active surface areas. The twentieth scan for each catalyst in room-temperature 0.5M H$_2$SO$_4$ is shown in FIG. 25A. while a zoomed-in version is shown in 22B to depict the characteristic scans of materials with lower capacitances.

Hydrogen Evolution Reaction Activity and Stability Comparison

The HER has been well-studied for carbide catalysts, and in 0.5M H$_2$SO$_4$, it occurs at potentials in which the carbides are non-passivated and are highly stable. See, Weidman, M. C., Esposito, D. V., Hsu, I. J. & Chen, J. G. Electrochemical Stability of Tungsten and Tungsten Monocarbide (WC) Over Wide pH and Potential Ranges. *Journal of The Electrochemical Society* 157, F179 (2010), and Esposito, D. V et al. Low-cost hydrogen-evolution catalysts based on monolayer platinum on tungsten monocarbide substrates. *Angewandte Chemie (International ed. in English)* 49, 9859-62 (2010), each of which is incorporated by reference in its entirety. After an initial LSV scan, the overpotential ($\eta_{i=-1}$) required to drive 1 mA/cm$^2$ of cathodic current was determined using chronopotentiometry (CP). Afterwards, the initial current density ($i_{\eta=290}$) at a fixed potential of −0.29V vs. RHE was found using chronoamperometry (CA). For the carbide materials produced using the "removable ceramic coating method" as well as the Pt control catalyst, this potential was in the mass-transfer limited regime of HER operation. The results from these HER activity studies are included below in Table 2.

TABLE 2

HER activity comparison in room-temperature, H$_2$-saturated 0.5M H$_2$SO$_4$ using chronoamperometry and chronopotentiometry

| Catalyst[a] | Initial j[b] $j_{\eta-290\,mV}$* [mA cm$^{-2}$] | Initial η[c] $\eta_i$ @ $j_{Cat-1}$ [mV] | Final η[d] $\eta_f$ @ $j_{Cat-1}$ [mV] | Regenerated η[e] $\eta_r$ @ $j_{Cat-1}$ [mV] |
|---|---|---|---|---|
| Pt/CB | −150 | 44 | 44 | — |
| β-Mo$_{0.06}$W$_{0.94}$C/CB | −27 | 156 | 166 | 161 |
| α-WC/CB | −21 | 165 | 175 | 165 |
| Commercial WC | −1.0 | 290 | 311 | 281 |
| WC-Urea/CB | −1.3 | 280 | — | — |
| WC-Urea | −1.1 | 270 | — | — |
| Vulcan CB | −0.1 | 360 | — | — |

Figure 31:
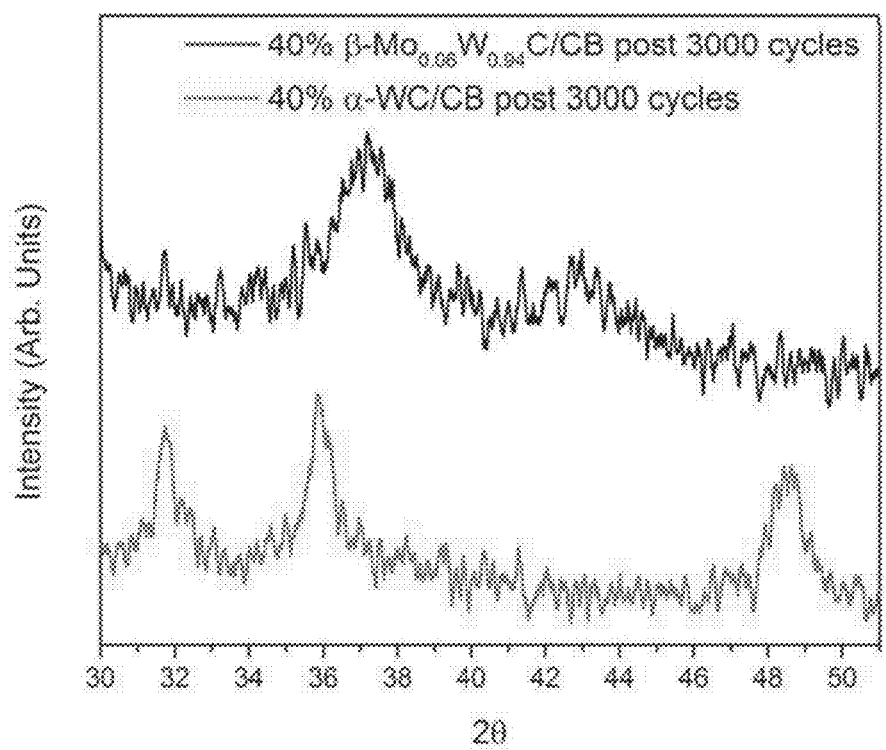
FIG. 31 depicts XRD spectra of 50 μg of 40 wt % β-$Mo_{0.06}W_{0.94}$C/CB and 40 wt % α-WC/CB after 3000 HER cycles from −0.3 to +0.6 V vs. RHE and subsequent regeneration through dipping in 0.1 M NaOH (noise due to small size of powder material analyzed).

Stability was studied by comparing LSV scans before and after 3000 CV cycles between −0.3 and +0.6 V vs. RHE (FIG. 5B). Both supported carbide materials exhibited minimal deactivation and could be regenerated by dipping the electrodes for one minute in 0.1 M NaOH solution to remove surface passivation oxides. FIG. 31 depicts PXRDs after 3000 cycles and regeneration show that the fcc and hexagonal phases of the two carbide materials are preserved.

Methanol Electrooxidation

Figure 26A:
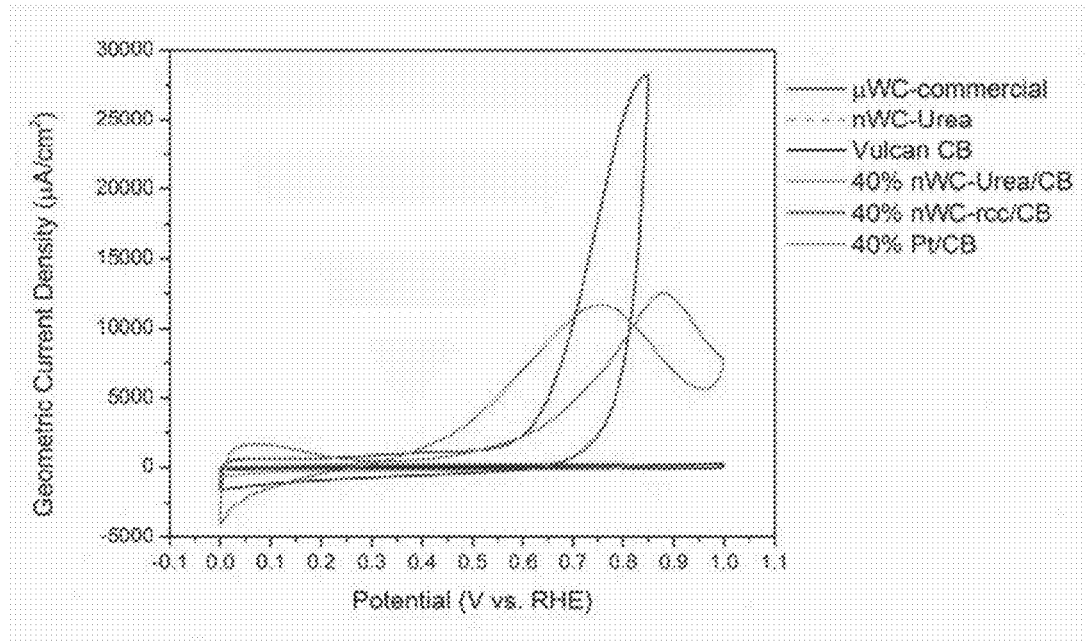
FIGS. 26A-26B are graphs depicting CV scans at 50 mV/s in an aqueous electrolyte consisting of 2M methanol and 0.5M $H_2SO_4$ at 40° C.
Figure 26B:
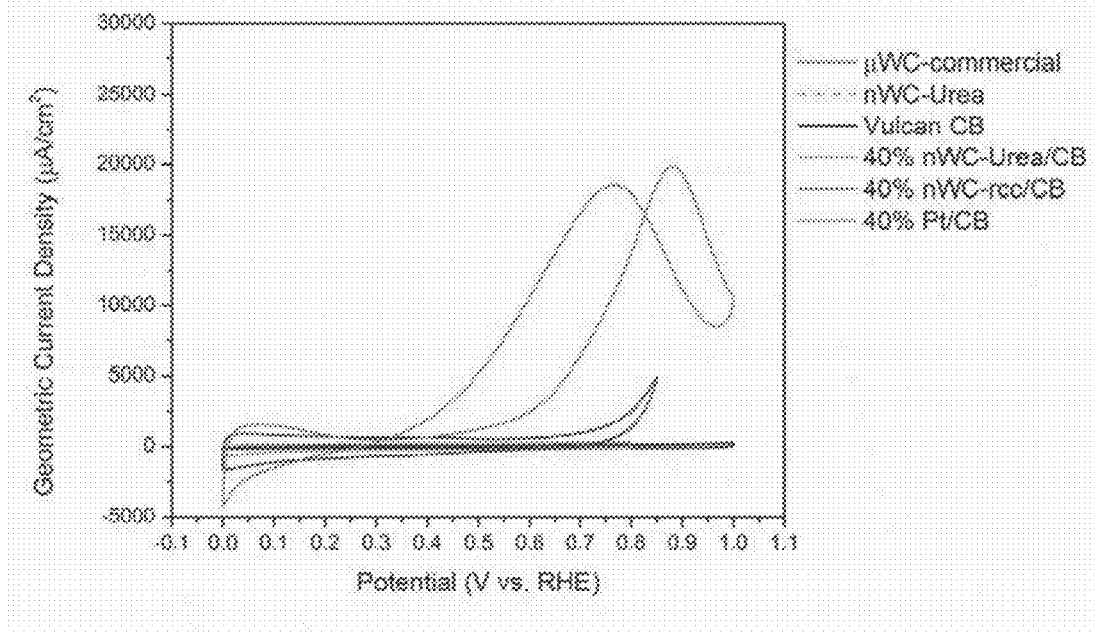
Figure 27A:
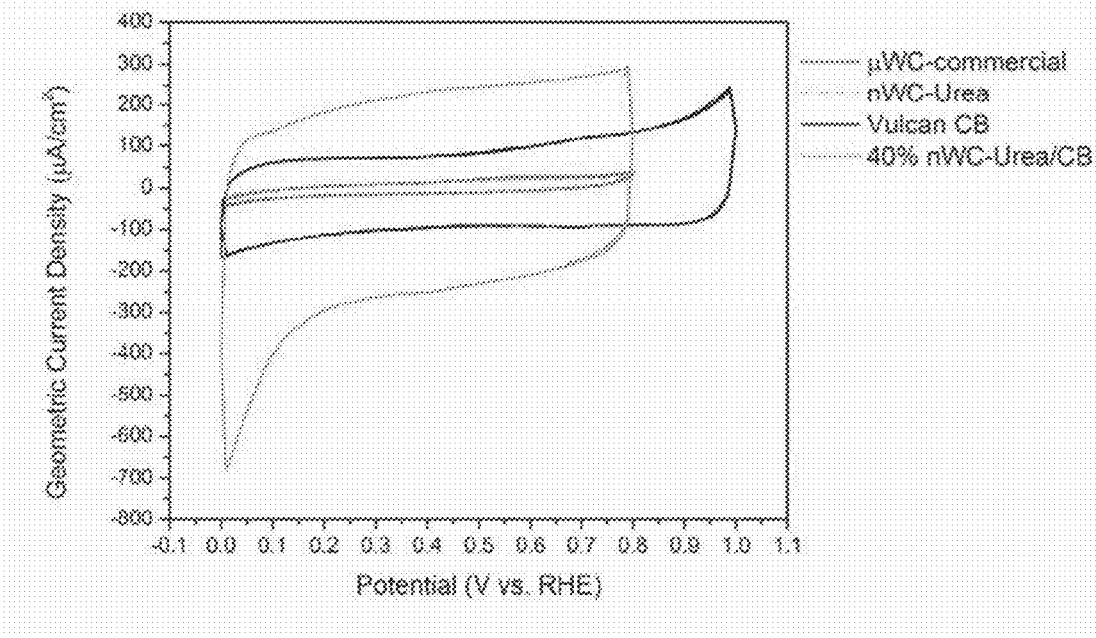
FIGS. 27A-27B are graphs depicting initial CV scans for the lower-activity materials at appropriate scales.
Figure 27B:
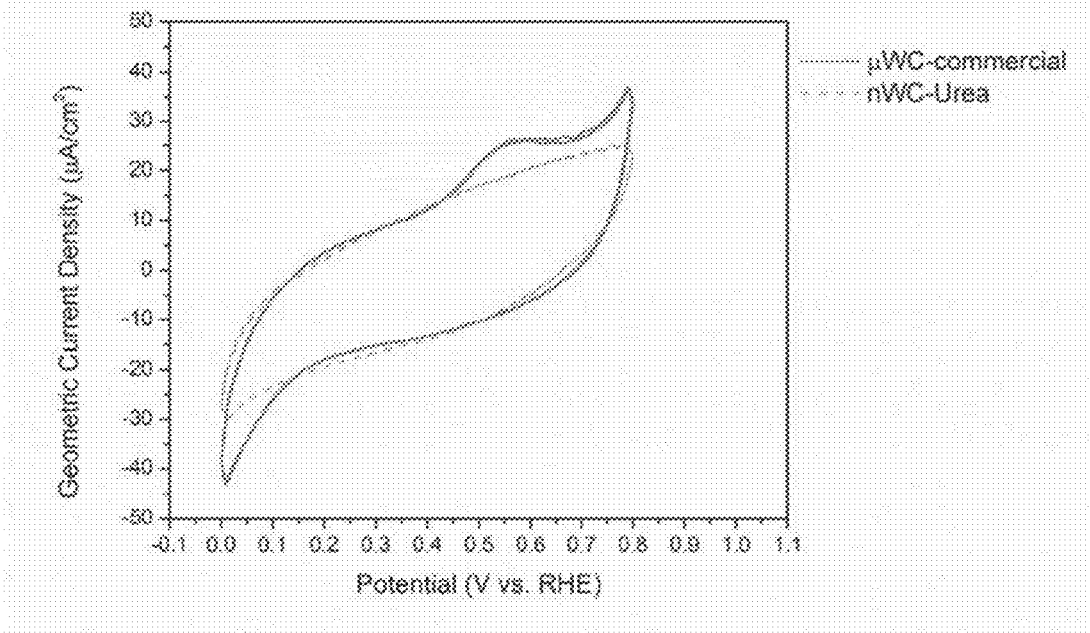
Figure 28:
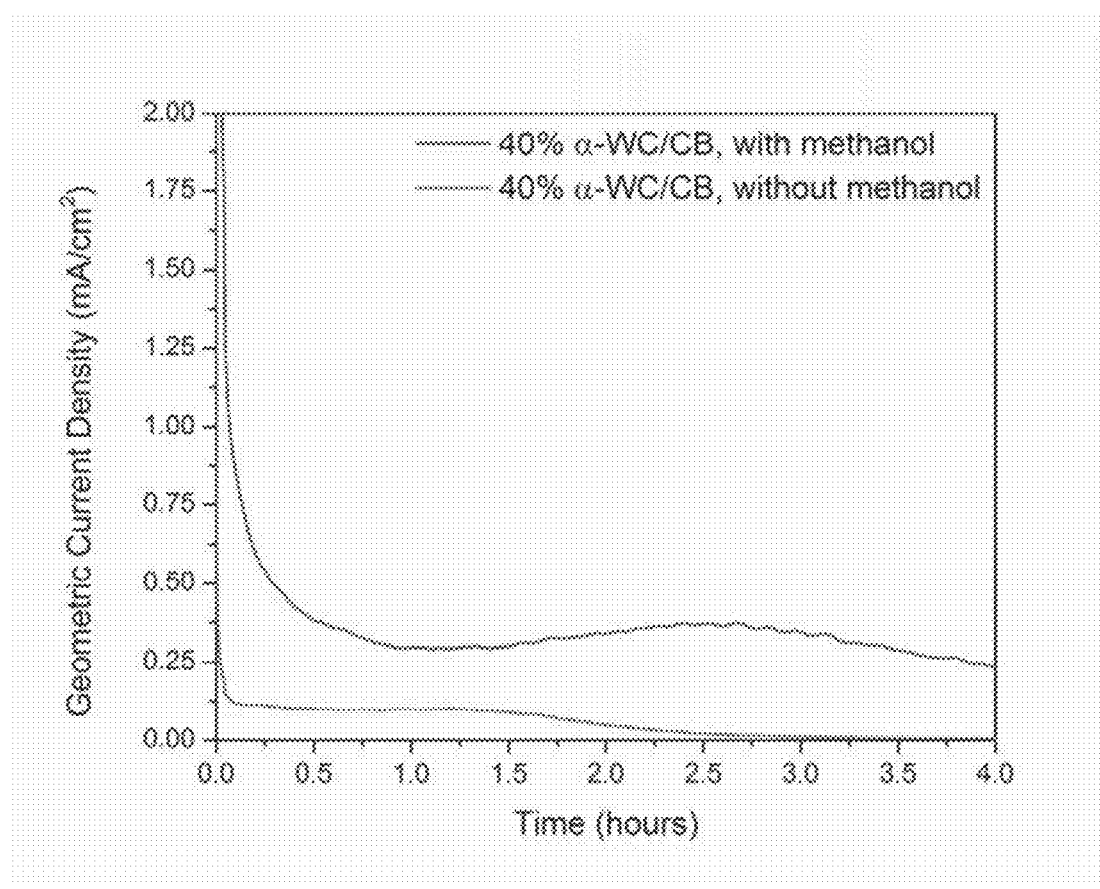
FIG. 28 is a graph depicting extended CA scans for 40 wt % α-WC/CB made using the removable ceramic coating method in the presence of methanol (blue) and without methanol (red).
Figure 29:
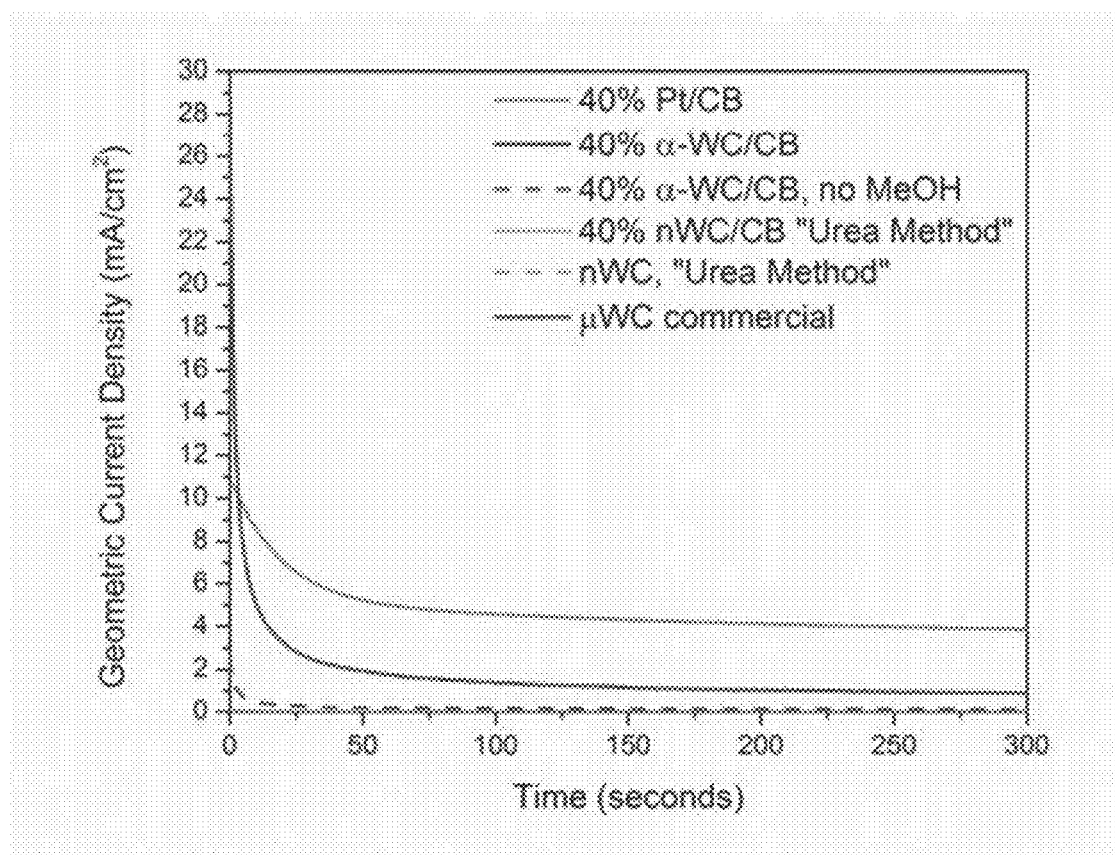
FIG. 29 depicts CA scans over the first 5 min performed in aqueous 2 M methanol and 0.5 M $H_2SO_4$ at 40° C. held potentiostatically at +0.75 V vs. RHE, with the exception of "40% α-WC/CB, no MeOH," which was held potentiostatically at +0.75 V vs. RHE in 0.5 M $H_2SO_4$ at 40° C. without the presence of methanol.

To mimic operating conditions in a direct methanol fuel cell, methanol electrooxidation was studied in a mixture of aqueous 2M methanol and 0.5M sulfuric acid at 40° C. The temperature reported is the temperature of the electrolyte measured using an analogue thermometer in the vicinity of the working electrode-electrolyte interface at steady state. FIG. 26A depicts initial CV scans of the various catalysts in 2M methanol and 0.5M H$_2$SO$_4$ at 40° C. while FIG. 26B depicts the twentieth cycle. FIG. 27A and FIG. 27B depict initial CV scans for the lower-activity materials at appropriate scales. It can be seen that the commercial carbide material has a distinct hump whereas those prepared using the "urea route" do not. FIG. 28 shows the activity of 40 wt % α-WC/CB made the removable ceramic coating method in (blue) aqueous 2M methanol and 0.5M H$_2$SO$_4$ at 40° C. held potentiostatically at 0.75V vs. RHE for four hours and (red) aqueous 0.5M H$_2$SO$_4$ at 40° C. held potentiostatically at 0.75V vs. RHE for four hours without methanol.

The current could possibly be attributed to corrosion of the carbide to an oxide via

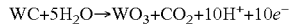

$$WC + 5H_2O \rightarrow WO_3 + CO_2 + 10H^+ + 10e^-$$

Figure 30:
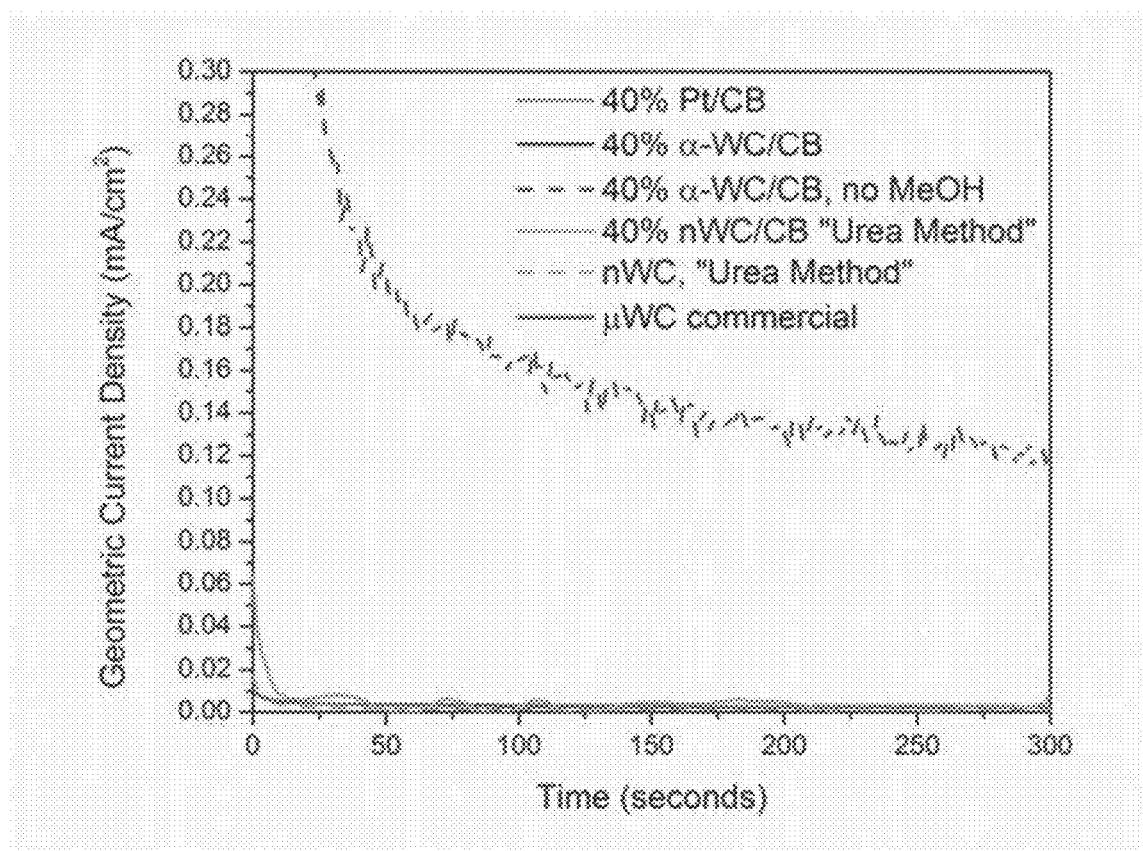
FIG. 30 depicts (zoomed in) CA scans over the first 5 min performed in aqueous 2 M methanol and 0.5 M $H_2SO_4$ at 40° C. held potentiostatically at +0.75 V vs. RHE, with the exception of "40% α-WC/CB, no MeOH," which was held potentiostatically at +0.75 V vs. RHE in 0.5 M $H_2SO_4$ at 40° C. without the presence of methanol. The 40% nWC/CB material prepared using the "Urea Method" exhibited oscillatory behavior in each run, oscillating between acting as an anode and a cathode at +0.75 V, indicating it is not active for MOR. nWC nanopowder prepared using the "Urea method" began to oscillate between acting as an anode and cathode within the first 15 min (not shown).

This anodic reaction results in the passivation of the carbide NPs with an oxide layer that protects against further corrosion in acidic media. However, to confirm that the current measured is indeed due to the oxidation of methanol rather than the corrosion of the carbide, the total charge necessary to oxidize all of the WC loaded on the electrode to $WO_3$. Based on 50 µg loadings on a 0.071 cm² electrode, this corresponds to 1.48 C of charge required to fully oxidize all of the WC to $WO_3$. Integrating the blue curve of FIG. 28 yields that 1.50 C of charge was passed in the first 45 minutes of the study in the presence of methanol. In 4 hours, 5.0 C of charge was passed, indicating that the current observed is due to a faradaic surface oxidation reaction rather than capacitive discharging or bulk oxidation/dissolution of the electrode. The materials prepared using the "Urea route" had activities that quickly decayed to zero current density, likely because carbide NPs prepared using this route are covered in deactivating surface carbon as shown in FIG. 30.

Figure 33:
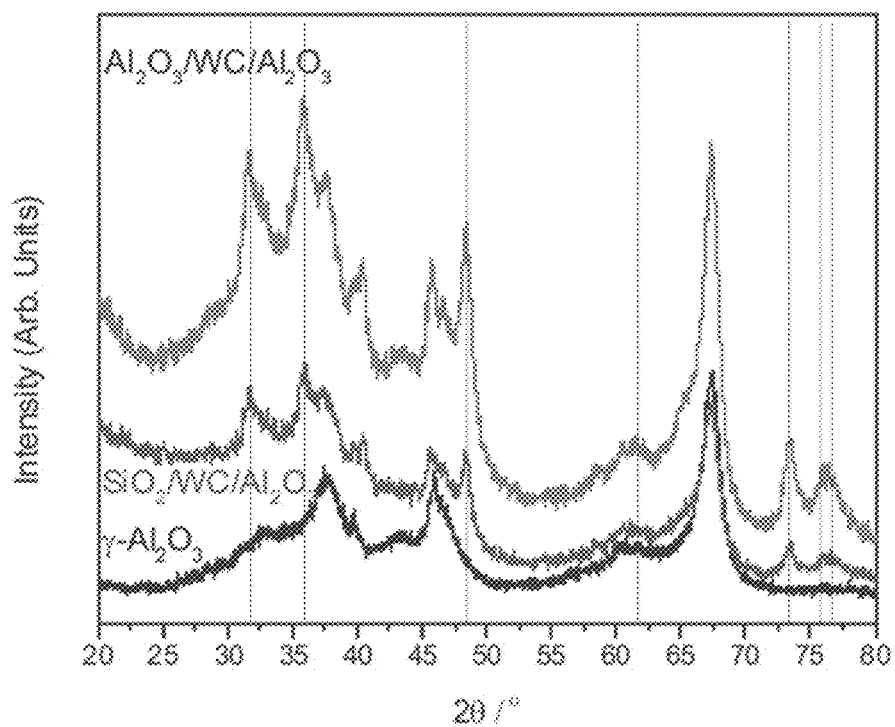
FIG. 33 depicts PXRD spectra of WC nanoparticles supported on alumina at 10 wt % and coated with either $Al_2O_3$ using atomic layer deposition (ALD) or $SiO_2$ using the Stöber method. The coatings were performed on supported $WO_x$ NPs that were then subsequently carburized after the coatings had been performed.
Figure 34:
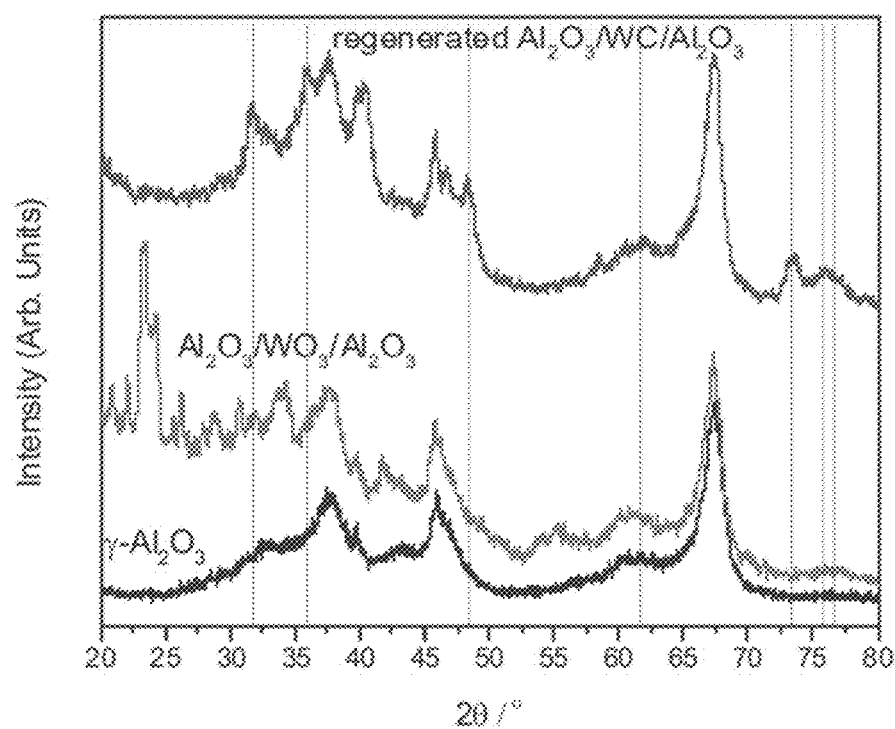
FIG. 34 depicts PXRD spectra for $Al_2O_3$/WC/$Al_2O_3$ after being calcined at 800° C. to $Al_2O_3$/$WO_3$/$Al_2O_3$ before being subsequently re-carburized at 835° C.

Synthesis of $Al_2O_3/WC/Al_2O_3$ Using Atomic Layer Deposition or $SiO_2/WC/Al_2O$ Using the Stöber Method Alternatively to using RMEs or Sol-Gels to create ceramic coatings of inorganic matrices, gas-phase techniques such as chemical vapor deposition (CVD) or atomic layer deposition (ALD) can be used. In this example, $WO_x$ NPs were synthesized using a typical RME method of WIPO/Brij/heptane/water. After 4 h, γ-$Al_2O_3$ was added as a support and stirring continued for 16 hours. Acetone was then added and stirring continued for another hour. Finally, the $WO_x/Al_2O_3$ ($WO_x$ NPs supported on $Al_2O_3$) material was recovered via centrifugation and calcined at 450° C. to remove excess surfactant. It was then coated with ~8 nm of $Al_2O_3$ using 60 sequential cycles of trimethylaluminum and water using a Savannah Atomic Layer Deposition System. Afterwards, it was carburized under typical carburization conditions using a 21% $CH_4/H_2$ atmosphere at 835° C. for 4 hours followed by 1 hour at 835° C. in a pure $H_2$ atmosphere. This forms phase-pure α-WC as shown in FIG. 33. The material could also then be calcined at 800° C. to form $Al_2O_3/WO_x/Al_2O_3$ and subsequently re-carburized under standard conditions to re-form $Al_2O_3/WC/Al_2O_3$, allowing for possible regeneration of spent catalysts using in-situ calcinations and subsequent re-carburizations. This is shown in FIG. 34.

Instead of using ALD to coat $WO_x/Al_2O_3$, the material could instead be dispersed in a water/ethanol mixture with TEOS and $NH_4OH$ added. The resulting material consisted of approximately 10-12 nm of $SiO_2$ coated onto $WO_x/Al_2O_3$, which is referred to as $SiO_2/WO_x/Al_2O_3$. This material could also be carburized to prepare $SiO_2/WC/Al_2O_3$ as shown in FIG. 33. As with before, it formed phase-pure α-WC.

Figure 35:
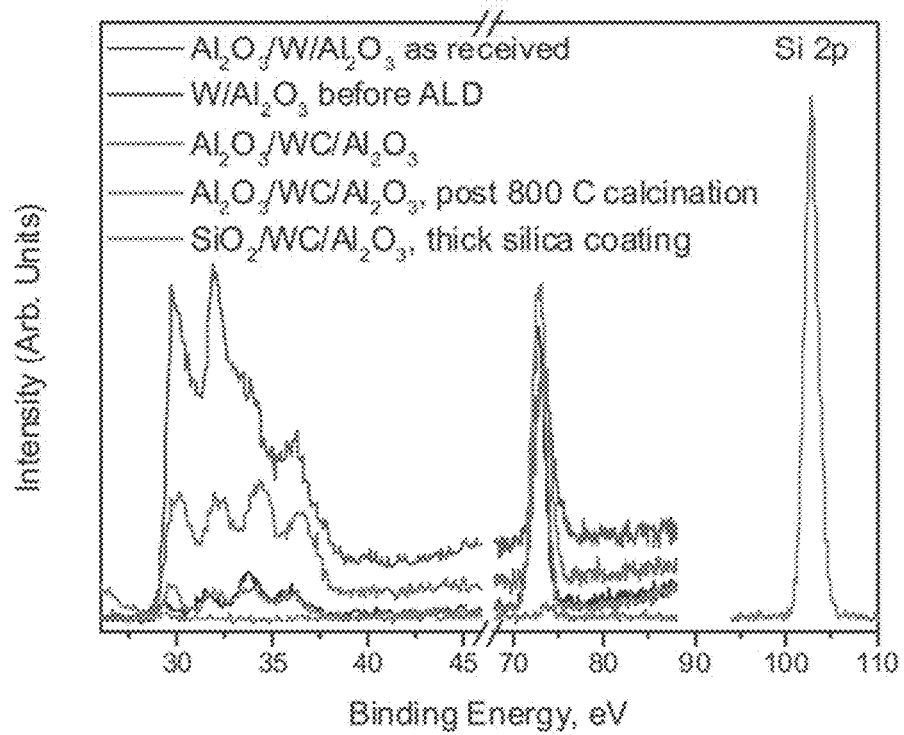
FIG. 35 depicts XPS spectra of the various ALD $Al_2O_3$ and Stöber-coated $SiO_2$ WC/$Al_2O_3$ materials before and after coating as well as after regeneration.
Figure 36A:
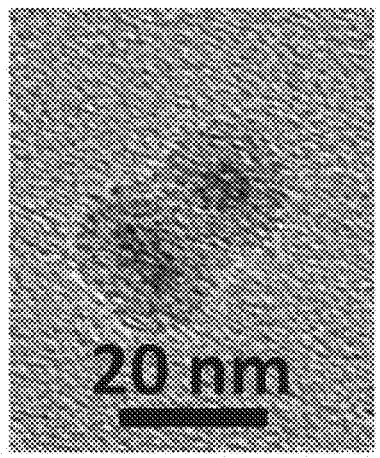
FIGS. 36A-36C depict TEM and STEM images of (A) $SiO_2$/$Ta_{0.3}W_{0.7}O_x$, (B) $SiO_2$/$Ta_{0.3}W_{0.7}$C, and (C) $Ta_{0.3}W_{0.7}$C/CB
Figure 36B:
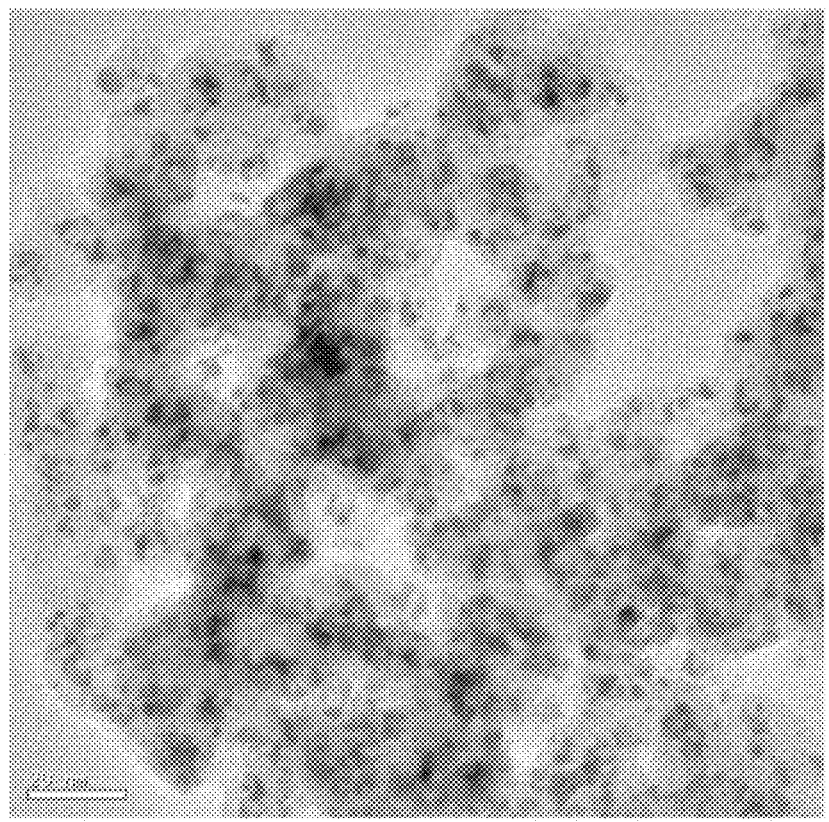
Figure 36C:
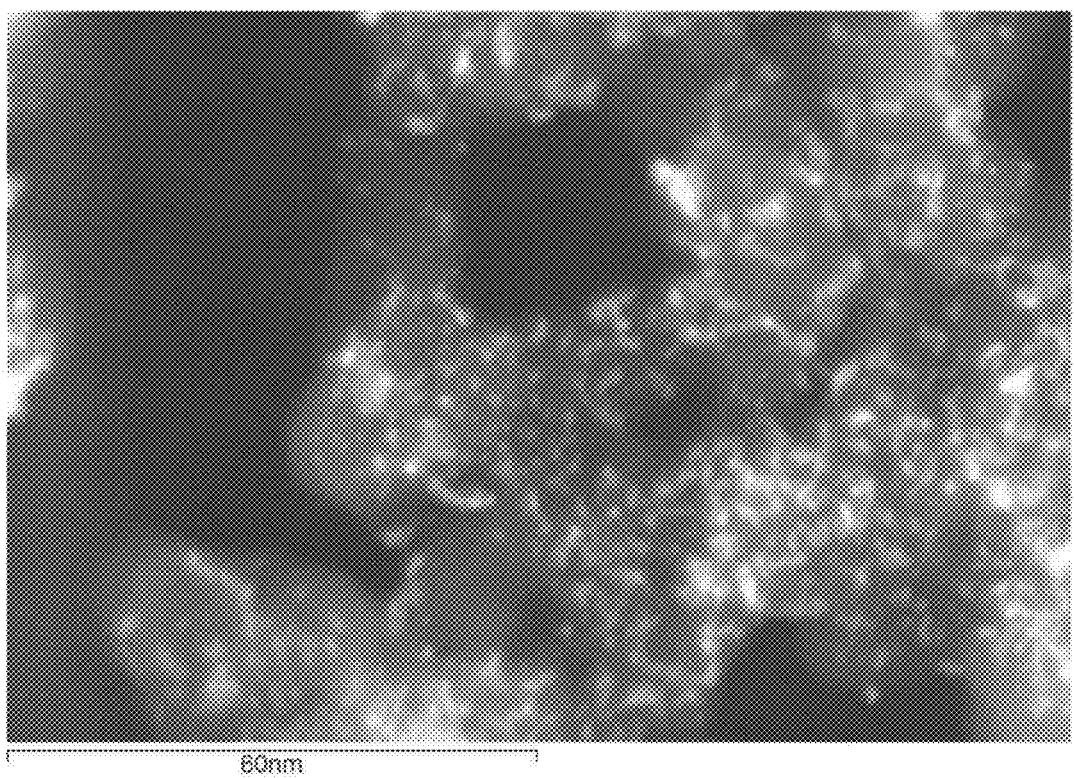

The materials were analyzed by XPS in FIG. 35. The $WO_x/Al_2O_3$ starting material was reduced at 550° C. in an $H_2$ atmosphere to form $W/Al_2O_3$, which in FIG. 35 (blue curve) has a very strong W 4f signals between 30 and 35 eV compared to the Al 2p signal between 70 and 75 eV. After coating with $Al_2O_3$ or $SiO_2$, the W 4f signal is strongly diminished. The exception is after calcining at 800° C. and re-carburizing, which resulted in a stronger W 4f signal, indicative of surface migration of WC NPs. Note that the strong oxidized W 4f surface species can possibly be attributed to thick surface passivation oxides as these samples were briefly passivated and then stored in ambient conditions.

Figure 37:
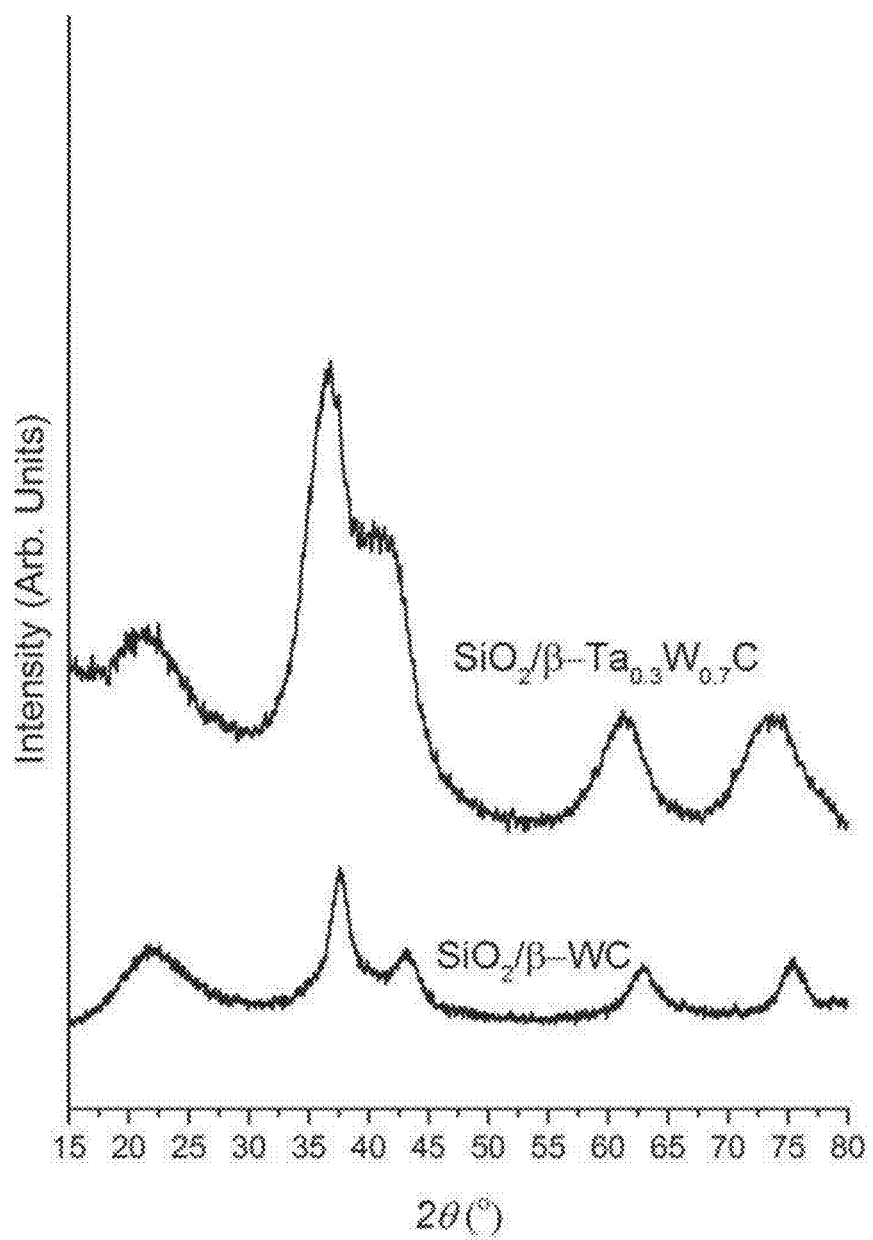
FIG. 37 depicts XRD spectra of $SiO_2$/$Ta_{0.3}W_{0.7}$C in comparison to fcc WC.
Figure 38:
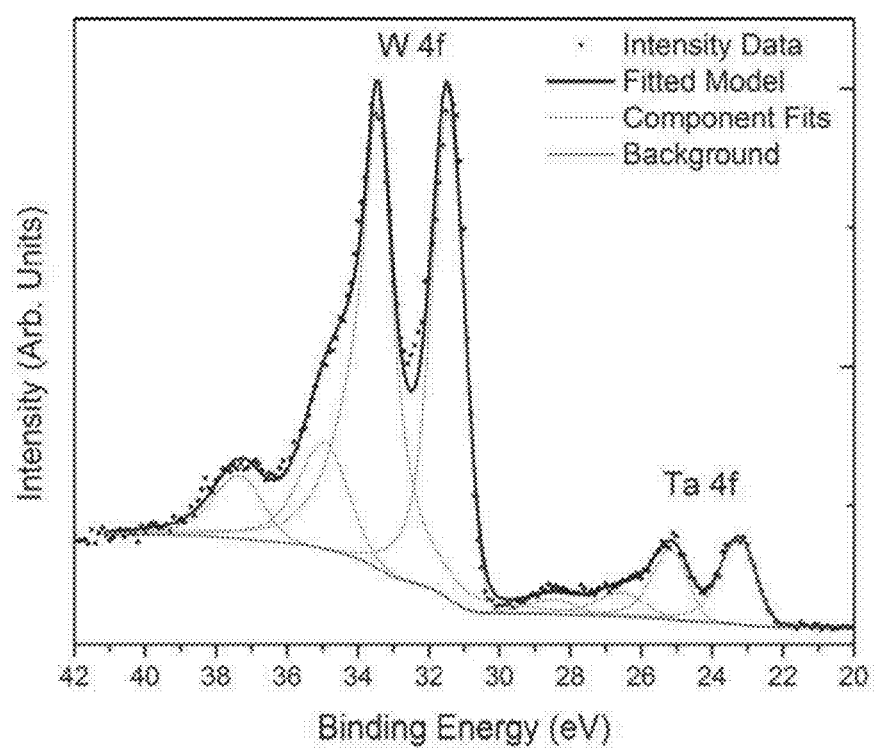
FIG. 38 depicts the W 4f and Ta 4f XPS spectra from $Ta_{0.3}W_{0.7}$C/CB showing reduced bimetallic carbides are present on the surface.

Generalization of the Method to Other Bimetallic Carbide and Nitride Nanoparticle Materials Extension of the method to other bimetallic carbide and nitride nanoparticle combinations is straightforward and exemplified by FIGS. 36 to 43. Here, $SiO_2/M1_xM2_{1-x}O_y$, where M1 is the first metal and M2 is the second metal are synthesized by fixing the total moles of metal to the typical synthesis in the Brij/water/heptane RME. The different metals are incorporated using the corresponding metal alkoxide: tantalum isopropoxide, niobium isopropoxide, titanium isopropoxide, molybdenum isopropoxide, vanadium triisopropoxide oxide, iron isopropoxide, tungsten isopropoxide, etc. After the metal alkoxides co-hydrolyze, TEOS and $NH_4OH$ are added and the bimetallic oxides are coated with silica to make $SiO_2/M1_xM2_{1-x}O_y$. At this point, carbides, nitrides, phosphides, borides, and sulfides can all be synthesized using the corresponding reactive gaseous precursor. For carburizations, methane was used, and for nitridations, ammonia ($NH_3$) was used. All nitrides were prepared under an $NH_3$ atmosphere at 827° C. for 3 hours except for $SiO_2/TaN$, which was prepared under an $NH_3$ atmosphere at 900° C. for 8 hours. Carbides were prepared at 835° C. for 4 hours except for Ta and Ti-based carbides, which were prepared at 900° C. for 4 hours. A selection of materials characterization data is presented in FIGS. 36 to 43. FIG. 36A-FIG. 36C depicts the synthesis of $Ta_{0.3}W_{0.7}C$ non-sintered, metal-terminated bimetallic carbide NPs throughout the removable ceramic coating method. In FIG. 36B, $SiO_2/Ta_{0.3}W_{0.7}C$ is synthesized via carburization. Alternatively, the material can be nitridized to make $SiO_2/Ta_{0.3}W_{0.7}N_x$, and its characterization data is presented in FIG. 39A and FIG. 40C. FIG. 37 shows that $Ta_{0.3}W_{0.7}C$ is phase-pure and in an fcc lattice while the XPS spectra in FIG. 38 show the W 4f and Ta 4f signal of $Ta_{0.3}W_{0.7}C/CB$ supported on carbon black at 40 wt %. Integration of the XPS signals shows that while the bulk composition (determined using ICP-AES) is 30% Ta and 70% W, the surface composition is 24% Ta and 76% W. In addition, the surface is highly reduced with surface oxide species accounting for only 19% of the overall signal. This can be attributed to the passivation of the materials during synthesis.

Figure 39A:
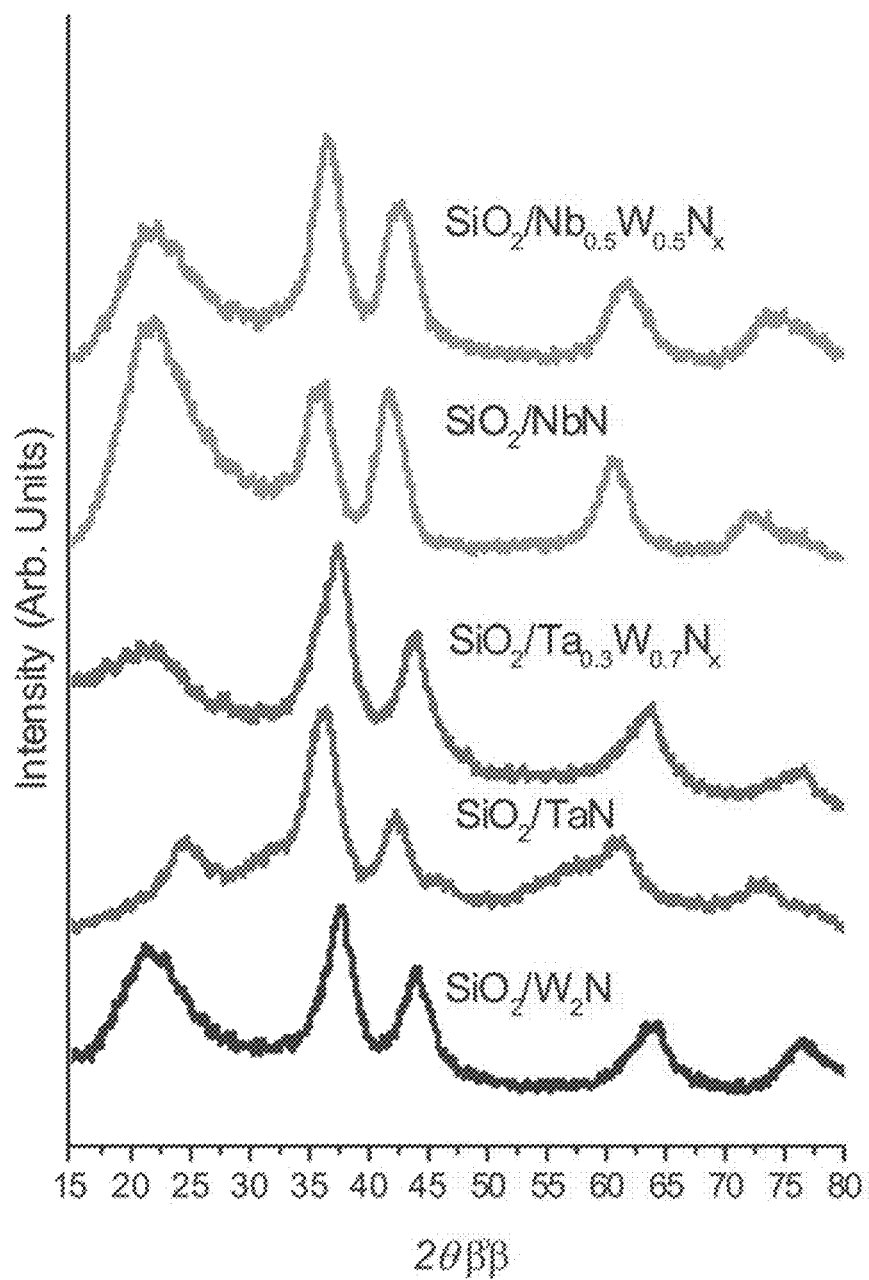
FIGS. 39A and 39B depict XRD spectra for $SiO_2$/$W_2$N, $SiO_2$/TaN, $SiO_2$/$Ta_{0.3}W_{0.7}N_x$, $SiO_2$/NbN, $SiO_2$/$Nb_{0.5}W_{0.5}N_x$ $SiO_2$/$Mo_{0.15}W_{0.85}N_x$, $SiO_2$/$Mo_{0.54}W_{0.46}N_x$, $SiO_2$/$Ti_{0.1}W_{0.9}N_x$, and $SiO_2$/$Ti_{0.2}W_{0.8}N_x$
Figure 39B:
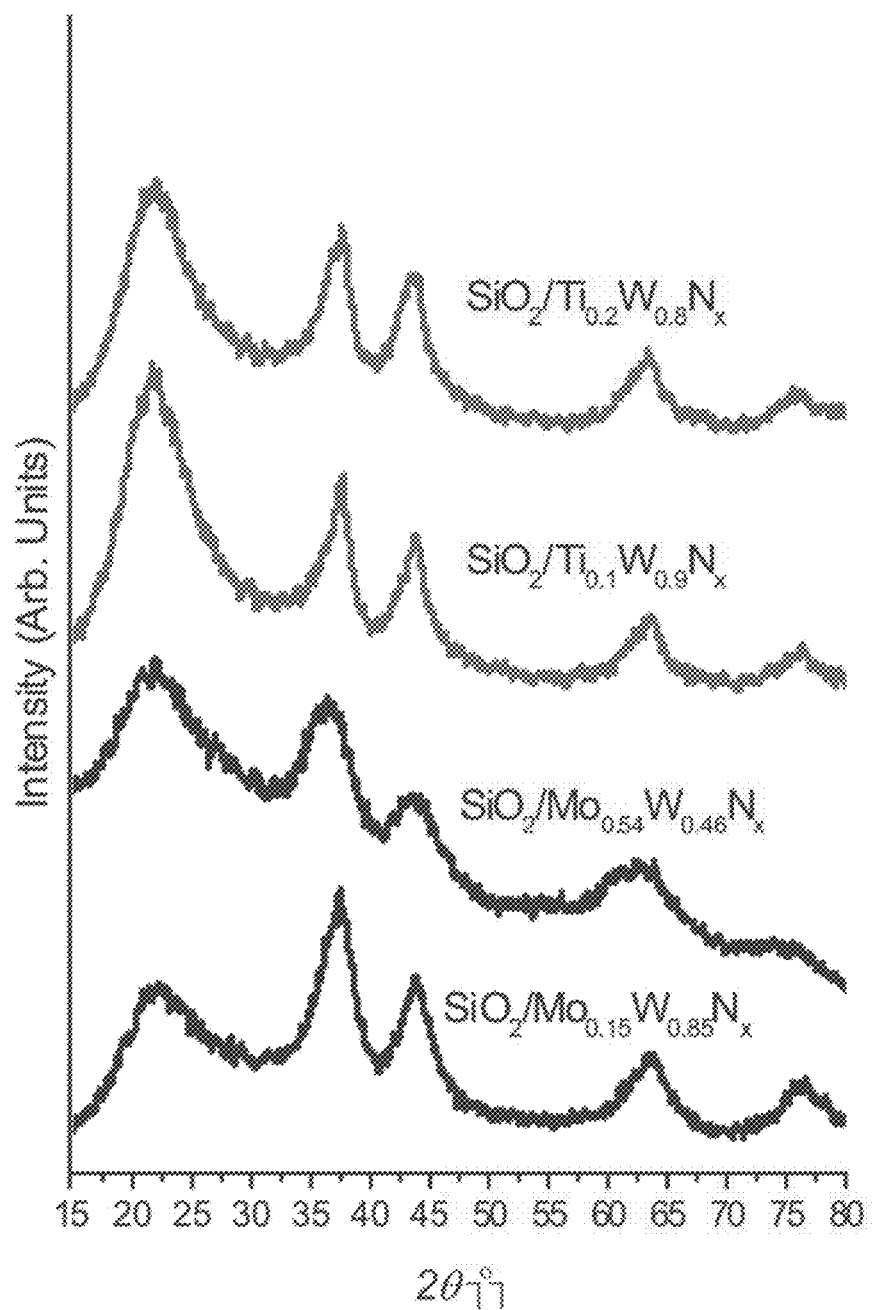
Figure 40A:
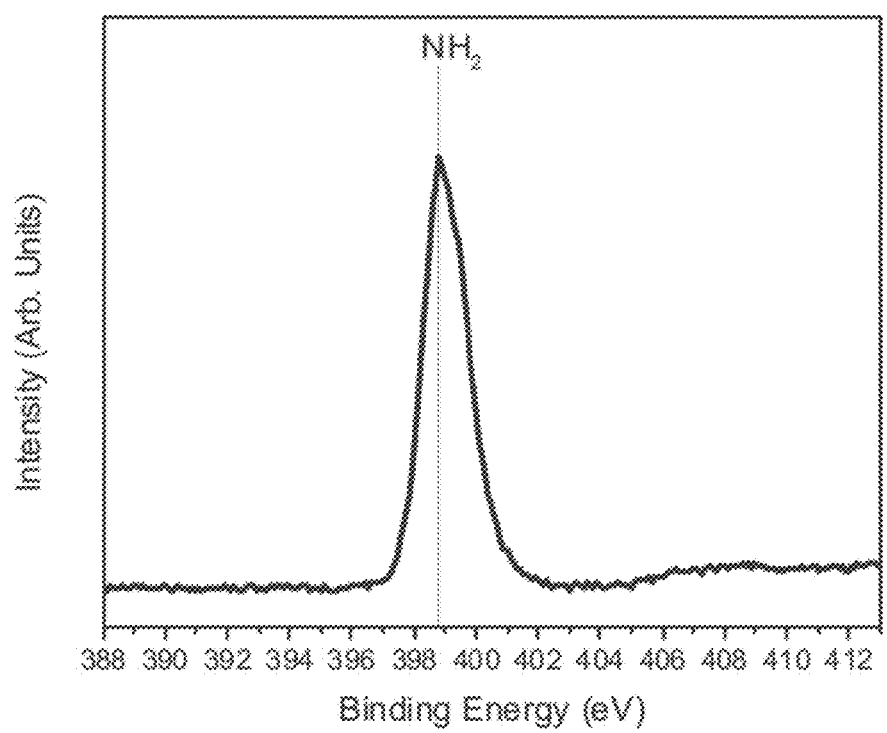
FIG. 40A-40C depict N 1s XPS spectra of metal nitride nanopowders.
Figure 40B:
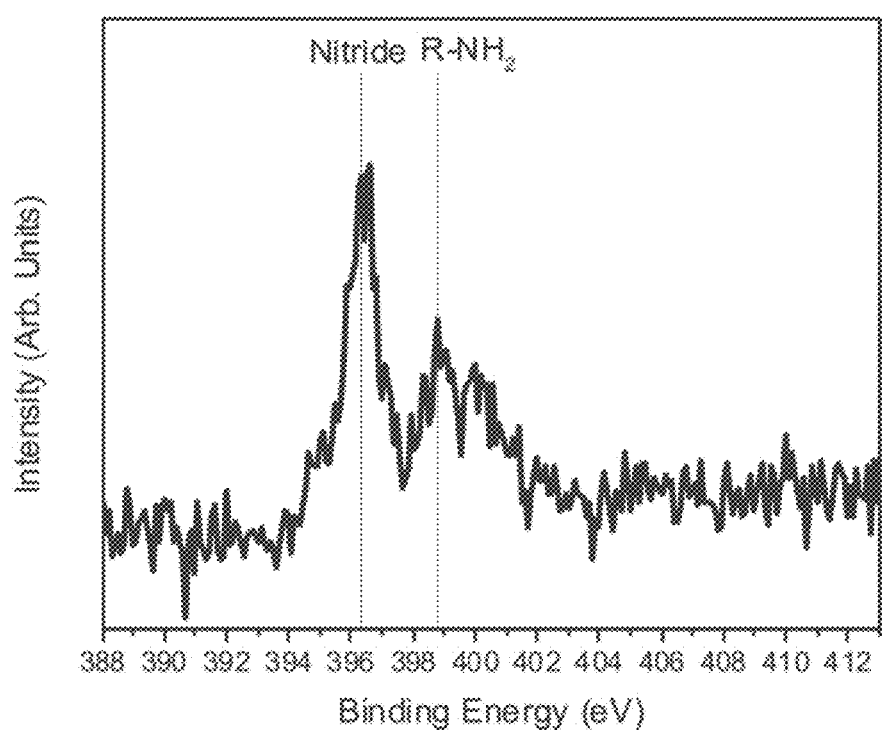
Figure 40C:
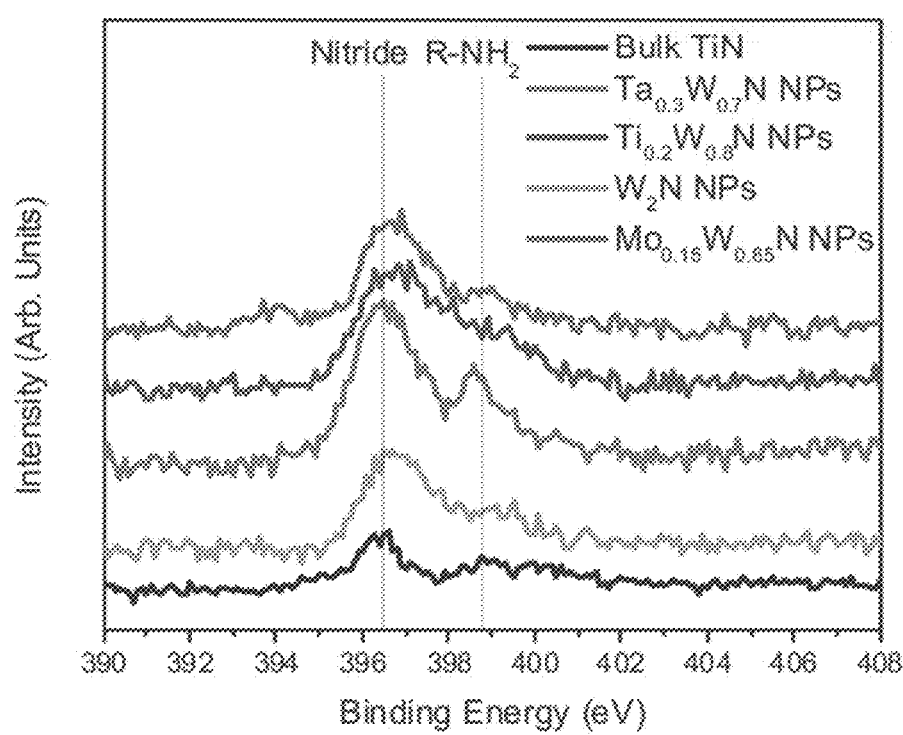

FIG. 39A and FIG. 39B depict PXRD spectra of various heterometallic nitride nanoparticle combinations of W, Mo, Ti, Nb, and Ta as representative examples. All materials also have corresponding carbides (not shown) and were synthesized under $NH_3$ for 3 hours at 827° C. except for $SiO_2/TaN$, which was prepared under an $NH_3$ atmosphere at 900° C. for 8 hours. The silica shells were removed using room temperature 20 wt % ABF solution in water and no support was added, resulting in nitride nanoparticle nanodispersions. The dispersions were re-dispersed in water, and then aliquots were centrifuged down and dried for XPS analysis. FIG. 40A to 40C examines the N is signal of the nitride nanodispersions showing predominantly nitride surface moieties via a nitridic shift in the N 1s spectra. FIG. 40 A shows the N 1s spectra for urea, which is not a nitride. Urea has a characteristic N is signal at 398.8 eV. FIG. 40 B shows the N is spectra for bulk titanium nitride (TiN), which has a nitridic shift to 396.6 eV. FIG. 40 C shows the N 1s spectra of the various heterometallic nanodispersions, which also all exhibit a characteristic N 1s nitridic shift, indicating that surface nitride moieties are present.

Figure 41:
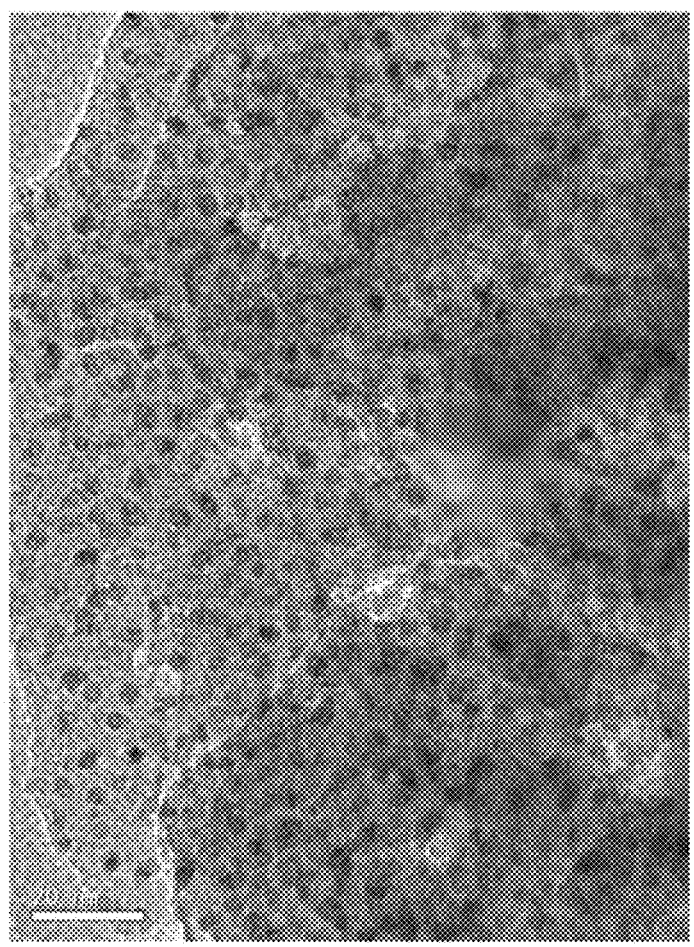
FIG. 41 depicts a TEM image of $SiO_2$/NbN
Figure 42:
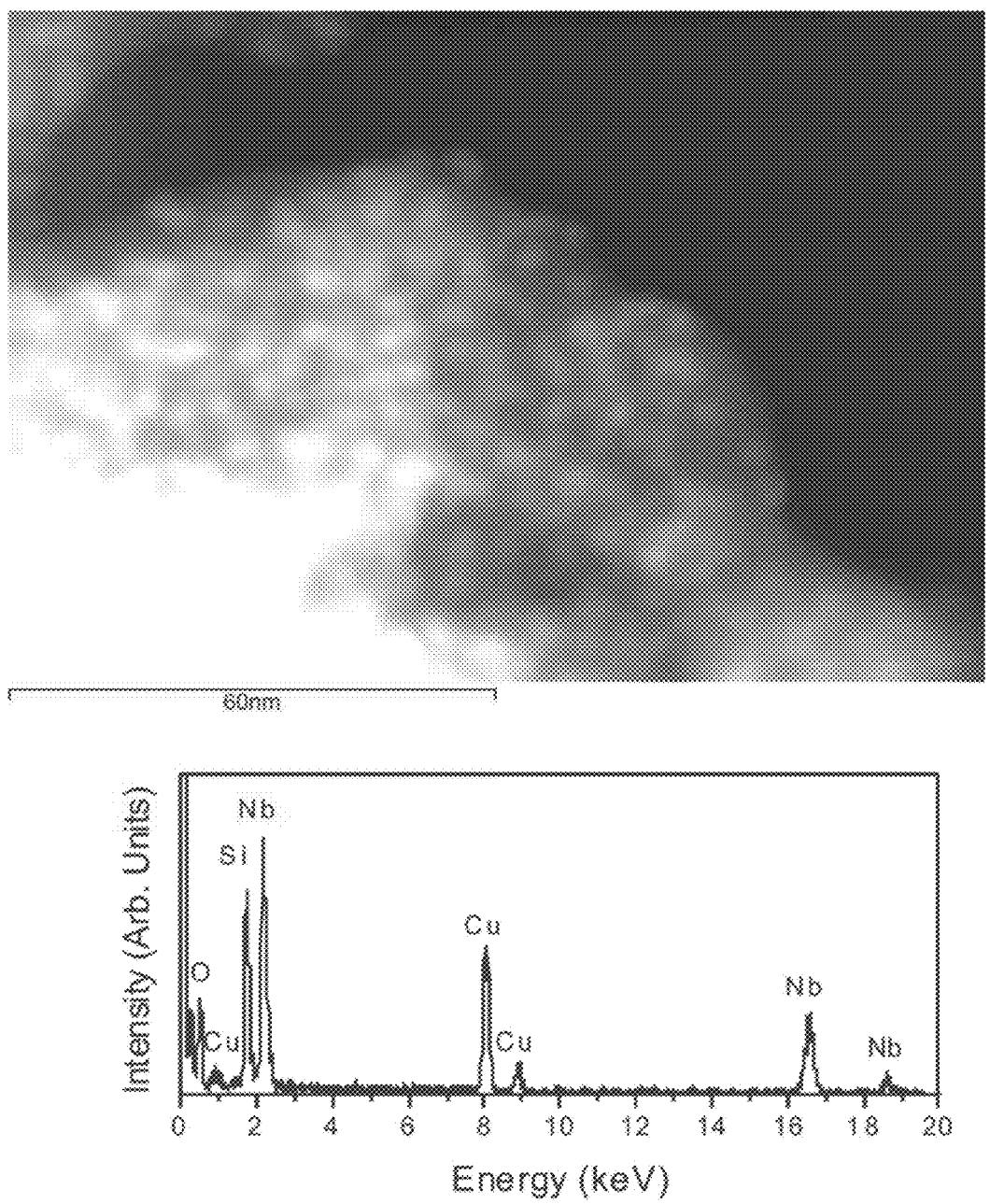
FIG. 42 depicts a STEM image of $SiO_2$/NbN and its corresponding EDX spectra of a single nanoparticle (Cu is present in the grid background).
Figure 43:
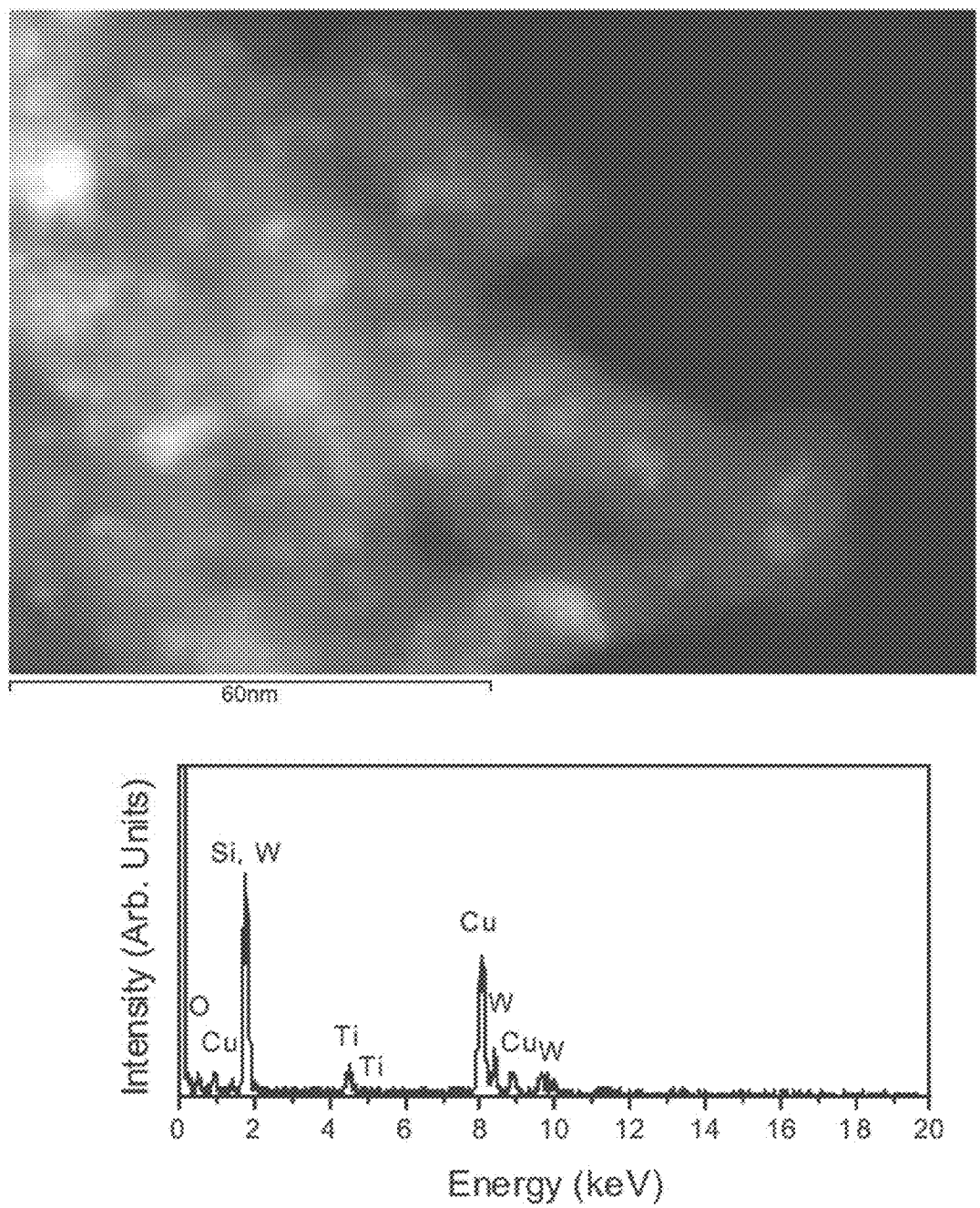
FIG. 43 depicts a STEM image of $SiO_2$/$Ti_{0.2}W_{0.8}$N and its corresponding EDX spectra of a single nanoparticle (Cu is present in the grid background).

Characteristic TEM and STEM images are shown in FIGS. 41 and 42 for $SiO_2/NbN$ as well as in FIG. 43 for $SiO_2/Ti_{0.2}W_{0.8}N$. EDX spectra are also shown for single nanoparticles. The presence of Cu is due to the copper background of the TEM grids.

Other embodiments are within the scope of the following claims.

What is claimed is:

1. A method of producing a plurality of transition metal nanoparticles comprising:
preparing a water-in-oil reverse microemulsion including metal oxide nanoparticles or metal nanoparticles,
encapsulating the nanoparticles within an inorganic matrix shell to form encapsulated nanoparticles,
calcining the encapsulated nanoparticles in an oxidizing atmosphere or vacuum,
heating the encapsulated nanoparticles in the presence of a reducing agent; and
converting the encapsulated metal oxide nanoparticles to non-sintered nanoparticles including C, N, S, B, or P encapsulated in the inorganic matrix shell, removing the inorganic matrix shell encapsulated on the non-sintered nanoparticles including C, N, S, B or P, and dispersing a plurality of the non-sintered nanoparticles including C, N, S, B or P onto a support.

2. The method of claim 1, wherein converting the nanoparticles includes carburizing the nanoparticles in a methane atmosphere.

3. The method of claim 1, wherein the inorganic matrix include silicon oxide, aluminum oxide, germanium oxide, zirconium oxide, cerium oxide, hafnium oxide, gallium oxide or titanium oxide.

4. The method of any of the claims 1 and 2-3, wherein the nanoparticle includes a tungsten carbide nanoparticle, a molybdenum carbide nanoparticle, or heterometallic carbide nanoparticle.

5. The method of claim 4, wherein the heterometallic carbide nanoparticle includes a molybdenum tungsten carbide.

6. The method of claim 1, wherein the percentage of the transition metal content of the inorganic matrix shell is 20% or higher.

7. The method of claim 1, wherein converting the nanoparticles includes nitridizing the nanoparticles.

8. The method of claim 1, wherein converting the nanoparticles includes phosphidizing the nanoparticles.

9. The method of claim 1, wherein converting the nanoparticles includes sulfidizing the nanoparticles.

10. The method of claim 1, wherein converting the nanoparticles includes boridizing the nanoparticles.

11. The method of claim 1, wherein the support is carbon black, graphene, carbon nanotubes, high-surface area carbide, a metal oxide including silica, alumina, titania, zirconia, ceria, or zeolites.

12. The method of claim 1, wherein the heating the nanoparticles includes heating the nanoparticles to less than 850° C.

13. The method of claim 4, wherein the tungsten carbide is in a single phase.

14. The method of claim 3, wherein the tungsten carbide is in a β phase, an α phase or a semicarbide phase.

* * * * *